(12) United States Patent
Murai et al.

(10) Patent No.: US 10,418,340 B2
(45) Date of Patent: Sep. 17, 2019

(54) SEMICONDUCTOR CHIP MOUNTED ON A PACKAGING SUBSTRATE

(71) Applicant: SONY CORPORATION, Tokyo (JP)

(72) Inventors: Makoto Murai, Tokyo (JP); Yuji Takaoka, Kanagawa (JP); Kazuki Sato, Kanagawa (JP); Hiroyuki Yamada, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/316,640

(22) PCT Filed: Jun. 5, 2015

(86) PCT No.: PCT/JP2015/066351
§ 371 (c)(1),
(2) Date: Dec. 6, 2016

(87) PCT Pub. No.: WO2015/198839
PCT Pub. Date: Dec. 30, 2015

(65) Prior Publication Data
US 2017/0141065 A1  May 18, 2017

(30) Foreign Application Priority Data
Jun. 27, 2014  (JP) .................................. 2014-132332

(51) Int. Cl.
*H01L 23/00* (2006.01)
*H01L 23/12* (2006.01)
(Continued)

(52) U.S. Cl.
CPC ............ *H01L 24/16* (2013.01); *H01L 21/563* (2013.01); *H01L 23/12* (2013.01);
(Continued)

(58) Field of Classification Search
CPC .... H01L 23/49838; H01L 2224/73204; H05K 3/3436; H05K 3/3452; H05K 2201/09827–09863
See application file for complete search history.

(56) References Cited

U.S. PATENT DOCUMENTS 6,657,870 B1 * 12/2003 Ali ..................... H01L 23/49838
174/250
6,787,918 B1 * 9/2004 Tsai ....................... H01L 21/563
257/738
(Continued)

FOREIGN PATENT DOCUMENTS

CN          102487021 A     6/2012
JP       2005-347391 A    12/2005
(Continued)

OTHER PUBLICATIONS

International Search Report and Written Opinion of PCT Application No. PCT/JP2015/066351, dated Aug. 11, 2015, 6 pages of English Translation and 09 pages of ISRWO.
(Continued)

*Primary Examiner* — Stephen M Bradley
(74) *Attorney, Agent, or Firm* — Chip Law Group

(57) ABSTRACT

A semiconductor chip includes a chip body and a plurality of solder-including electrodes provided on an element-formation surface of the chip body. A packaging substrate includes a substrate body, and a plurality of wirings and a solder resist layer that are provided on a front surface of the substrate body. The plurality of solder-including electrodes include a plurality of first electrodes and a plurality of second electrodes. The plurality of first electrodes supply a first electric potential, and the plurality of second electrodes supply a second electric potential different from the first electric potential. The plurality of first electrodes and the plurality of second electrodes are disposed alternately in
(Continued)

both a row direction and a column direction, in a central part of the chip body. The plurality of wirings include a plurality of first wirings and a plurality of second wirings. The plurality of first wirings connect the plurality of first electrodes, and the plurality of second wirings connect the plurality of second electrodes.

17 Claims, 34 Drawing Sheets

(51) Int. Cl.
    *H01L 21/56*     (2006.01)
    *H01L 23/31*     (2006.01)
    *H01L 23/498*     (2006.01)
    *H01L 25/03*     (2006.01)
    *H01L 25/10*     (2006.01)
    *H05K 1/11*     (2006.01)
    *H05K 3/34*     (2006.01)
    *H01L 25/065*     (2006.01)
    *H01L 21/683*     (2006.01)

(52) U.S. Cl.
CPC ...... *H01L 23/3121* (2013.01); *H01L 23/3142* (2013.01); *H01L 23/49838* (2013.01); *H01L 24/11* (2013.01); *H01L 24/13* (2013.01); *H01L 24/14* (2013.01); *H01L 24/73* (2013.01); *H01L 24/81* (2013.01); *H01L 24/83* (2013.01); *H01L 24/92* (2013.01); *H01L 25/03* (2013.01); *H01L 25/105* (2013.01); *H05K 1/111* (2013.01); *H05K 3/3436* (2013.01); *H05K 3/3452* (2013.01); *H01L 21/6836* (2013.01); *H01L 24/03* (2013.01); *H01L 24/05* (2013.01); *H01L 24/29* (2013.01); *H01L 24/32* (2013.01); *H01L 24/48* (2013.01); *H01L 25/0655* (2013.01); *H01L 25/0657* (2013.01); *H01L 2221/6834* (2013.01); *H01L 2221/68327* (2013.01); *H01L 2224/0345* (2013.01); *H01L 2224/0381* (2013.01); *H01L 2224/03614* (2013.01); *H01L 2224/03912* (2013.01); *H01L 2224/05166* (2013.01); *H01L 2224/05173* (2013.01); *H01L 2224/05647* (2013.01); *H01L 2224/10175* (2013.01); *H01L 2224/119* (2013.01); *H01L 2224/1146* (2013.01); *H01L 2224/1147* (2013.01); *H01L 2224/1181* (2013.01); *H01L 2224/11462* (2013.01); *H01L 2224/11849* (2013.01); *H01L 2224/131* (2013.01); *H01L 2224/13014* (2013.01); *H01L 2224/13021* (2013.01); *H01L 2224/13082* (2013.01); *H01L 2224/13083* (2013.01); *H01L 2224/13109* (2013.01); *H01L 2224/13111* (2013.01); *H01L 2224/13139* (2013.01); *H01L 2224/13147* (2013.01); *H01L 2224/13155* (2013.01); *H01L 2224/14131* (2013.01); *H01L 2224/14133* (2013.01); *H01L 2224/14136* (2013.01); *H01L 2224/16013* (2013.01); *H01L 2224/16055* (2013.01); *H01L 2224/16057* (2013.01); *H01L 2224/16058* (2013.01); *H01L 2224/16227* (2013.01); *H01L 2224/16237* (2013.01); *H01L 2224/16503* (2013.01); *H01L 2224/2919* (2013.01); *H01L 2224/2929* (2013.01); *H01L 2224/29387* (2013.01); *H01L 2224/32225* (2013.01); *H01L 2224/48091* (2013.01); *H01L 2224/48106* (2013.01); *H01L 2224/48227* (2013.01); *H01L 2224/73204* (2013.01); *H01L 2224/81011* (2013.01); *H01L 2224/8112* (2013.01); *H01L 2224/81012* (2013.01); *H01L 2224/8121* (2013.01); *H01L 2224/81065* (2013.01); *H01L 2224/81075* (2013.01); *H01L 2224/8191* (2013.01); *H01L 2224/81121* (2013.01); *H01L 2224/81143* (2013.01); *H01L 2224/81191* (2013.01); *H01L 2224/81201* (2013.01); *H01L 2224/81203* (2013.01); *H01L 2224/81204* (2013.01); *H01L 2224/81385* (2013.01); *H01L 2224/81444* (2013.01); *H01L 2224/81815* (2013.01); *H01L 2224/81893* (2013.01); *H01L 2224/81906* (2013.01); *H01L 2224/81907* (2013.01); *H01L 2224/81935* (2013.01); *H01L 2224/81986* (2013.01); *H01L 2224/831* (2013.01); *H01L 2224/83104* (2013.01); *H01L 2224/83192* (2013.01); *H01L 2224/83204* (2013.01); *H01L 2224/83862* (2013.01); *H01L 2224/83907* (2013.01); *H01L 2224/92* (2013.01); *H01L 2224/9211* (2013.01); *H01L 2224/92125* (2013.01); *H01L 2225/0651* (2013.01); *H01L 2225/0652* (2013.01); *H01L 2225/06517* (2013.01); *H01L 2225/06562* (2013.01); *H01L 2225/06572* (2013.01); *H01L 2225/06586* (2013.01); *H01L 2924/00014* (2013.01); *H01L 2924/00015* (2013.01); *H01L 2924/014* (2013.01); *H01L 2924/01028* (2013.01); *H01L 2924/01046* (2013.01); *H01L 2924/01079* (2013.01); *H01L 2924/15151* (2013.01); *H01L 2924/15311* (2013.01); *H01L 2924/15747* (2013.01); *H01L 2924/181* (2013.01); *H01L 2924/351* (2013.01); *H01L 2924/381* (2013.01); *H01L 2924/3841* (2013.01); *H05K 2201/0979* (2013.01); *H05K 2201/0989* (2013.01); *H05K 2201/09227* (2013.01); *H05K 2201/09663* (2013.01); *H05K 2201/10674* (2013.01); *Y02P 70/611* (2015.11); *Y02P 70/613* (2015.11)

(56) References Cited

U.S. PATENT DOCUMENTS

| | | | | |
|---|---|---|---|---|
| 7,135,770 | B2* | 11/2006 | Nishiyama | H01L 21/563 228/164 |
| 8,222,749 | B2* | 7/2012 | Sato | H01L 21/563 257/784 |
| 2005/0098886 | A1 | 5/2005 | Pendse | |
| 2006/0163715 | A1 | 7/2006 | Pendse | |
| 2006/0170093 | A1 | 8/2006 | Pendse | |
| 2007/0145553 | A1* | 6/2007 | Araki | H01L 23/3171 257/678 |
| 2009/0206493 | A1 | 8/2009 | Pendse | |
| 2010/0181669 | A1* | 7/2010 | Tanaka | H01L 23/49816 257/750 |
| 2011/0074047 | A1* | 3/2011 | Pendse | H01L 21/563 257/782 |
| 2012/0091577 | A1* | 4/2012 | Hwang | H01L 24/11 257/737 |
| 2013/0277865 | A1* | 10/2013 | Teh | H01L 23/498 257/782 |
| 2015/0054167 | A1 | 2/2015 | Pendse | |

FOREIGN PATENT DOCUMENTS

| | | |
|---|---|---|
| JP | 2006-66737 A | 3/2006 |
| JP | 2012-119648 A | 6/2012 |
| KR | 10-2007-0010112 A | 1/2007 |
| SG | 181206 A1 | 6/2012 |
| TW | 200522237 A | 7/2005 |

(56) References Cited

FOREIGN PATENT DOCUMENTS

| | | |
|---|---|---|
| TW | 201250958 A | 12/2012 |
| WO | 2005/048307 A2 | 5/2005 |

OTHER PUBLICATIONS

International Preliminary Report on Patentability of PCT Application No. PCT/JP2015/066351, dated Dec. 27, 2016, pp. 4.

* cited by examiner

[ FIG. 1 ]
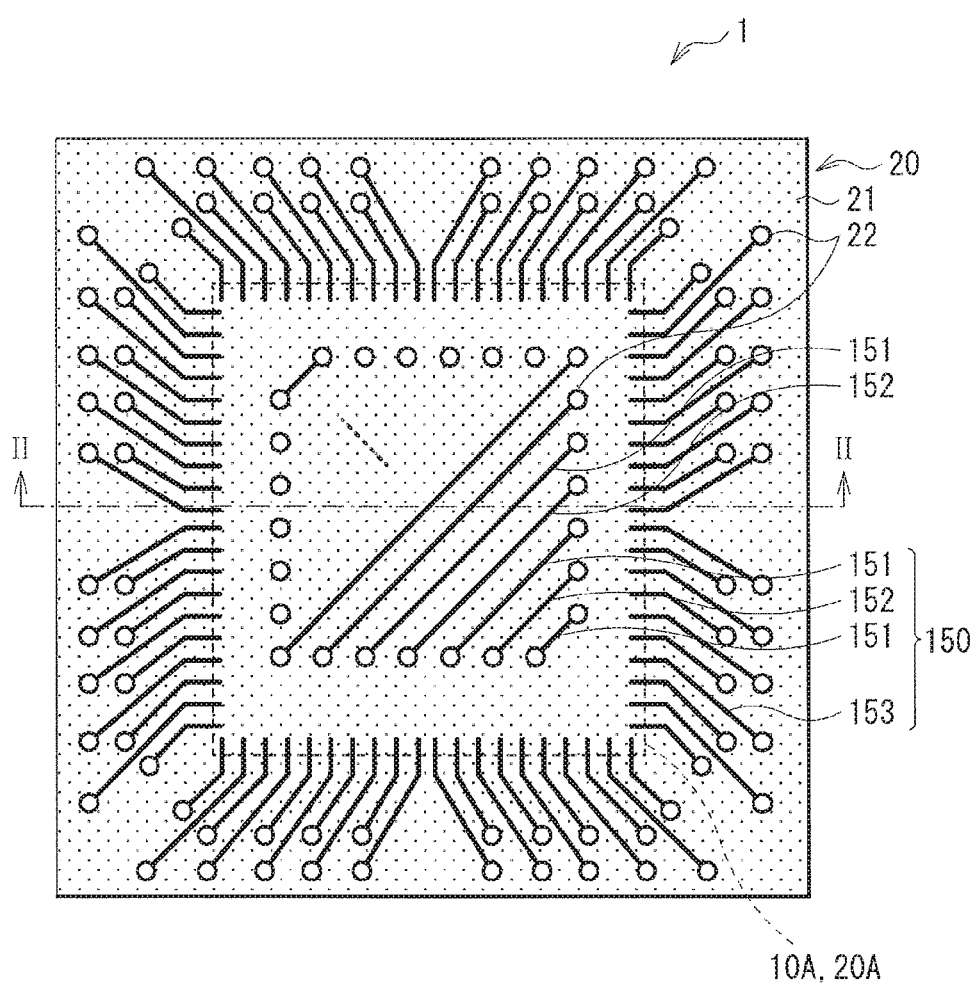

[ FIG. 2 ]
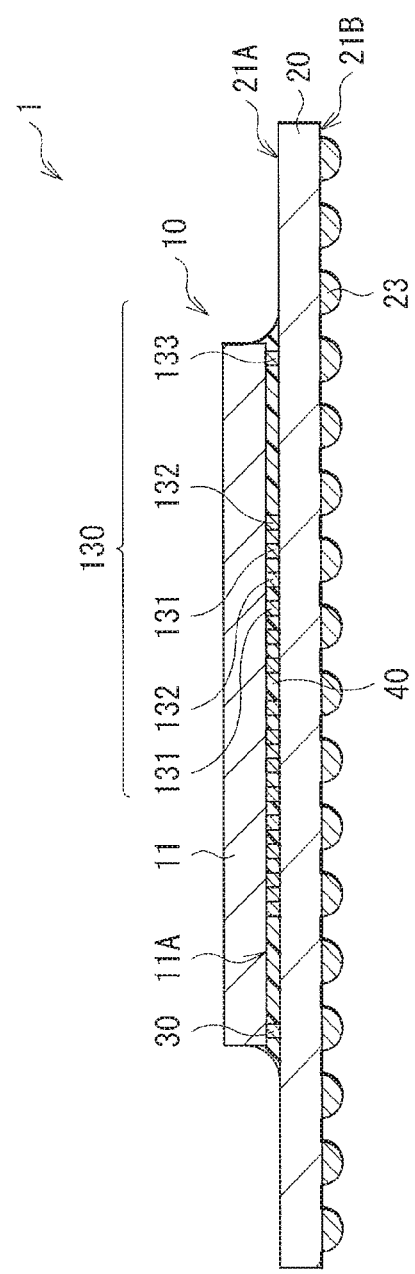

[FIG. 3]
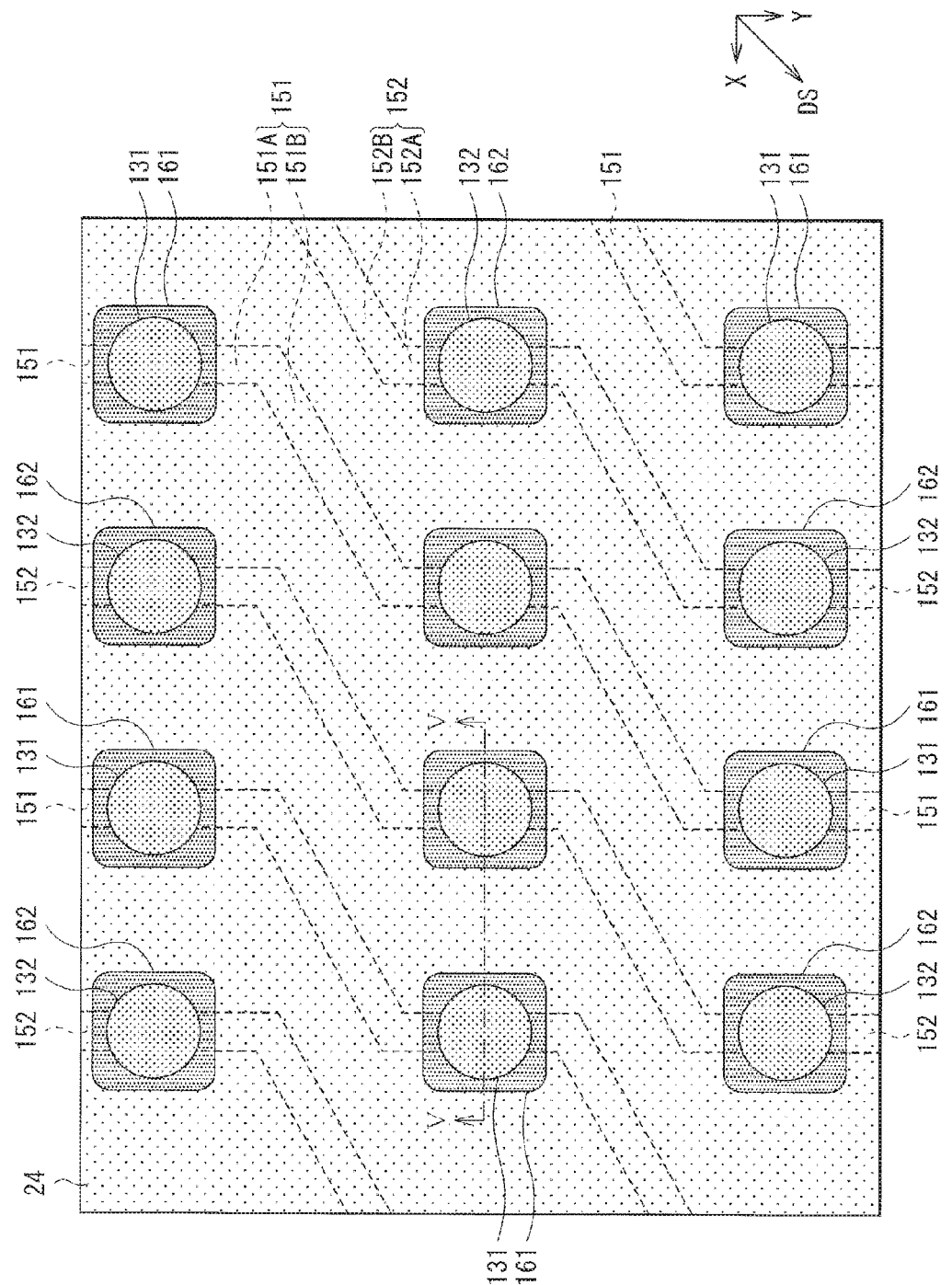

[ FIG. 4 ]
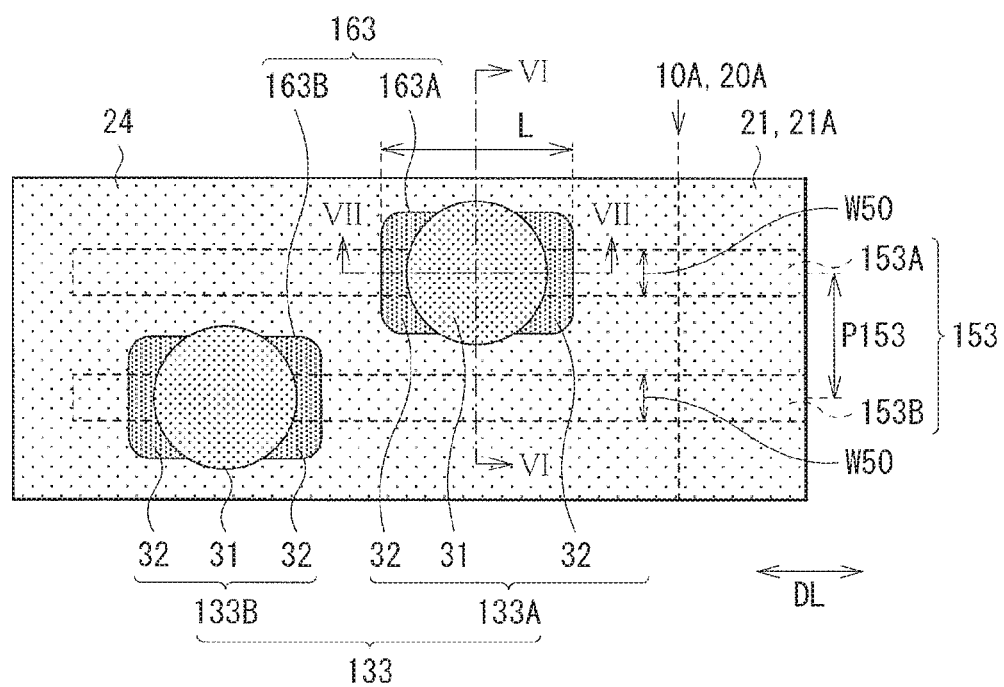

[FIG.5]
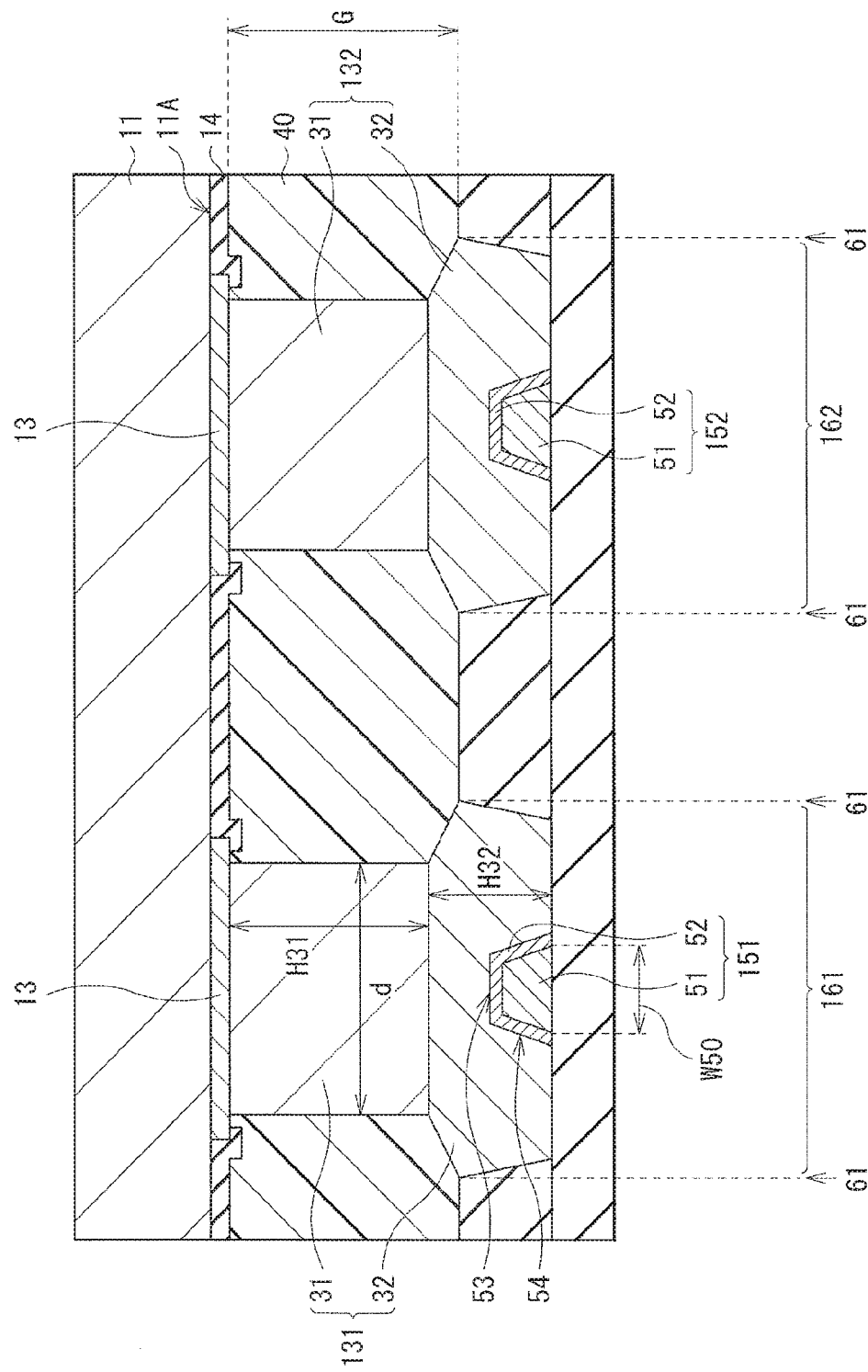

[ FIG. 6 ]
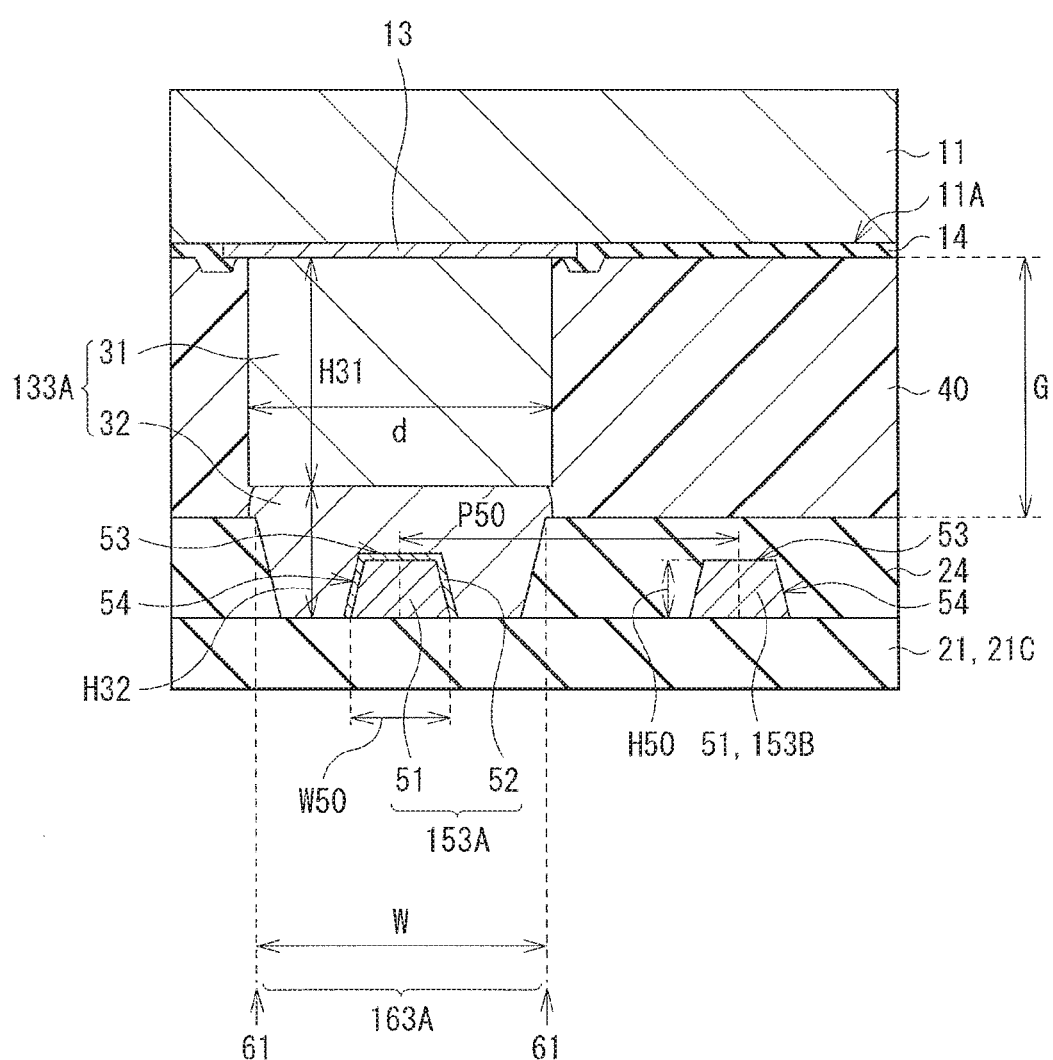

[FIG. 7]
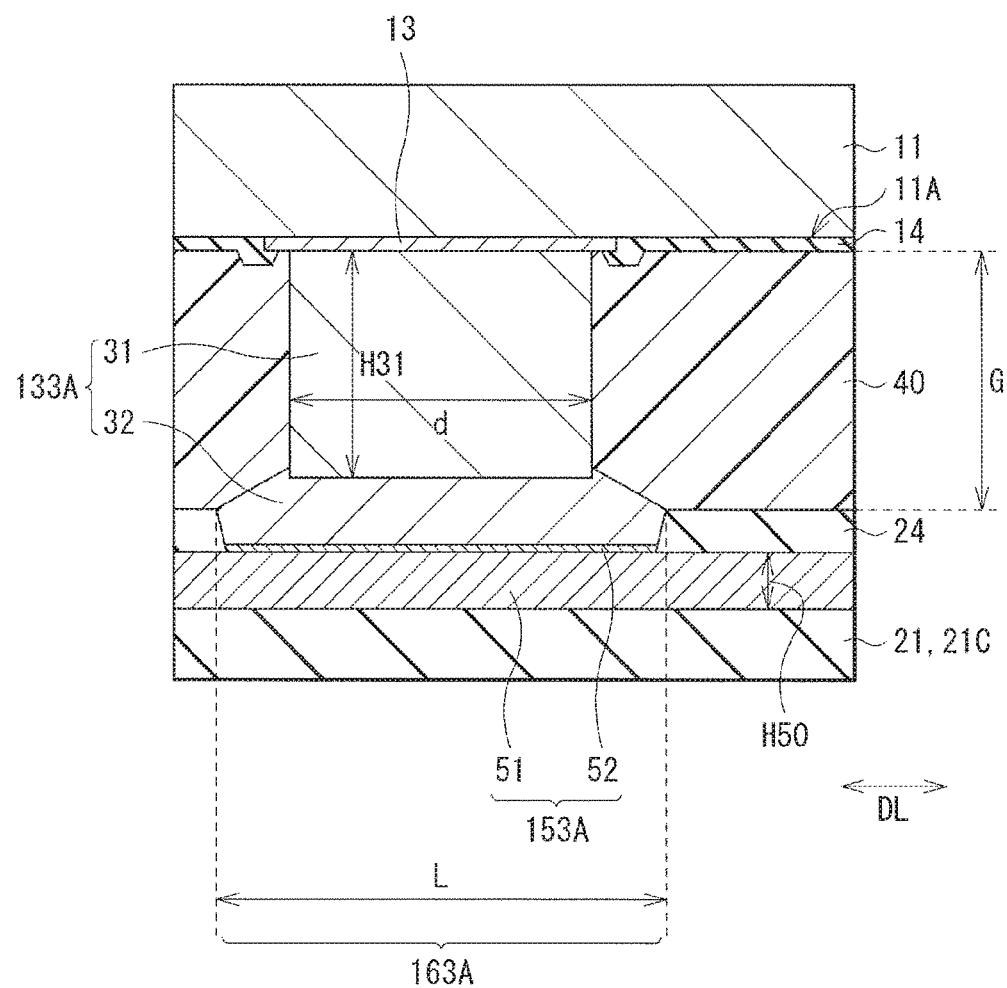

[ FIG. 8 ]
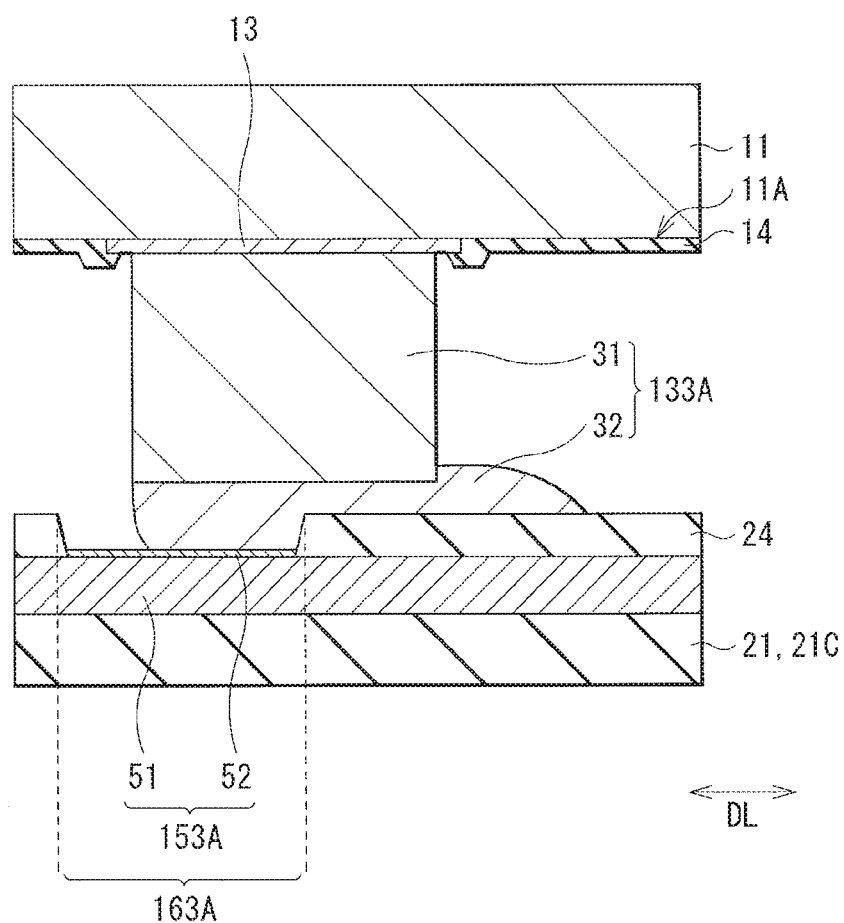

[FIG. 9]
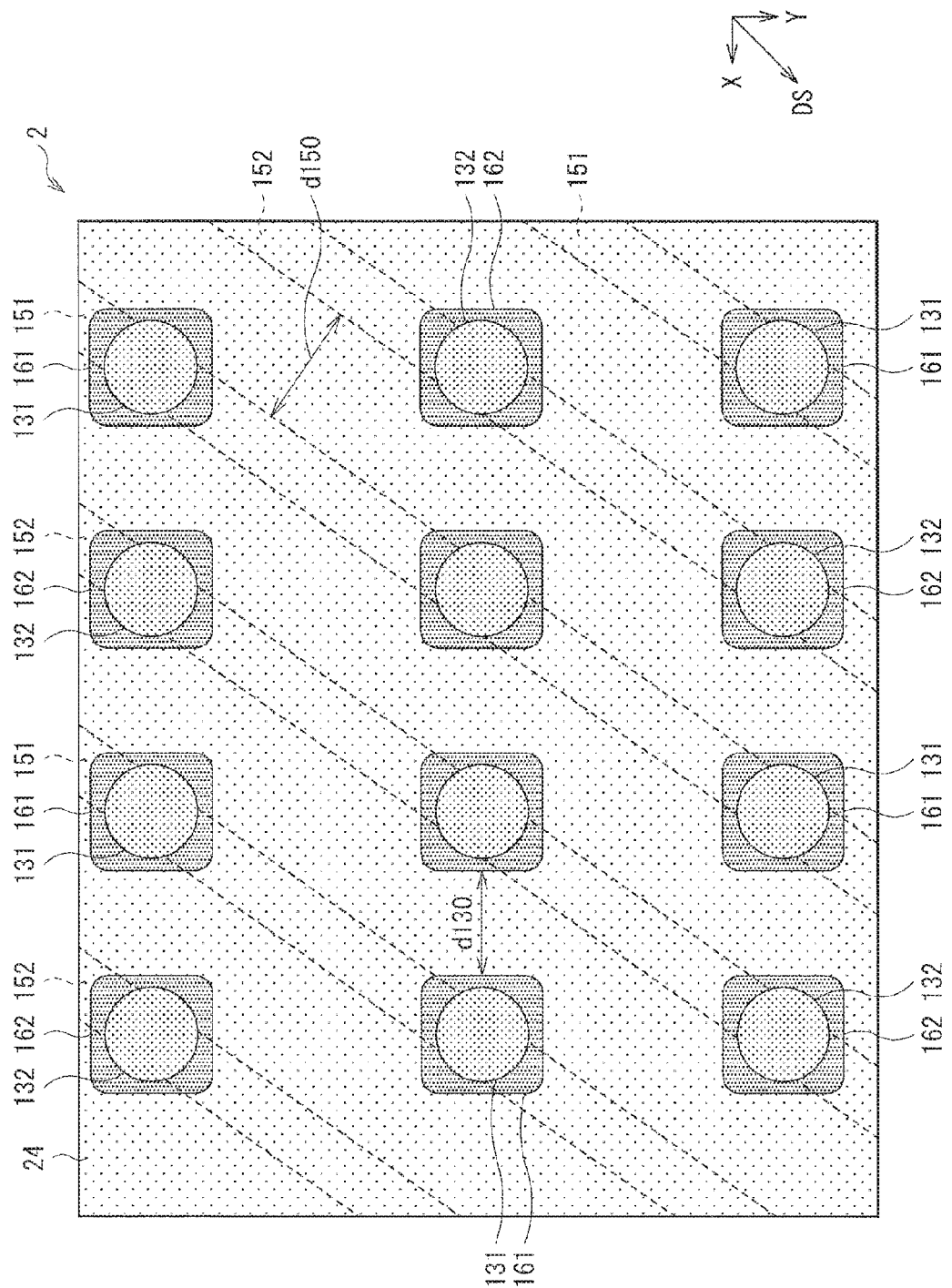

[FIG. 10]
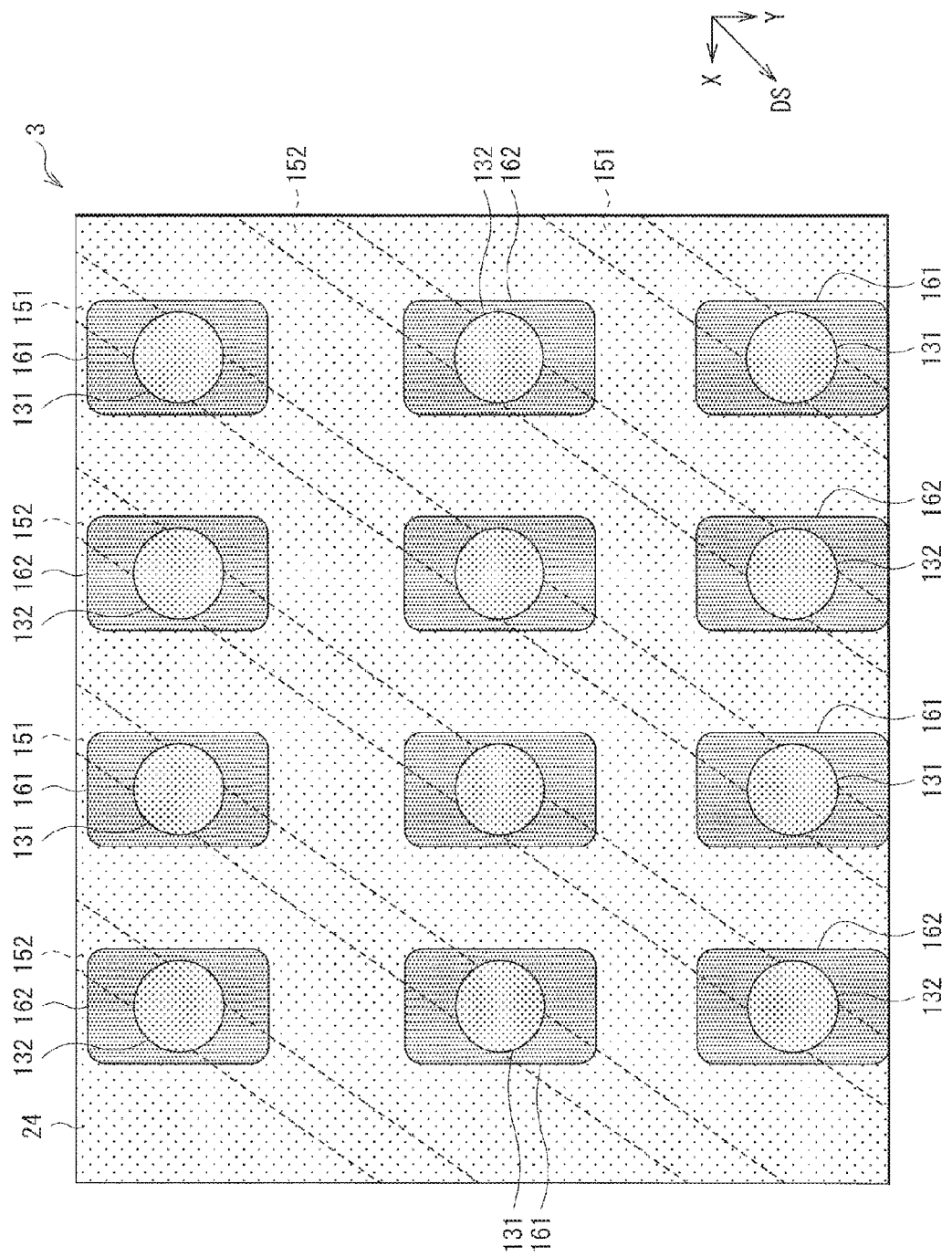

[ FIG. 11 ]
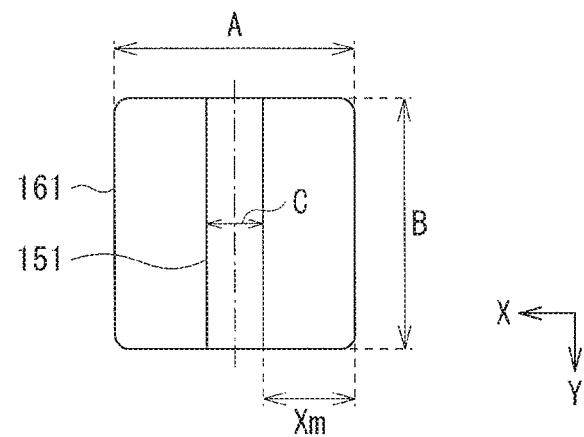
[ FIG. 12 ]
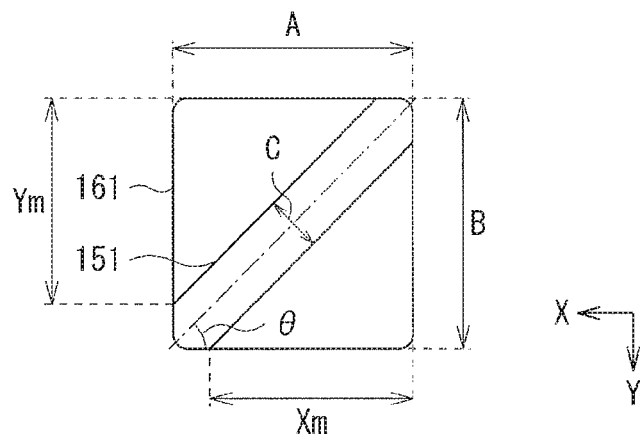

[ FIG. 13 ]
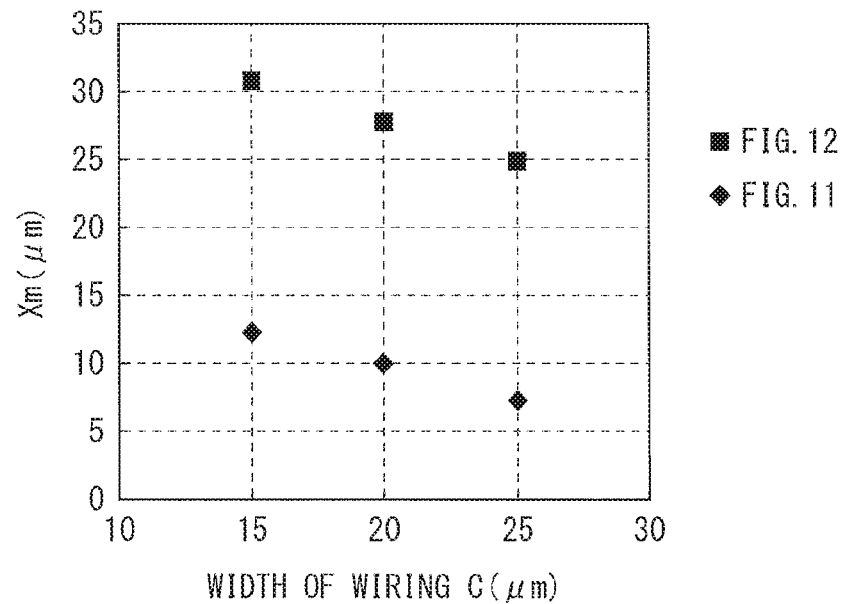
[ FIG. 14 ]
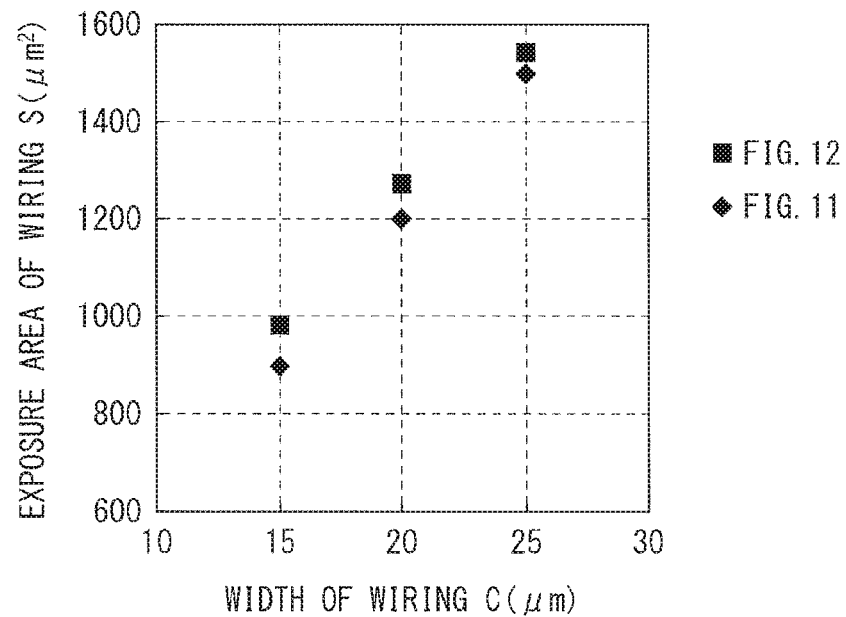

[ FIG. 15 ]
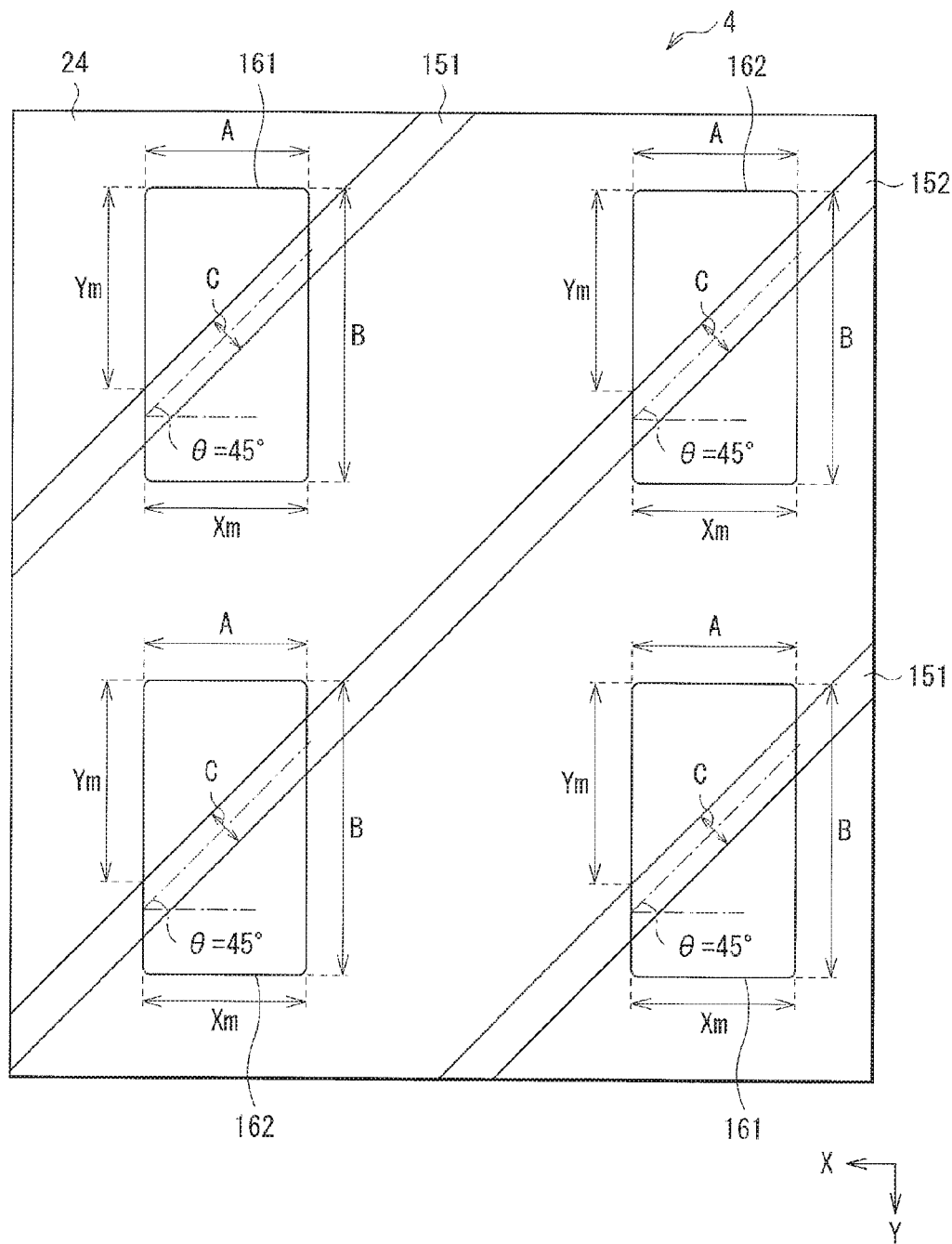

[ FIG. 16 ]
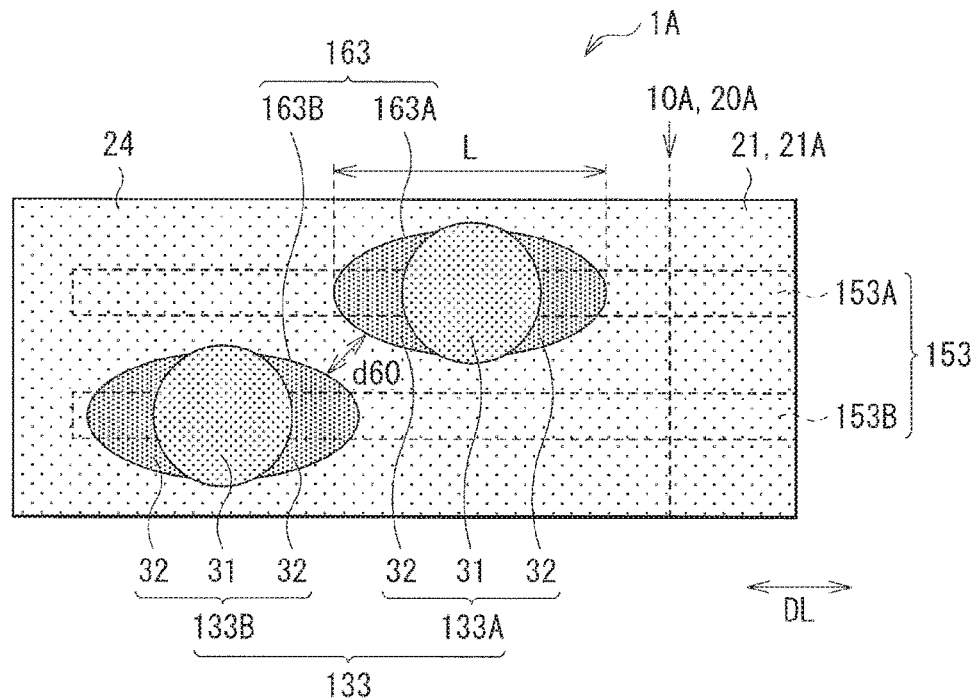
[ FIG. 17 ]
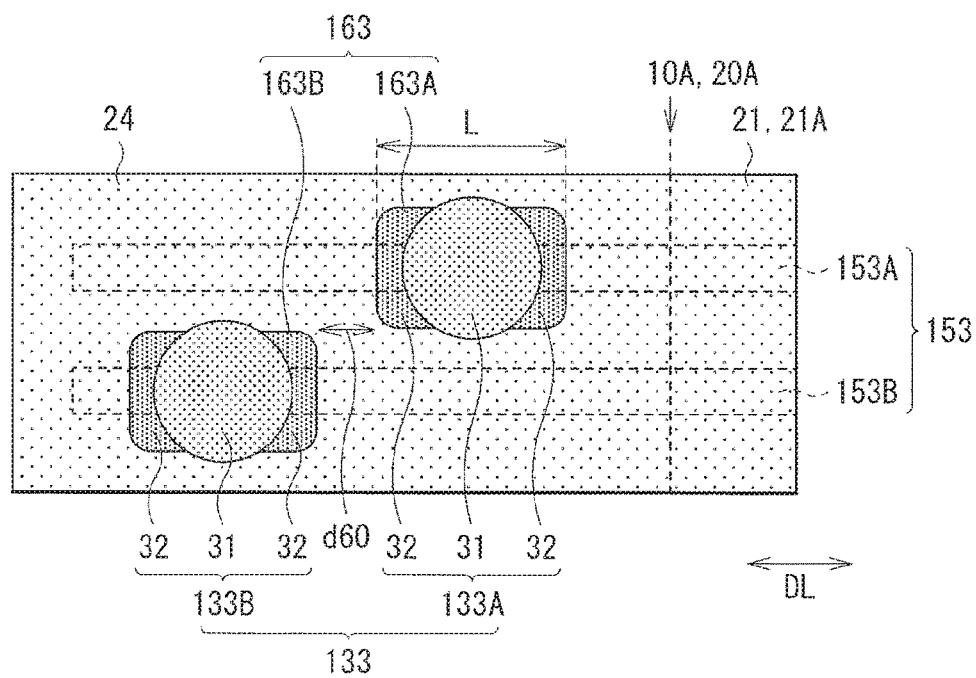

[ FIG. 18 ]
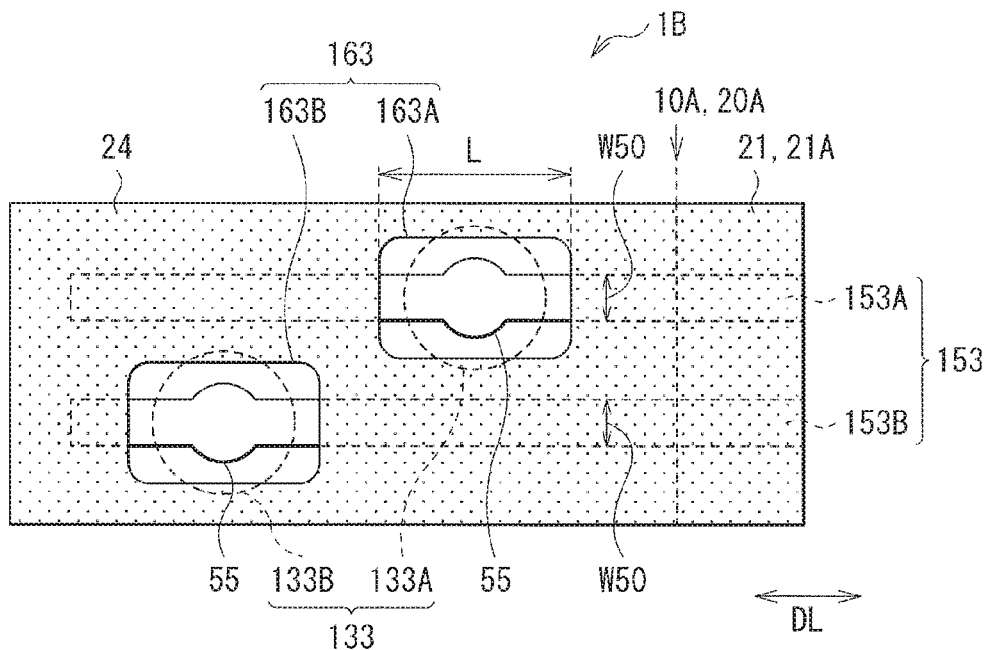
[ FIG. 19 ]
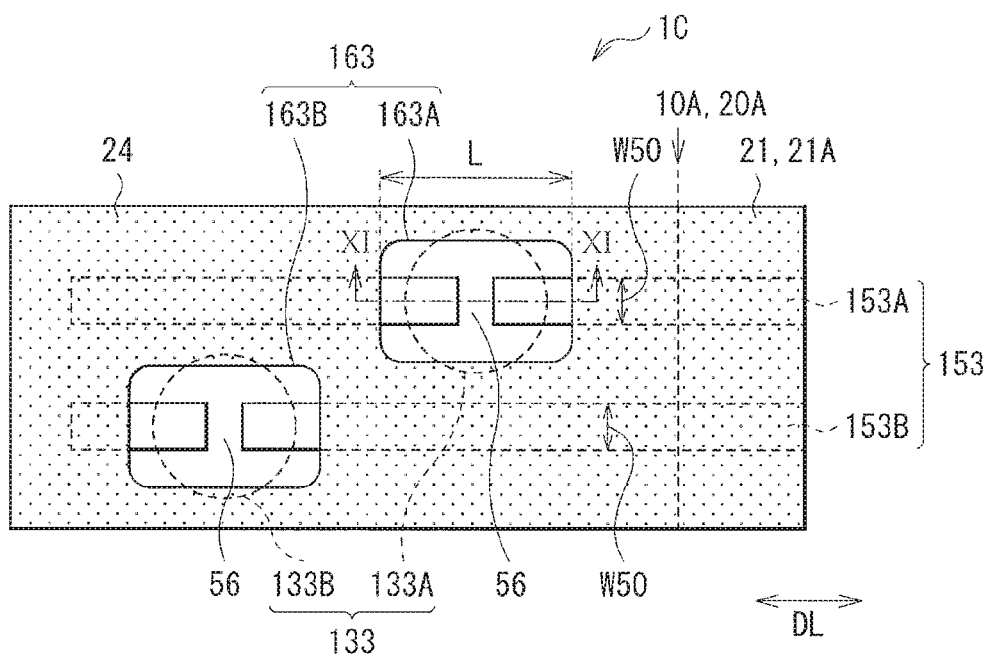

[ FIG. 20 ]
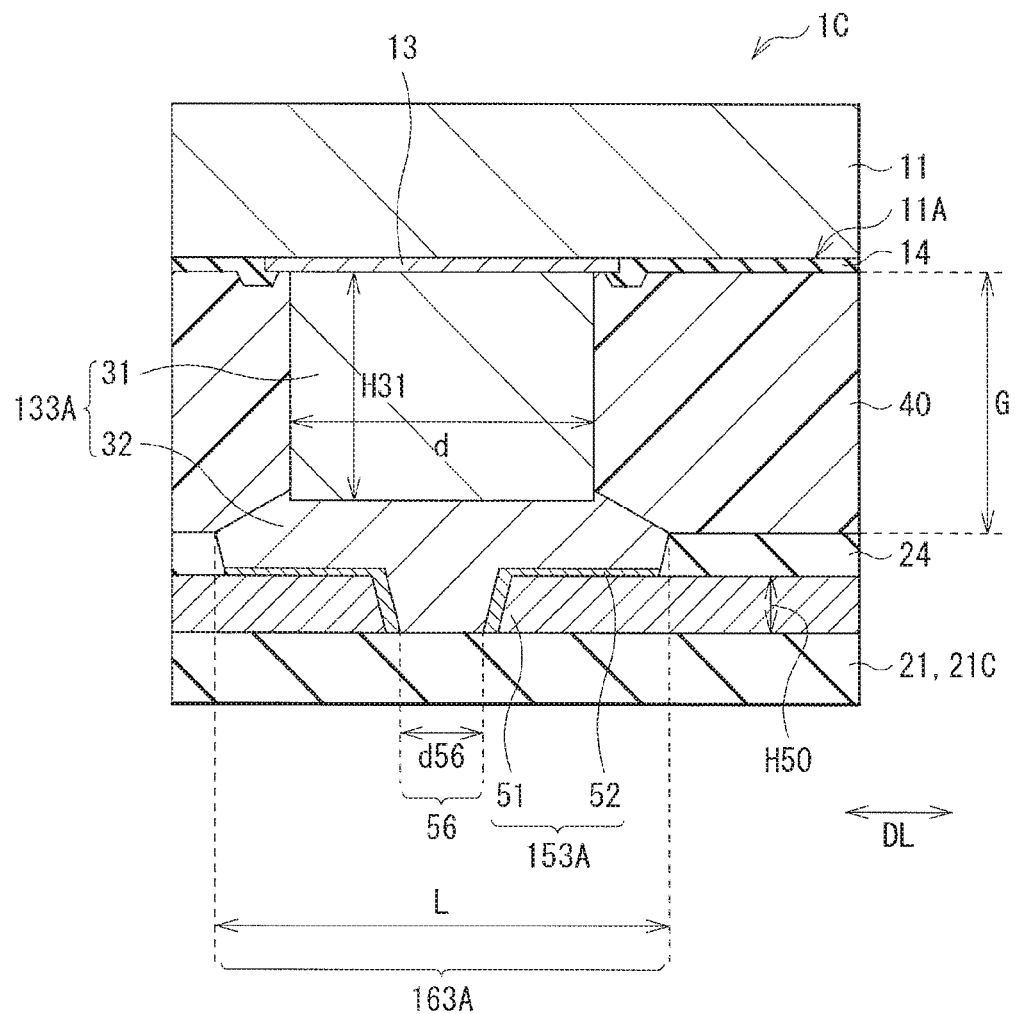

[ FIG. 21 ]
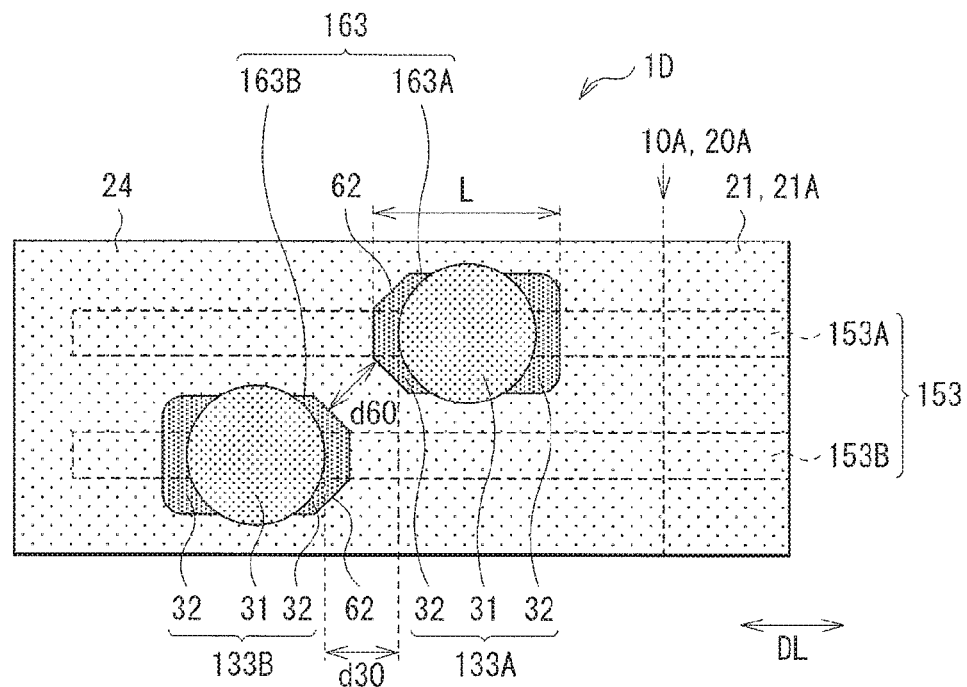
[ FIG. 22 ]
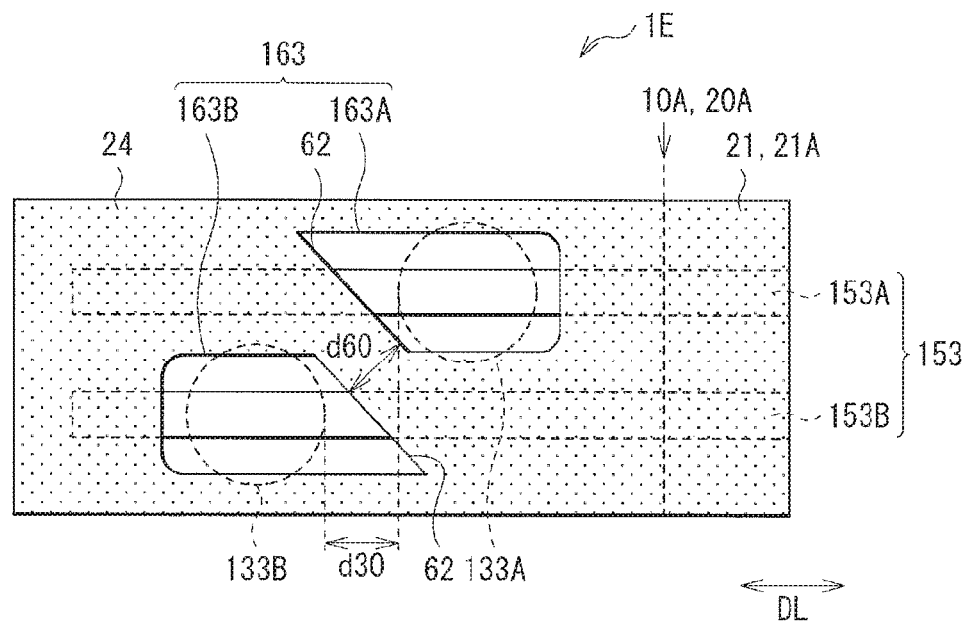

[ FIG. 23 ]
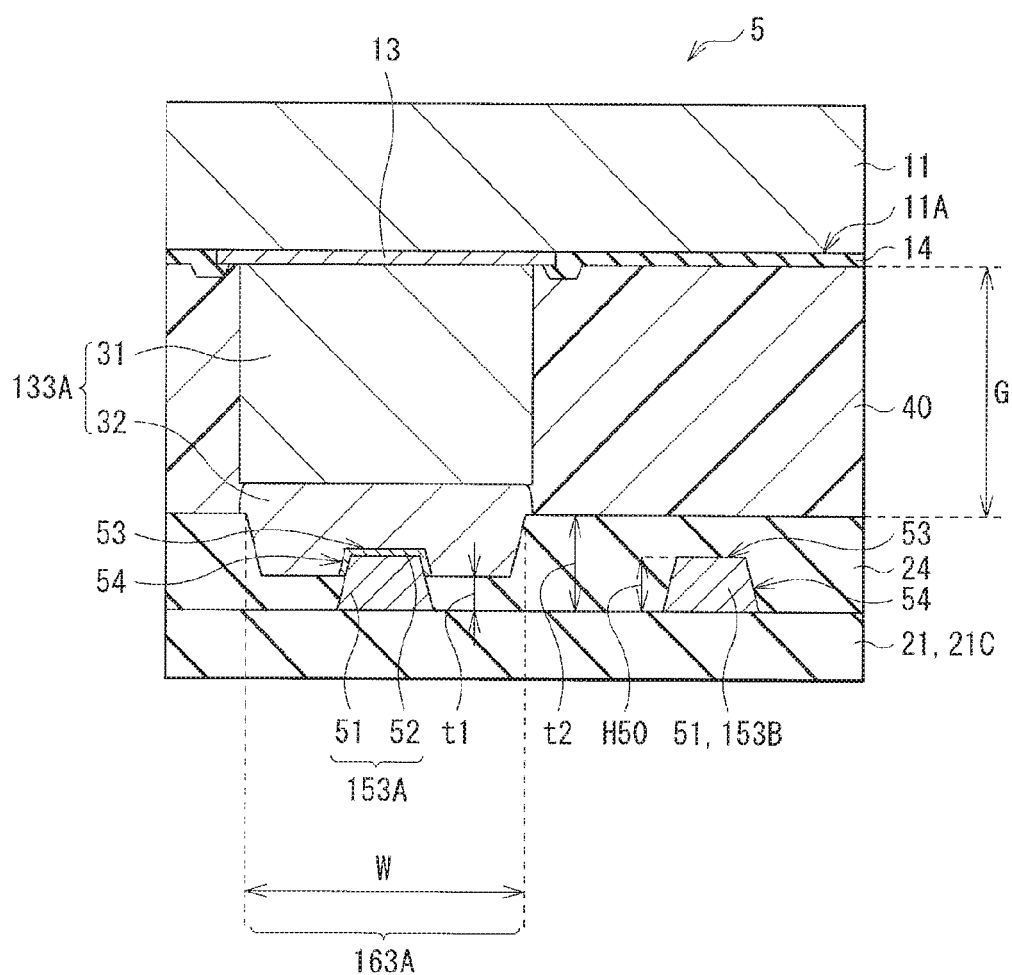

[ FIG. 24 ]
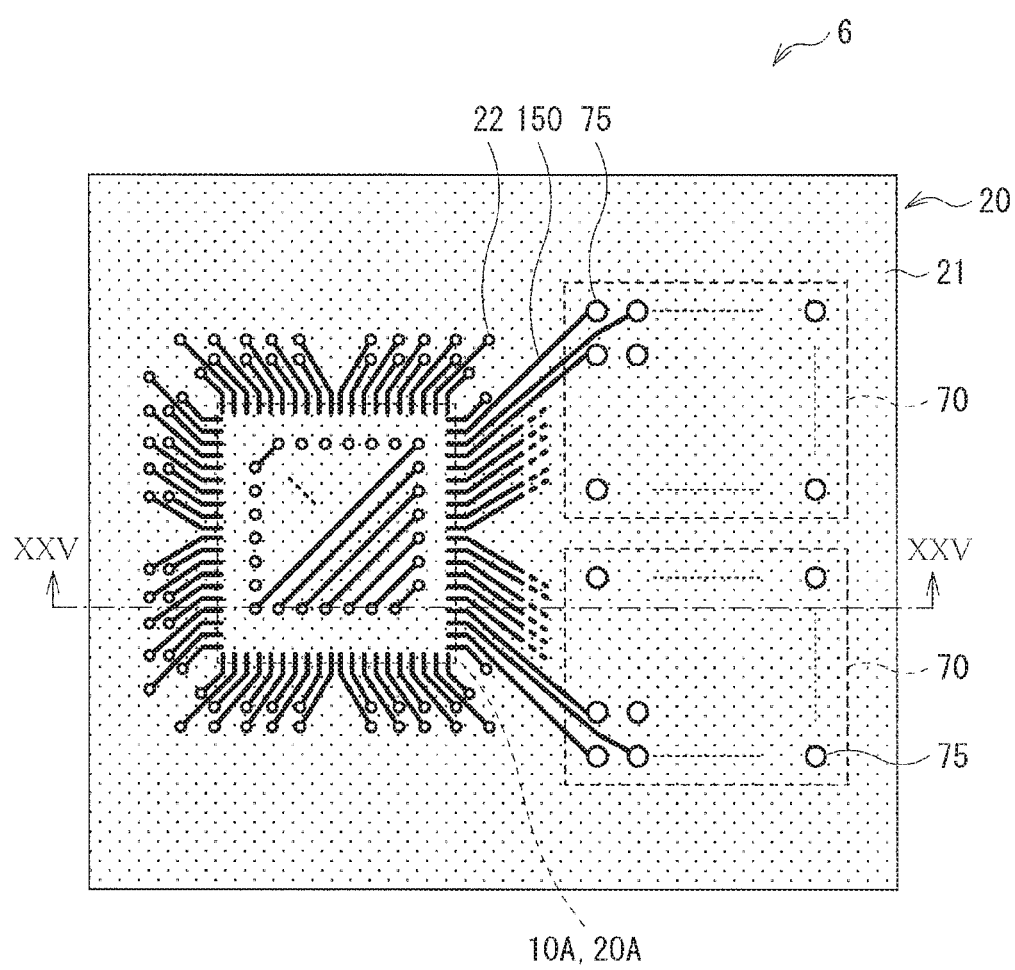

[FIG. 25]
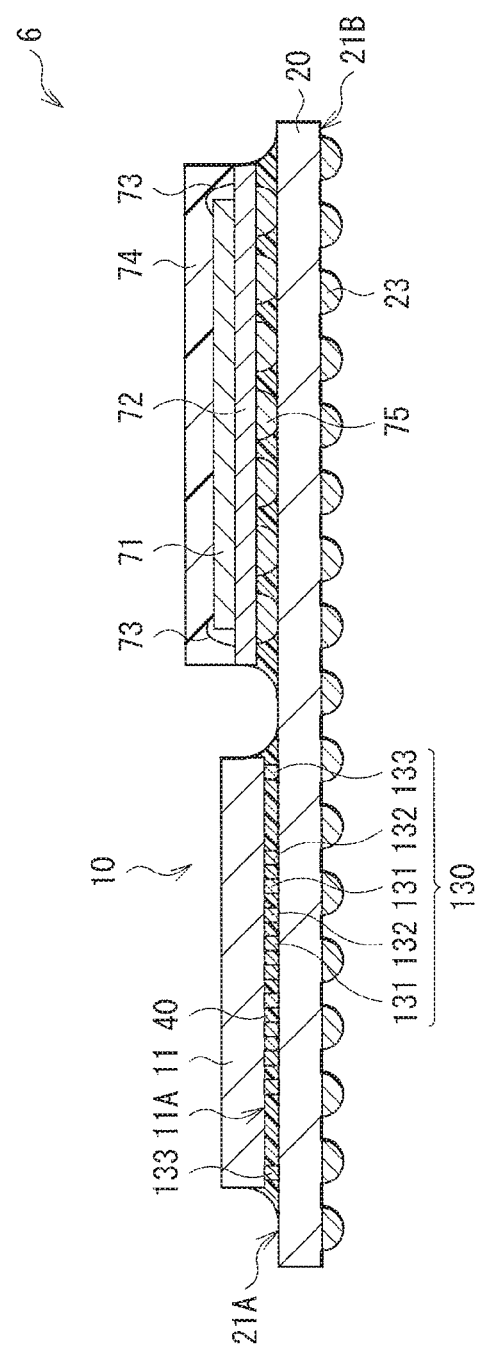

[ FIG. 26 ]
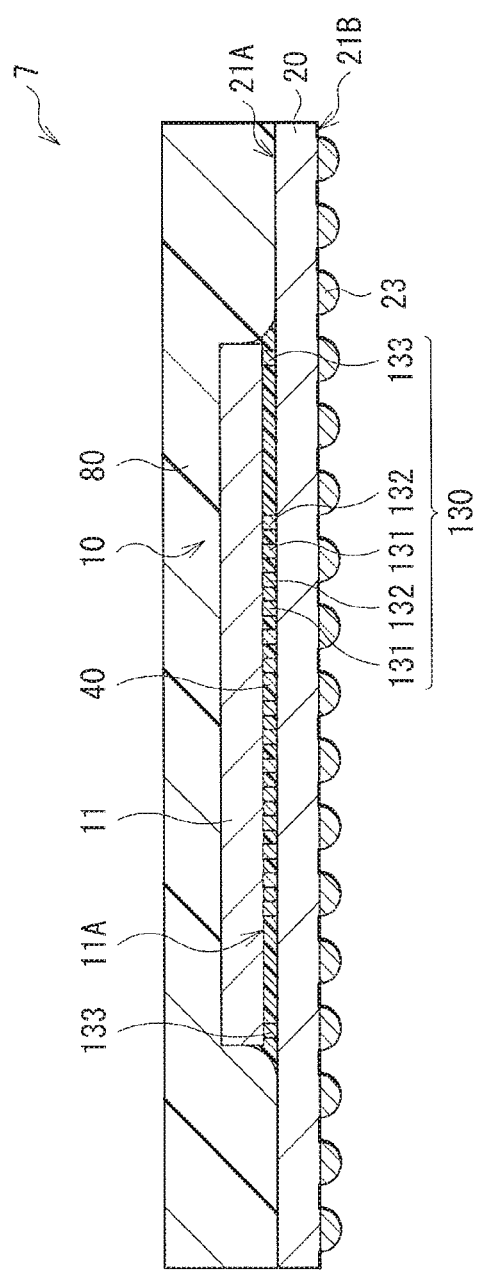

[ FIG. 27 ]
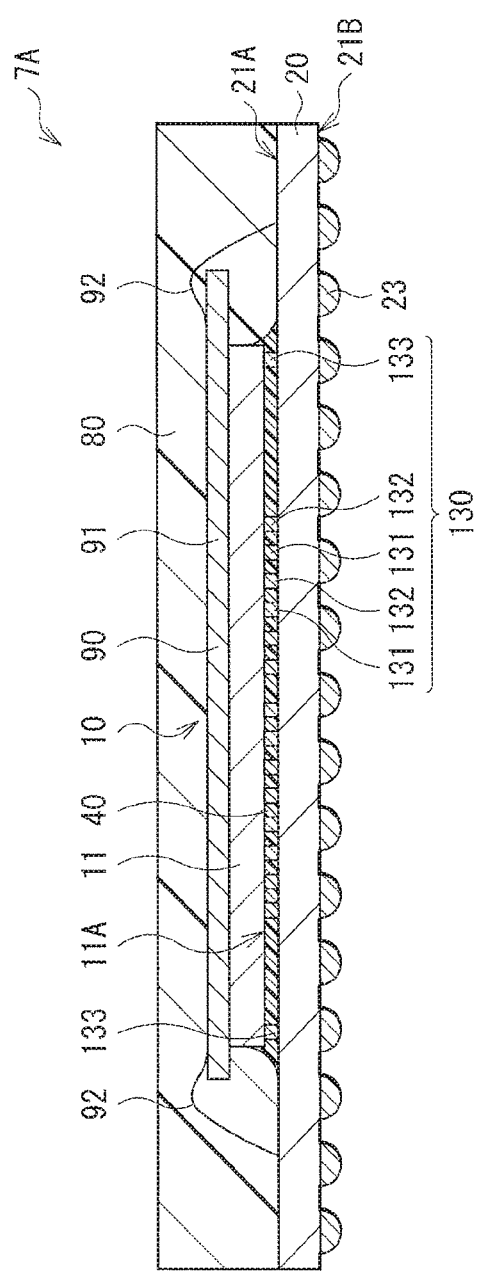

[FIG. 28]
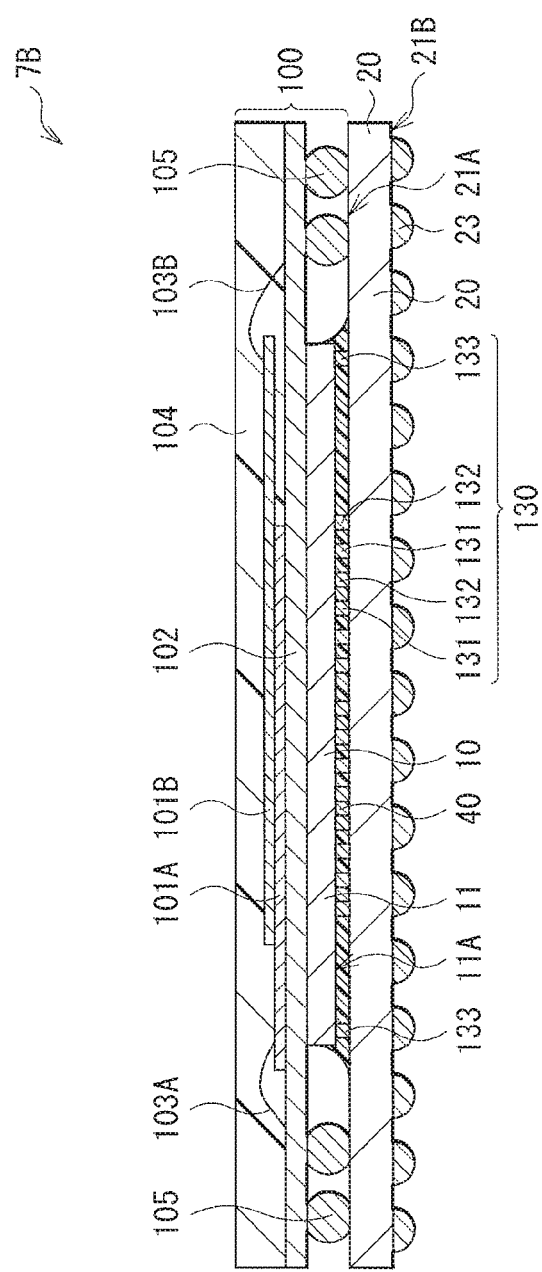

[ FIG. 29 ]
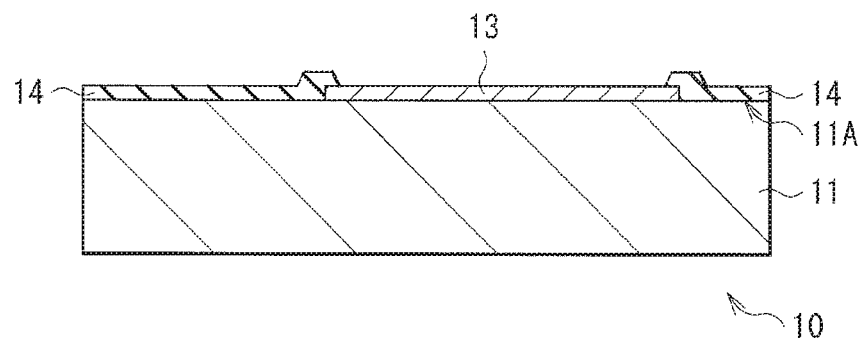
[ FIG. 30 ]
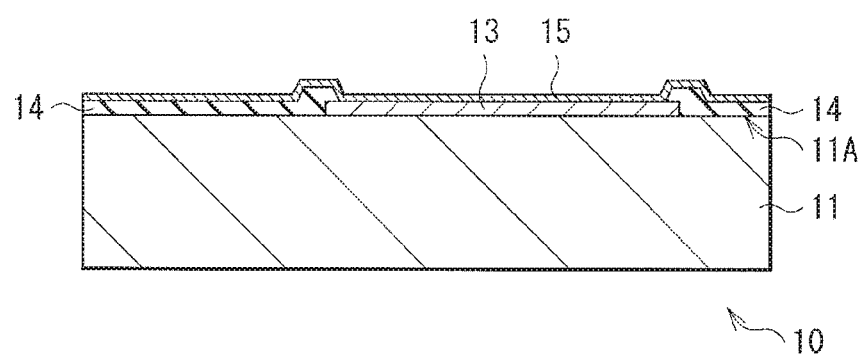

[ FIG. 31 ]
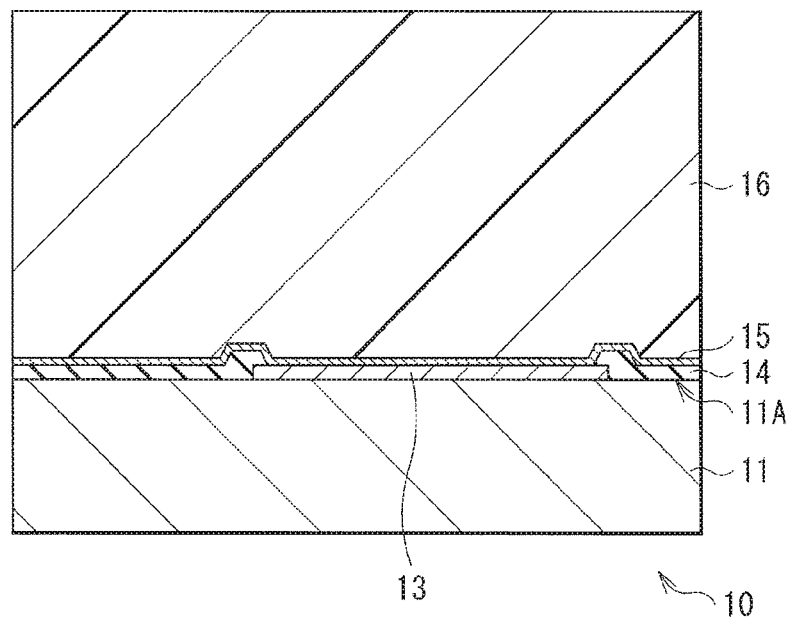
[ FIG. 32 ]
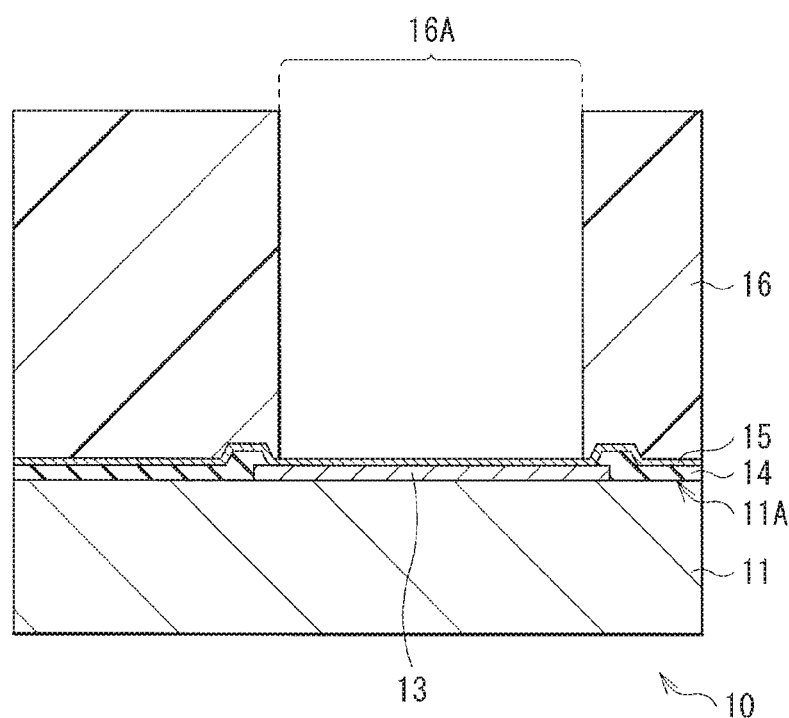

[ FIG. 33 ]
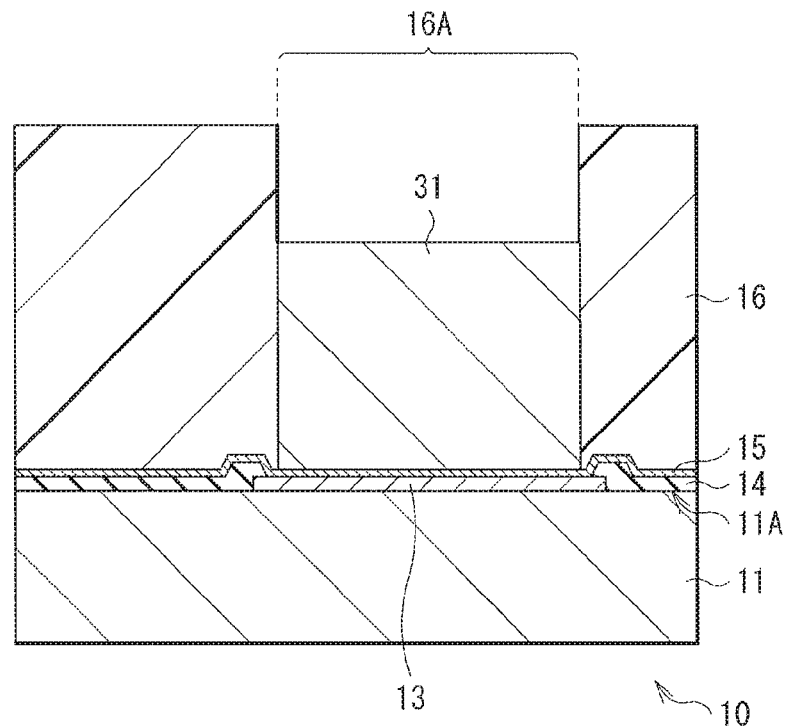
[ FIG. 34 ]
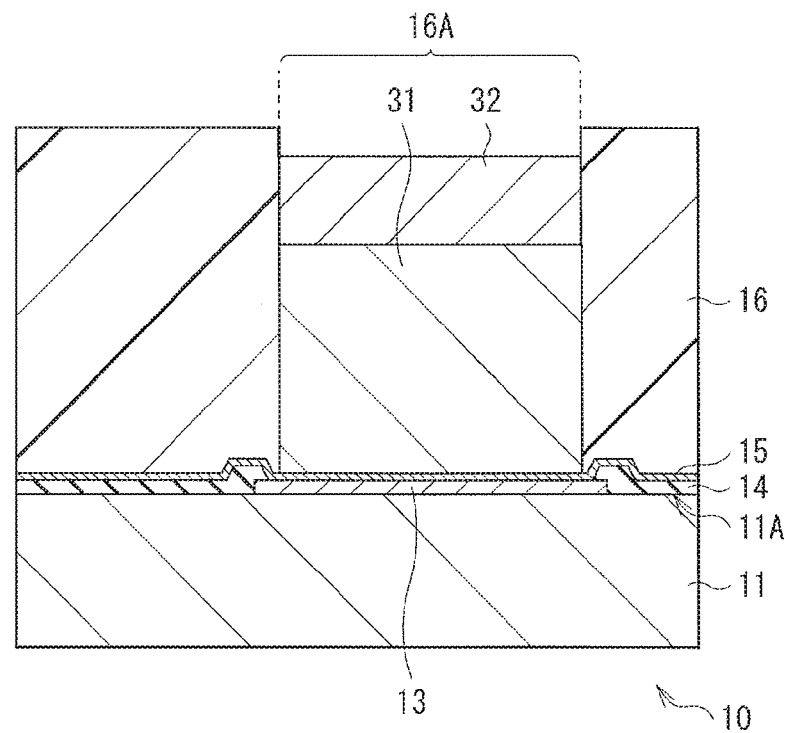

[ FIG. 35 ]
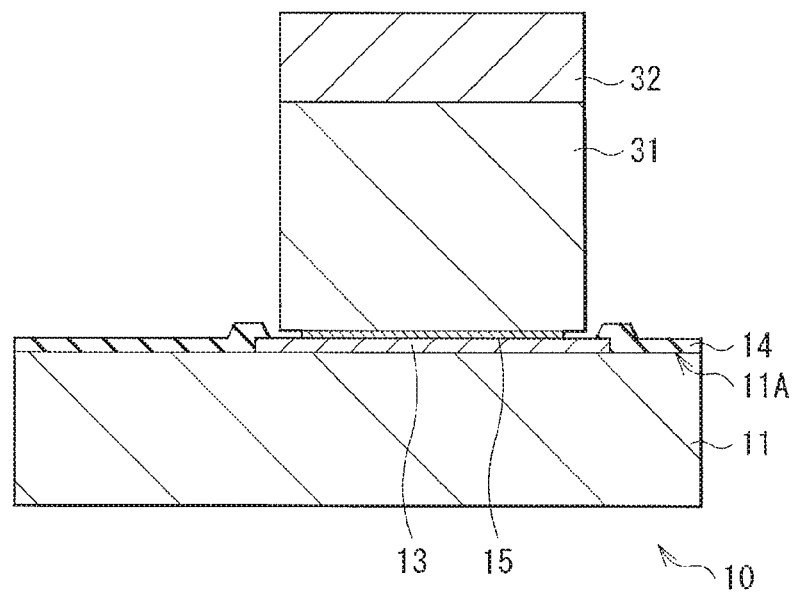
[ FIG. 36 ]
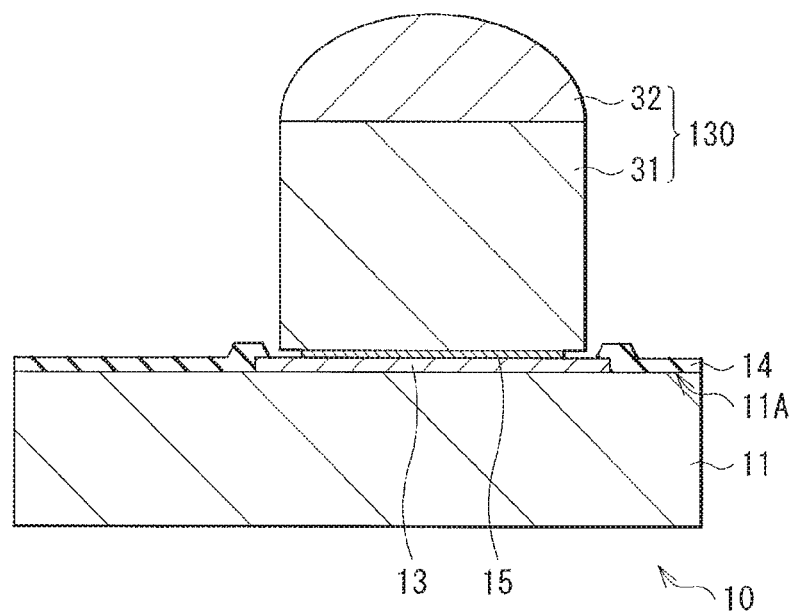

[ FIG. 37 ]
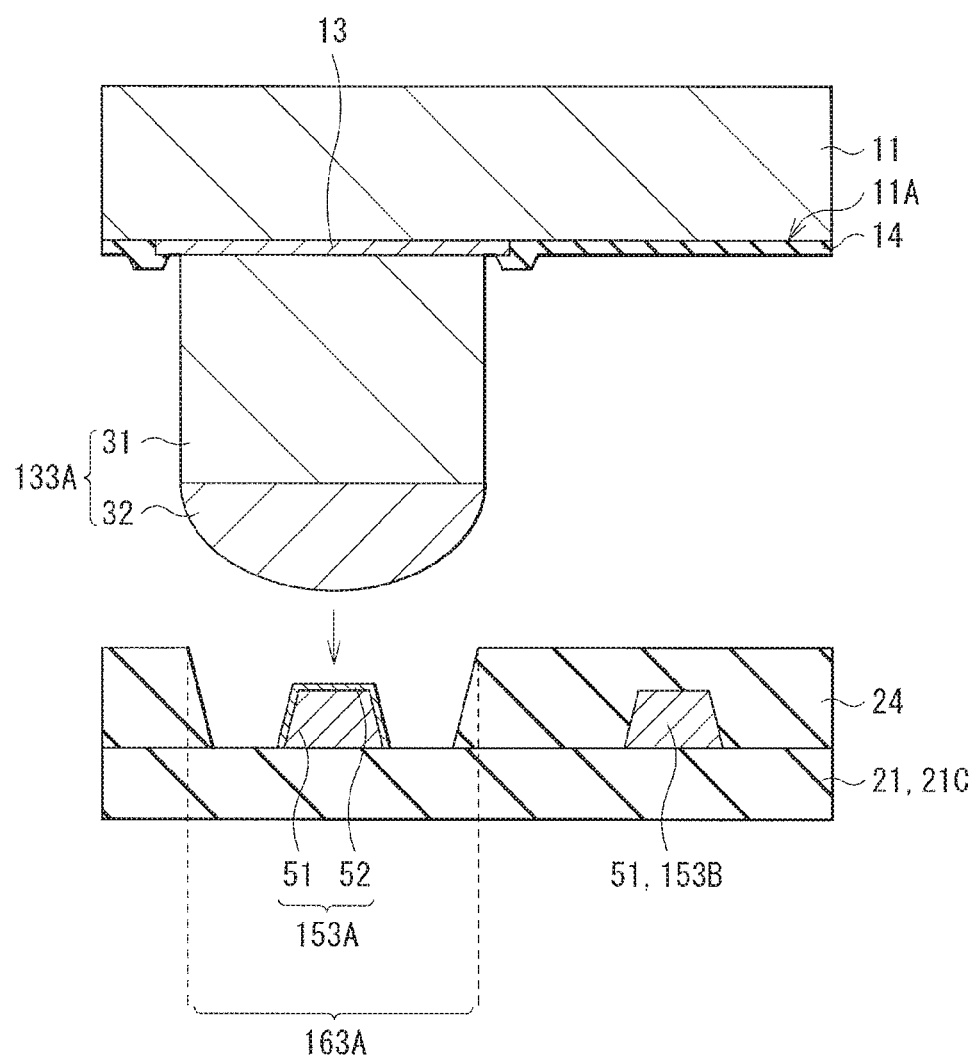

[ FIG. 38 ]
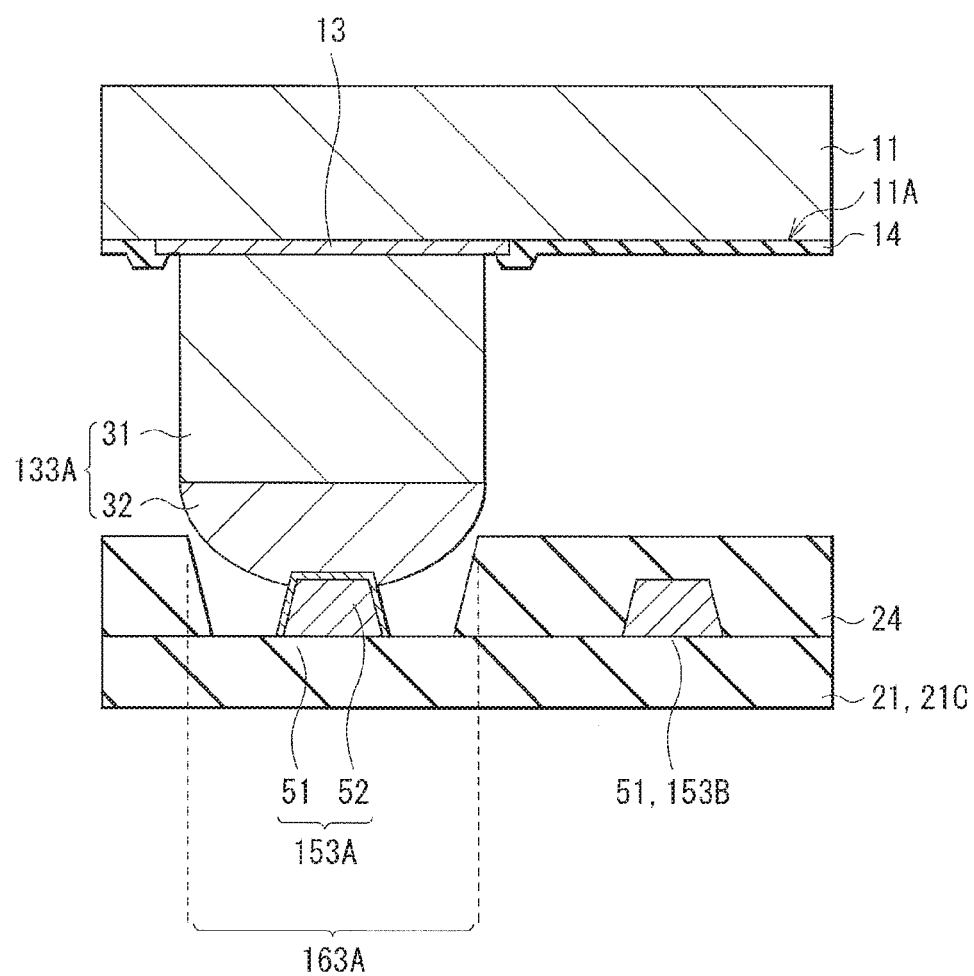

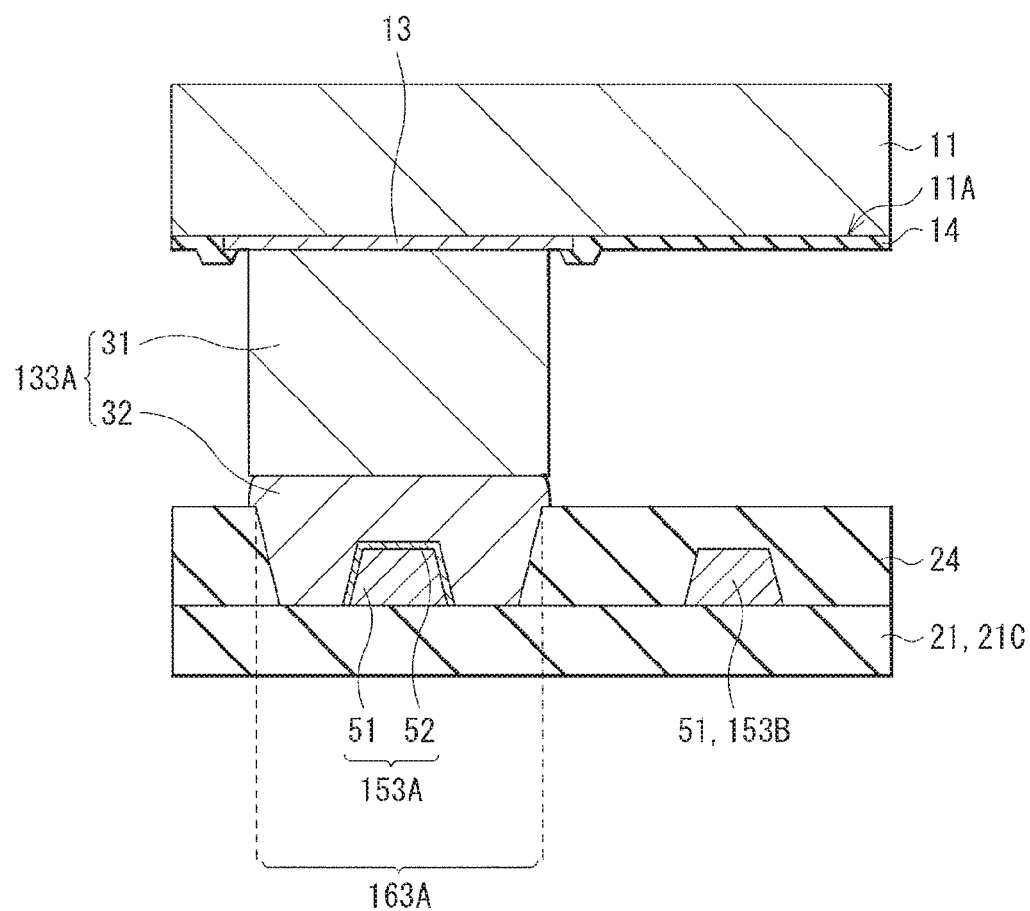
[FIG. 39]

[ FIG. 40 ]
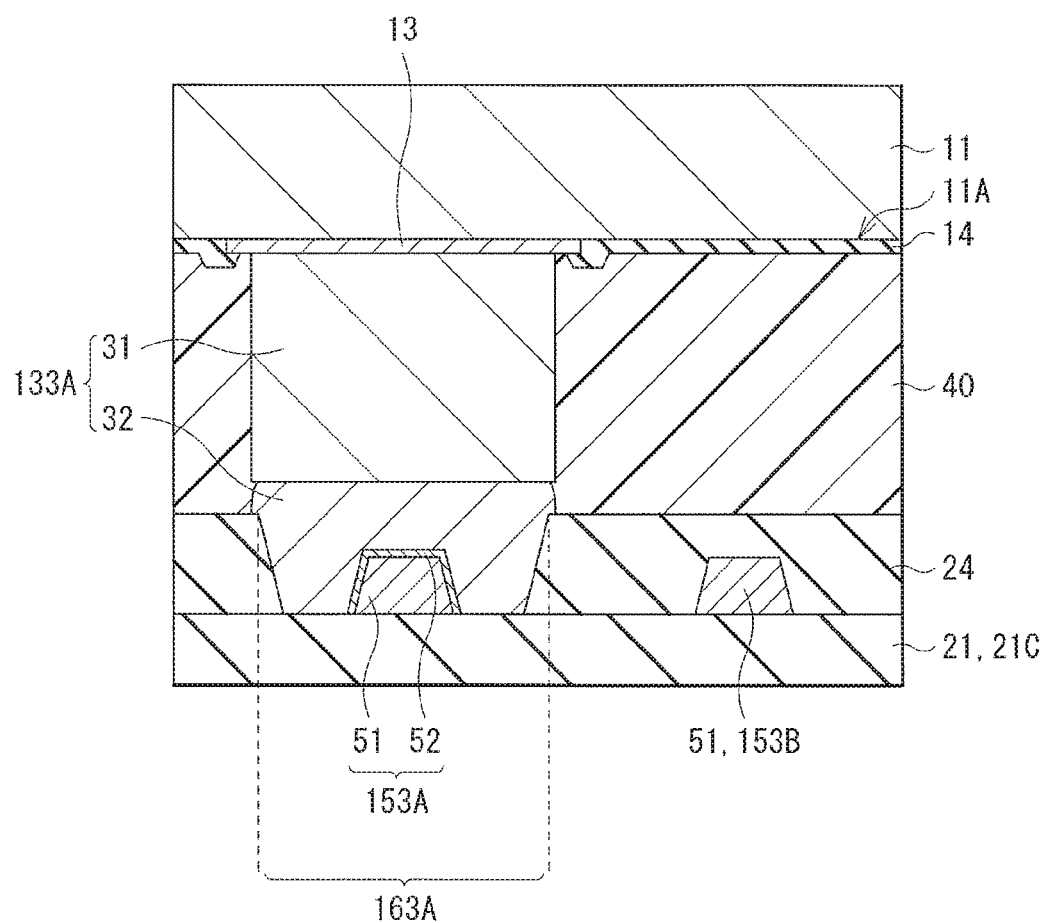

[ FIG. 41 ]
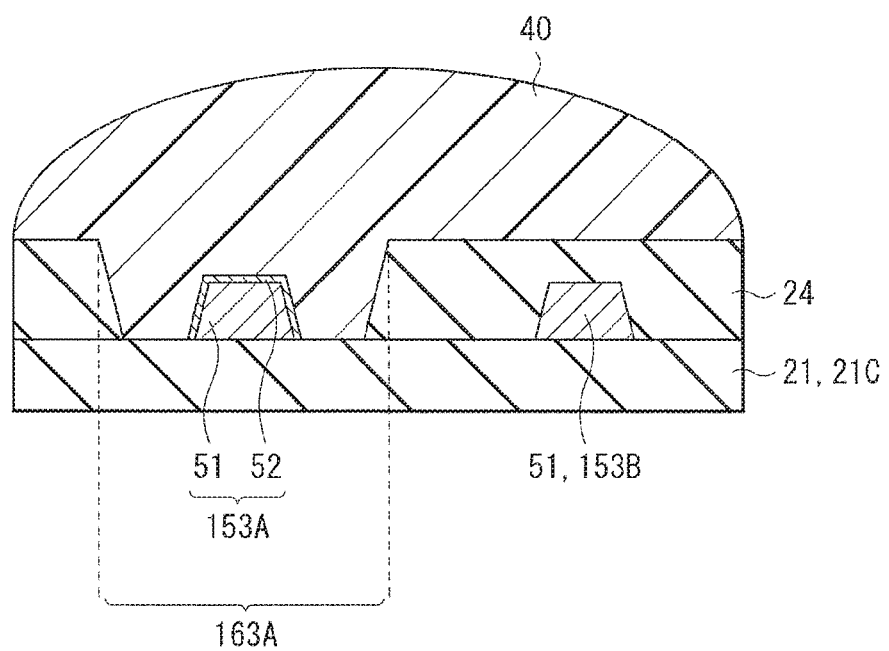

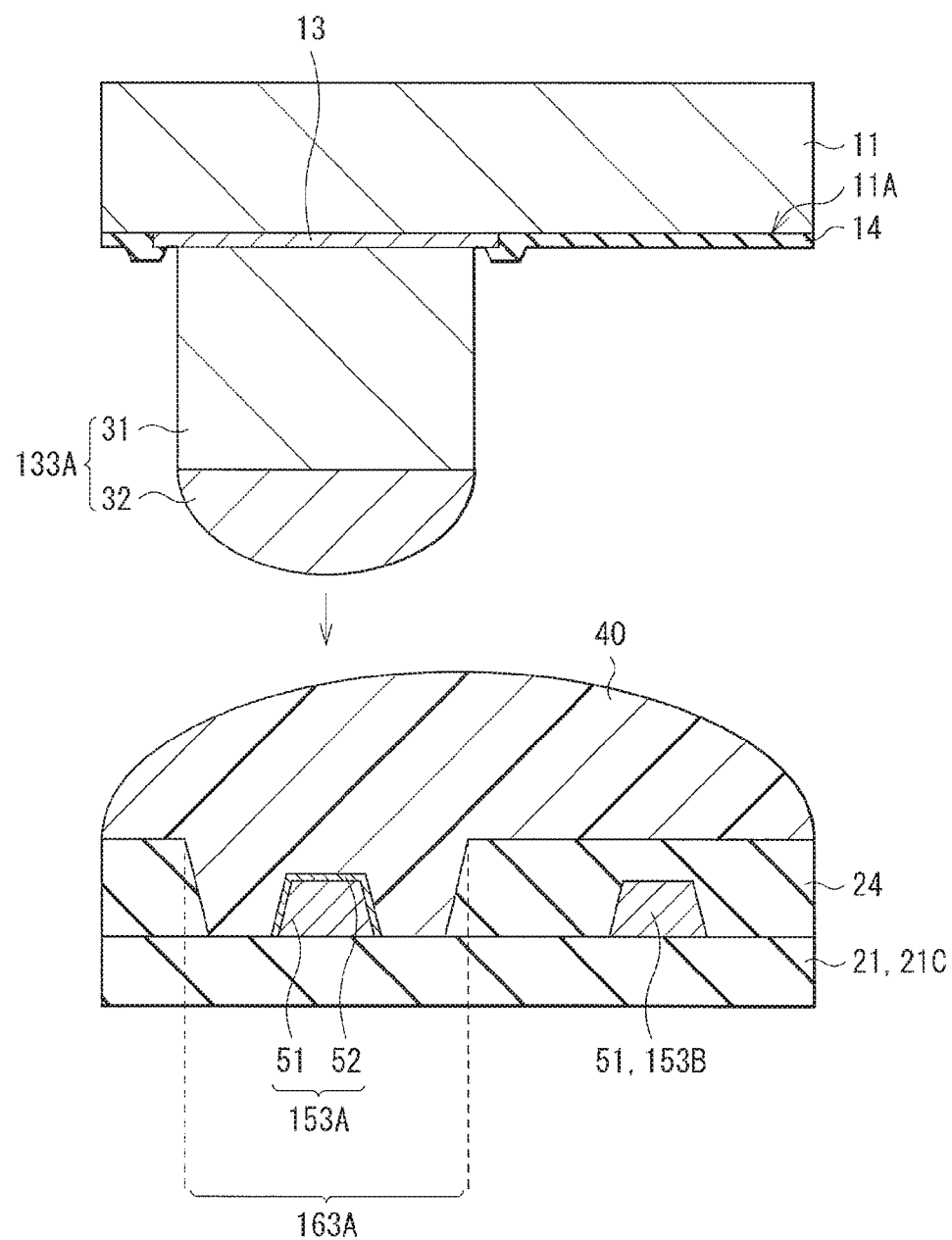
[FIG. 42]

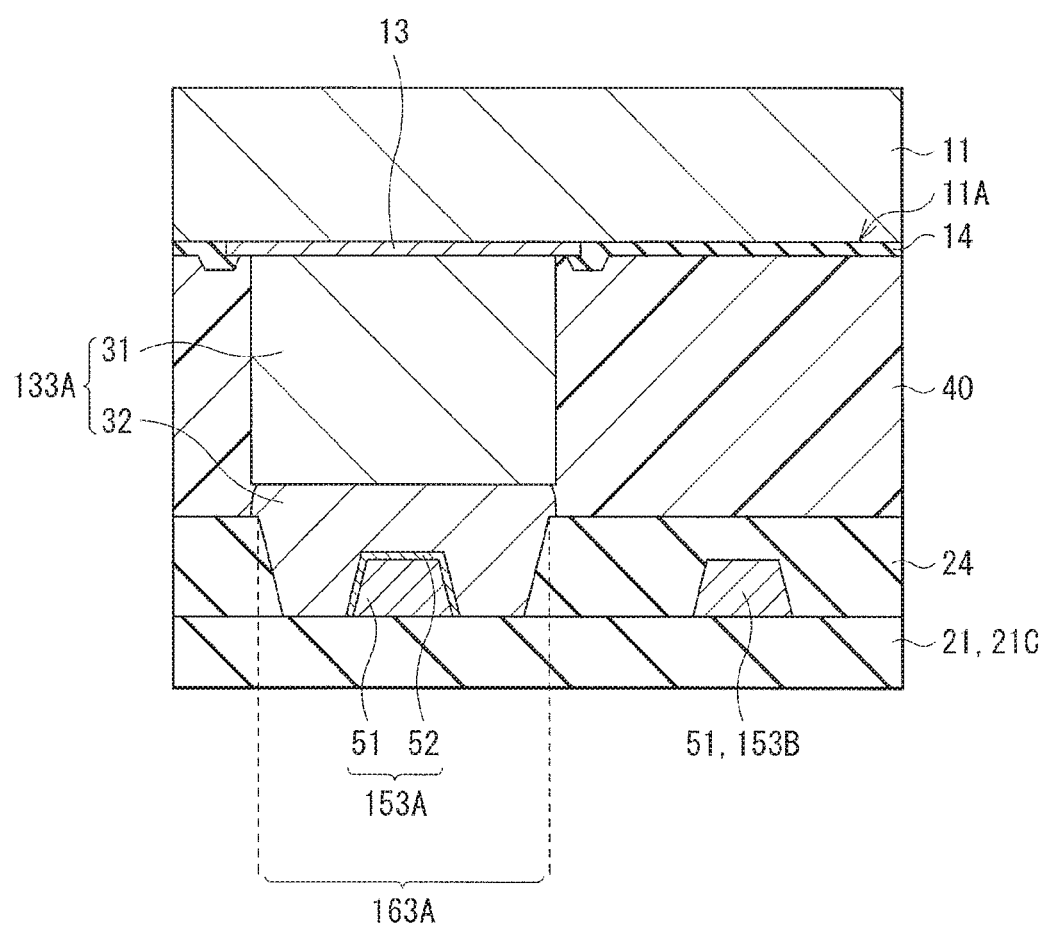
[ FIG. 43 ]

SEMICONDUCTOR CHIP MOUNTED ON A PACKAGING SUBSTRATE

CROSS REFERENCE TO RELATED APPLICATIONS

This application is a U.S. National Phase of International Patent Application No. PCT/JP2015/066351 filed on Jun. 5, 2015, which claims priority benefit of Japanese Patent Application No. JP 2014-132332 filed in the Japan Patent Office on Jun. 27, 2014. Each of the above-referenced applications is hereby incorporated herein by reference in its entirety.

TECHNICAL FIELD

The disclosure relates to a semiconductor device that utilizes a flip chip technique, and a method of manufacturing the semiconductor device.

BACKGROUND ART

In recent years, apparatuses having picture output functions, e.g., smartphones, tablet computers, television receivers, and game machines, have had remarkable improvement in display resolution. For adaptation thereto, there has been expansion of a memory band desired for an image processor LSI (Large Scale Integrated Circuit) installed in such apparatuses. Known techniques to achieve a wide memory band may include Chip on Chip (CoC), as disclosed in Patent Literature 1. But the CoC technique may tend to incur higher costs, because of use of DRAM (Dynamic Random Access Memory) having a special interface, or use of techniques such as fine connection using microbumps. A general approach may be, therefore, to use a plurality of DRAMs having a standard DDR (Double Data Rate) interface and to ensure the memory band by increasing the number of connection channels between the image processor LSI and the DRAMs. A 64-bit interface is in actual use in apparatuses such as smartphones, and the use of such an interface is expected to be spreading in the future.

Moreover, miniaturization of semiconductor devices has allowed for integration of a greater number of transistors in a chip. This has made it possible to integrate even more functions in one chip. For example, an application processor currently used in the smartphone or the tablet computer, and the LSI incorporated in a digital television receiver mainly use what unitizes CPU (Central Processing Unit), GPU (Graphics Processing Unit), and various interfaces as one chip.

Such advances in multi-channeling of a memory interface and in functional integration in one chip have caused a tendency of an increase in the number of terminals that connect the LSI to outside. In related arts, a packaging method has been generally adopted in which a semiconductor chip is connected to a packaging substrate by wire bonding. In recent years, however, in order to adapt to the increase in the connection terminals, adoption of a so-called flip chip technique has been increasing. The flip chip technique involves connecting the semiconductor chip to the packaging substrate with use of solder bumps. In particular, a technique generally used in the flip chip technique is called C4 (Controlled Collapse Chip Connection), as disclosed in, for example, Patent Literature 2.

In the C4 technique, on side of the packaging substrate, a solder resist may be provided in advance with apertures. The apertures each may have a substantially same size as a size of a solder bump to be used for connection. A paste solder material may be printed in the apertures. Then, a chip provided in advance with solder bumps may be mounted on the printed solder material, with use of flux. By a batch reflow method, the solder may melt to form connection. An underfill resin may be filled for sealing, between the chip and the packaging substrate. With this technique used, miniaturization of an inter-terminal pitch may become difficult, for the following reasons. First, in order to ensure a gap between the chip and the packaging substrate to fill the underfill resin, it is desirable to increase a diameter of the solder bump formed on side of the chip. Second, the solder paste may be formed by a printing method, causing difficulty in formation of fine patterns. Accordingly, the pitch between the connection terminals may become about 150 µm to 180 µm both inclusive. This leads to expectation of difficulty in adaptation to an increase in the number of signals in the future, or to chip shrinkage due to device miniaturization.

In view of the current situation as described above, Patent Literature 3 discloses a technique that involves performing flip chip directly on wirings, for purpose of a further increase in signal terminal density and reduction in substrate costs. In the existing C4 technique, a land having a larger size than the bump diameter may be formed on the packaging substrate. In contrast, in this technique, a bump may be pressed onto a wiring having a smaller width than a bump diameter, to join the bump and the wiring together, with the wiring forcing itself into the bump. Thus, this technique has made improvement in an effort to attain high bonding strength even in a case with use of bumps having small diameters. Also, a bump structure (a pillar bump) may be generally used in which solder plating is performed on a metal pillar, or a so-called pillar. This makes it possible to ensure the gap, between the chip and the packaging substrate, desirable for injection of the underfill resin even in the case with use of bumps having small diameters.

On the other hand, in a case in which solder-including electrodes such as the pillar bumps are disposed only in a peripheral part of the semiconductor chip, a voltage drop may occur because of large wiring resistance from the solder-including electrode to a transistor in the semiconductor chip. Accordingly, for example, Patent Literature 3 mentioned above discloses an array arrangement in which pillar bumps for power supply may be disposed in a central part of the semiconductor chip. The pillar bumps for power supply each may have a similar configuration to that of the pillar bump in the peripheral part. Each of the pillar bumps in the peripheral part may be connected to a via for connection to a lower layer of the packaging substrate, through a wiring on the packaging substrate. Meanwhile, the pillar bumps in the central part each may be also connected to a via for connection to a lower layer of the packaging substrate, through a wiring on the packaging substrate, as with the pillar bumps in the peripheral part. The pillar bumps in the central part may be further connected to a power supply pattern or a ground pattern of the lower layer.

CITATION LIST

Patent Literature

Patent Literature 1: JP 2010-192886A
Patent Literature 2: Specification of U.S. Pat. No. 5,900,675
Patent Literature 3: JP 2012-119648A

SUMMARY OF INVENTION

However, a size of the via on the packaging substrate is larger than a size of the pillar bump. This results in limitation in the number of the pillar bumps allowed to be disposed, in the configuration as in Patent Literature 3 mentioned above in which the via may be provided for each of the pillar bumps in the central part. It is therefore difficult to provide a highly densified arrangement of the solder-including electrodes such as the pillar bumps in the central part of the semiconductor chip. The voltage drop due to the wiring resistance in the semiconductor chip has not been sufficiently eliminated.

It is therefore desirable to provide a semiconductor device and a method of manufacturing the same that make it possible to dispose solder-including electrodes in high density in a central part of a semiconductor chip, and to perform appropriate power supply to the semiconductor chip.

A semiconductor device according to an embodiment of the disclosure includes a semiconductor chip, and a packaging substrate on which the semiconductor chip is mounted. The semiconductor chip includes a chip body and a plurality of solder-including electrodes provided on an element-formation surface of the chip body. The packaging substrate includes a substrate body, a plurality of wirings, and a solder resist layer, in which the plurality of wirings and the solder resist layer are provided on a front surface of the substrate body. The solder resist layer is provided as a continuous layer on the front surface of the substrate body and the plurality of wirings, and has one or more apertures on each of the plurality of wirings. The one or more apertures allow an upper surface and part or all in a heightwise direction of side surfaces of the wiring inside the one or more apertures to be exposed. The plurality of solder-including electrodes each cover an exposed part of the wiring inside the one or more apertures. The plurality of solder-including electrodes include a plurality of first electrodes and a plurality of second electrodes, in which the plurality of first electrodes supply a first electric potential, and the plurality of second electrodes supply a second electric potential different from the first electric potential. The plurality of first electrodes and the plurality of second electrodes are disposed alternately in both a row direction and a column direction, in a central part of the chip body. The plurality of wirings include a plurality of first wirings and a plurality of second wirings, in which the plurality of first wirings connect the plurality of first electrodes, and the plurality of second wirings connect the plurality of second electrodes.

In the semiconductor device according to the embodiment of the disclosure, the plurality of solder-including electrodes include the plurality of first electrodes and the plurality of second electrodes. The plurality of first electrodes supply the first electric potential, and the plurality of second electrodes supply the second electric potential different from the first electric potential. The plurality of first electrodes and the plurality of second electrodes are disposed alternately in both the row direction and the column direction, in the central part of the chip body. The plurality of wirings include the plurality of first wirings and the plurality of second wirings. The plurality of first wirings connect the plurality of first electrodes, and the plurality of second wirings connect the plurality of second electrodes. Accordingly, the number of vias on the packaging substrate is reduced, and the solder-including electrodes are disposed in high density, as compared to a configuration in which a via is provided for each of the plurality of solder-including electrodes. A voltage drop due to wiring resistance in the semiconductor chip is therefore suppressed.

A first method of manufacturing a semiconductor device according to an embodiment of the disclosure includes: aligning a semiconductor chip with a packaging substrate, in which the semiconductor chip includes a chip body and a plurality of solder-including electrodes provided on an element-formation surface of the chip body, and the packaging substrate includes a substrate body, a plurality of wirings, and a solder resist layer, in which the plurality of wirings and the solder resist layer are provided on a front surface of the substrate body; temporarily bonding the semiconductor chip to the packaging substrate; connecting the plurality of solder-including electrodes to the plurality of wirings, by reflow heating; and injecting an underfill resin between the semiconductor chip and the packaging substrate, and curing the underfill resin. The solder resist layer is provided as a continuous layer on the front surface of the substrate body and the plurality of wirings, and has one or more apertures on each of the plurality of wirings. The one or more apertures allow an upper surface and part or all in a heightwise direction of side surfaces of the wiring inside the one or more apertures to be exposed. The plurality of solder-including electrodes each cover an exposed part of the wiring inside the one or more apertures. The plurality of solder-including electrodes include a plurality of first electrodes and a plurality of second electrodes, in which the plurality of first electrodes supply a first electric potential, and the plurality of second electrodes supply a second electric potential different from the first electric potential. The plurality of first electrodes and the plurality of second electrodes are disposed alternately in both a row direction and a column direction, in a central part of the chip body. The plurality of wirings include a plurality of first wirings and a plurality of second wirings, in which the plurality of first wirings connect the plurality of first electrodes, and the plurality of second wirings connect the plurality of second electrodes.

A second method of manufacturing a semiconductor device according to an embodiment of the disclosure includes: aligning a semiconductor chip with a packaging substrate, in which the semiconductor chip includes a chip body and a plurality of solder-including electrodes provided on an element-formation surface of the chip body, and the packaging substrate includes a substrate body, a plurality of wirings, and a solder resist layer, in which the plurality of wirings and the solder resist layer are provided on a front surface of the substrate body; connecting the plurality of solder-including electrodes to the plurality of wirings, by heating the semiconductor chip at a temperature equal to or higher than a melting point of the solder, and by pressure-bonding the semiconductor chip to the packaging substrate; and injecting an underfill resin between the semiconductor chip and the packaging substrate, and curing the underfill resin. The solder resist layer is provided as a continuous layer on the front surface of the substrate body and the plurality of wirings, and has one or more apertures on each of the plurality of wirings. The one or more apertures allow an upper surface and part or all in a heightwise direction of side surfaces of the wiring inside the one or more apertures to be exposed. The plurality of solder-including electrodes each cover an exposed part of the wiring inside the one or more apertures. The plurality of solder-including electrodes include a plurality of first electrodes and a plurality of second electrodes, in which the plurality of first electrodes supply a first electric potential, and the plurality of second electrodes supply a second electric potential different from the first electric potential. The plurality of first electrodes and the plurality of second electrodes are disposed alternately in both a row direction and a column direction, in a central part of the chip body. The plurality of wirings include a plurality of first wirings and a plurality of second wirings, in which the plurality of first wirings connect the plurality of first electrodes, and the plurality of second wirings connect the plurality of second electrodes.

A third method of manufacturing a semiconductor device according to an embodiment of the disclosure includes: supplying an underfill resin on a packaging substrate, in which the packaging substrate includes a substrate body, a plurality of wirings, and a solder layer, in which the plurality of wirings and the solder resist layer are provided on a front surface of the substrate body; aligning a semiconductor chip with the packaging substrate, in which the semiconductor chip includes a chip body and a plurality of solder-including electrodes provided on an element-formation surface of the chip body; and connecting the plurality of solder-including electrodes to the plurality of wirings, while curing the underfill resin, by heating the semiconductor chip at a temperature equal to or higher than a melting point of the solder, and by pressure-bonding the semiconductor chip to the packaging substrate. The solder resist layer is provided as a continuous layer on the front surface of the substrate body and the plurality of wirings, and has one or more apertures on each of the plurality of wirings. The one or more apertures allow an upper surface and part or all in a heightwise direction of side surfaces of the wiring inside the one or more apertures to be exposed. The plurality of solder-including electrodes each cover an exposed part of the wiring inside the one or more apertures. The plurality of solder-including electrodes include a plurality of first electrodes and a plurality of second electrodes, in which the plurality of first electrodes supply a first electric potential, and the plurality of second electrodes supply a second electric potential different from the first electric potential. The plurality of first electrodes and the plurality of second electrodes are disposed alternately in both a row direction and a column direction, in a central part of the chip body. The plurality of wirings include a plurality of first wirings and a plurality of second wirings, in which the plurality of first wirings connect the plurality of first electrodes, and the plurality of second wirings connect the plurality of second electrodes.

According to the semiconductor device of the embodiment of the disclosure, or the first to third methods of manufacturing the semiconductor devices of the embodiments of the disclosure, the plurality of solder-including electrodes include the plurality of first electrodes and the plurality of second electrodes. The plurality of first electrodes supply the first electric potential, and the plurality of second electrodes supply the second electric potential different from the first electric potential. The plurality of first electrodes and the plurality of second electrodes are disposed alternately in both the row direction and the column direction, in the central part of the chip body. The plurality of wirings include the plurality of first wirings and the plurality of second wirings. The plurality of first wirings connect the plurality of first electrodes, and the plurality of second wirings connect the plurality of second electrodes. Hence, it is possible to dispose the solder-including electrodes in high density in a central part of the semiconductor chip, and to perform appropriate power supply to the semiconductor chip.

It is to be noted that some effects described here are not necessarily limitative, and any of other effects described herein may be achieved.

BRIEF DESCRIPTION OF DRAWINGS

FIG. 1 is a schematic top view of an overall configuration of a semiconductor device according to a first embodiment of the disclosure.

FIG. 2 is a schematic cross-sectional view of the overall configuration of the semiconductor device illustrated in FIG. 1.

FIG. 3 is an enlarged top view of part of the semiconductor device illustrated in FIG. 1.

FIG. 4 is an enlarged top view of other part of the semiconductor device illustrated in FIG. 1.

FIG. 5 is a cross-sectional view taken along a line V-V of FIG. 3.

FIG. 6 is a cross-sectional view taken along a line VI-VI of FIG. 4.

FIG. 7 is a cross-sectional view taken along a line VII-VII of FIG. 4.

FIG. 8 is a cross-sectional view that illustrates an example of positional deviation between an aperture and a solder-including electrode.

FIG. 9 is an enlarged top view of part of a semiconductor device according to a second embodiment of the disclosure.

FIG. 10 is an enlarged top view of part of a semiconductor device according to a third embodiment of the disclosure.

FIG. 11 is a schematic top view of a wiring disposed in a column direction with respect to an aperture.

FIG. 12 is a schematic top view of a wiring disposed in an oblique direction with respect to the aperture.

FIG. 13 is a graph that summarizes calculation results of an acceptable positional deviation quantity in the disposition illustrated in each of FIG. 11 and FIG. 12.

FIG. 14 is a graph that summarizes calculation results of exposure area of the wiring inside the aperture in the disposition illustrated in each of FIG. 11 and FIG. 12.

FIG. 15 is an enlarged top view of part of a semiconductor device according to a fourth embodiment of the disclosure.

FIG. 16 is an enlarged top view of part of a semiconductor device according to a modification example 1-1.

FIG. 17 is a top view that illustrates a case with an aperture having a rectangular planar shape.

FIG. 18 is an enlarged top view of part of a semiconductor device according to a modification example 1-2.

FIG. 19 is an enlarged top view of part of a semiconductor device according to a modification example 1-3.

FIG. 20 is a cross-sectional view taken along a line XX-XX of FIG. 19.

FIG. 21 is an enlarged top view of part of a semiconductor device according to a modification example 1-4.

FIG. 22 is an enlarged top view of part of a semiconductor device according to a modification example 1-5.

FIG. 23 is an enlarged cross-sectional view of part of a semiconductor device according to a fifth embodiment of the disclosure.

FIG. 24 is a schematic top view of an overall configuration of a semiconductor device according to a sixth embodiment of the disclosure.

FIG. 25 is a schematic cross-sectional view of an overall configuration of the semiconductor device illustrated in FIG. 24.

FIG. 26 is a schematic cross-sectional view of an overall configuration of a semiconductor device according to a seventh embodiment of the disclosure.

FIG. 27 is a schematic cross-sectional view of an overall configuration of a semiconductor device according to a modification example 7-1.

FIG. 28 is a schematic cross-sectional view of an overall configuration of a semiconductor device according to a modification example 7-2.

FIG. 29 is a cross-sectional view that illustrates a method of manufacturing a semiconductor device according to an eighth embodiment of the disclosure in the order of procedure, and is a cross-sectional view that illustrates a method of manufacturing a solder-including electrode in the order of procedure.

FIG. 30 is a cross-sectional view of a process following FIG. 29.

FIG. 31 is a cross-sectional view of a process following FIG. 30.

FIG. 32 is a cross-sectional view of a process following FIG. 31.

FIG. 33 is a cross-sectional view of a process following FIG. 32.

FIG. 34 is a cross-sectional view of a process following FIG. 33.

FIG. 35 is a cross-sectional view of a process following FIG. 34.

FIG. 36 is a cross-sectional view of a process following FIG. 35.

FIG. 37 is a cross-sectional view that illustrates a method of manufacturing a semiconductor device according to a ninth embodiment of the disclosure in the order of procedure, and is a cross-sectional view that illustrates a method of connecting a packaging substrate to a semiconductor chip in the order of procedure.

FIG. 38 is a cross-sectional view of a process following FIG. 37.

FIG. 39 is a cross-sectional view of a process following FIG. 38.

FIG. 40 is a cross-sectional view of a process following FIG. 39.

FIG. 41 is a cross-sectional view that illustrates a method of manufacturing a semiconductor device according to a twelfth embodiment of the disclosure in the order of procedure.

FIG. 42 is a cross-sectional view of a process following FIG. 41.

FIG. 43 is a cross-sectional view of a process following FIG. 42.

DESCRIPTION OF EMBODIMENTS

In the following, some embodiments of the disclosure are described in detail with reference to the drawings. Note that description is made in the following order.

1. First Embodiment (a semiconductor device; an example in which a plurality of first electrodes are connected to one another in an oblique direction by a plurality of first wirings, and a plurality of second electrodes are connected to one another in the oblique direction by a plurality of second wirings. An example in which the plurality of first wirings and the plurality of second wirings each have a polygonal line shape. An example in which a third aperture on each of a plurality of third wirings has a substantially rectangular planar shape, with a length of the third aperture adjusted in accordance with a thermal expansion coefficient of a packaging substrate)

2. Second Embodiment (an example in which each of a plurality of first wirings and a plurality of second wirings is a straight line)

3. Third Embodiment (an example in which a plurality of first apertures and a plurality of second apertures each have a rectangular shape, and a plurality of first wirings and a plurality of second wirings are respectively disposed to traverse obliquely the plurality of first apertures and the plurality of second apertures)

4. Fourth Embodiment (an example in which first apertures and second apertures are disposed at a uniform pitch in both a row direction and a column direction, and each of a plurality of first wirings and a plurality of second wirings is a straight line inclined 45 degrees with respect to the column direction)

5. Modification Example 1-1 (an example in which the third aperture has a planar shape of an ellipse)

6. Modification Example 1-2 (an example in which, inside the third aperture, a wiring includes a widened part)

7. Modification Example 1-3 (an example in which, inside the third aperture, a wiring has a break)

8. Modification Example 1-4 (an example in which two third apertures have oblique notches at their corners, and the two third apertures are adjacently disposed with the oblique notches confronted with each other)

9. Modification Example 1-5 (an example in which two third apertures have oblique notches at their sides, and the two third apertures are adjacently disposed with the oblique notches confronted with each other)

10. Fifth Embodiment (a semiconductor device; an example in which a thickness of a solder resist layer inside a third aperture is smaller than a thickness of the solder resist layer in a region other than the third aperture out of a front surface of a substrate body)

11. Sixth Embodiment (a semiconductor device; an example of an MCM (Multi Chip Module))

12. Seventh Embodiment (a semiconductor device; an example of sealing with a mold resin)

13. Eighth Embodiment (a method of manufacturing a semiconductor device; an example that involves temporarily bonding with use of flux, and thereafter, performing a batch reflow process)

14. Ninth Embodiment (a method of manufacturing a semiconductor device; an example of local reflow)

15. Tenth Embodiment (a method of manufacturing a semiconductor device; an example of temporarily bonding by thermocompression)

16. Eleventh Embodiment (a method of manufacturing a semiconductor device; an example of thermocompression, with a temperature on tool side fixed)

17. Twelfth Embodiment (a method of manufacturing a semiconductor device; an example in which an underfill resin is supplied in advance on a packaging substrate)

First Embodiment

FIG. 1 schematically illustrates an overall configuration of a semiconductor device according to a first embodiment of the disclosure. FIG. 2 schematically illustrates a cross-sectional configuration of the semiconductor device, taken along a line II-II. A semiconductor device 1 may be, for example, a flip chip semiconductor device in which a semiconductor chip 10 and a packaging substrate 20 may be connected by a plurality of solder-including electrodes 130. An underfill resin 40 may be provided between the semiconductor chip 10 and the packaging substrate 20.

Referring to FIG. 2, the semiconductor chip 10 includes a chip body 11 that may be made of, for example, silicon (Si). An element (undepicted) may be provided on one surface (an element-formation surface) of the chip body 11.

The semiconductor chip 10 may be mounted on a chip mounting region 20A in a central part of the packaging substrate 20, in a face-down posture in which the element-formation surface 11A of the chip body 11 may be oriented toward the packaging substrate 20. It is to be noted that the top view of FIG. 1 depicts a chip outline 10A of the semiconductor chip 10 in a broken line, with the semiconductor chip 10 and the underfill resin 40 omitted.

The plurality of solder-including electrodes 130 are provided on the element-formation surface 11A of the chip body 11, as illustrated in FIG. 2. The plurality of solder-including electrodes 130 may be provided, for example, in a central part and a peripheral part of the element-formation surface 11A of the chip body 11 of the semiconductor chip 10, at predetermined intervals and in a predetermined arrangement.

Referring to FIGS. 1 and 2, the packaging substrate 20 includes a substrate body 21, for example. As illustrated in FIG. 1, the chip mounting region 20A and a plurality of wirings 150 may be provided in a front surface (a semiconductor chip mounting surface) 21A of the substrate body 21. A via 22 may be provided on one end of each of the plurality of wirings 150. As illustrated in FIG. 2, a solder ball 23 may be provided on a rear surface 21B of the substrate body 21. It is to be noted that the plurality of wirings 150 are omitted in the cross-sectional view of FIG. 2.

The substrate body 21 may have a stacked structure including, for example, a resin substrate (undepicted), a wiring layer made of, for example, copper (Co), and a solder resist layer (undepicted), but there is no particular limitation on its configurations.

The plurality of wirings 150 may include, for example, a plurality of first wirings 151, a plurality of second wirings 152, and a plurality of third wirings 153.

The plurality of first wirings 151 and the plurality of second wirings 152 may perform power supply to the semiconductor chip 10, and be disposed side by side in an oblique direction inside the chip mounting region 20A, for example.

The plurality of third wirings 153 may perform signal input into and output from the semiconductor chip 10, and may be extended outward of the substrate body 21 from a peripheral part of the chip mounting region 20A, for example. The plurality of third wirings 153 may be disposed in parallel with one another at each side of the chip mounting region 20A, and expanded in a radial pattern in an outer region of the substrate body 21. It is to be noted that the plurality of third wirings 153 may be extended inward of the substrate body 21 from the peripheral part of the chip mounting region 20A.

The via 22 may be provided between the one end (both ends of the first wiring 151, both ends of the second wiring 152, and one end (a first end) of the third wiring 153) of each of the plurality of wirings 150 and the solder ball 23, and penetrate the substrate body 21 of the packaging substrate 20. The via 22 may transfer each terminal from the front surface (the semiconductor chip mounting surface) 21A of the packaging substrate 20 to the rear surface 21B (toward the solder ball 23). Each terminal may be extended from the semiconductor chip 10, with use of the plurality of solder-including electrodes 130 and the plurality of wirings 150. In this embodiment, a size of the via 22 formed on the packaging substrate 20 may be larger than a size of each of the plurality of solder-including electrodes 130. For this reason, in one example, regarding the third wiring 153, as illustrated in FIG. 1, each terminal may be extended from the semiconductor chip 10 with use of the plurality of solder-including electrodes 130, and extracted to a peripheral part of the substrate body 21 with use of the plurality of third wirings 153, on the packaging substrate 20. This allows for widening of an inter-wiring pitch of the plurality of third wirings 153. Furthermore, each terminal may be extracted toward the solder ball 23 on the packaging substrate 20 with use of the via 22.

The solder ball 23 may perform signal input into and output from the semiconductor chip 10, and perform power supply to the semiconductor chip 10.

The underfill resin 40 may protect bonding parts between the plurality of solder-including electrode 30 and the plurality of wirings 110, and be filled between the semiconductor chip 10 and the packaging substrate 20. In one preferred example, fillers may be dispersed in the underfill resin 40, in order to adjust a thermal expansion coefficient. As the fillers, for example, silicon oxide in a spherical shape may be used. In one desired example, the thermal expansion coefficient of the underfill resin 40 may be adjusted to, for example, approximately 10 ppm/° C. to 50 ppm/° C. both inclusive.

FIG. 3 illustrates, in an enlarged manner, part of the semiconductor device 1 illustrated in FIG. 1. Specifically, FIG. 3 illustrates a plan configuration of the three first wirings 151 and the three second wirings 152 in the chip mounting region 20A. It is to be noted that the semiconductor chip 10 and the underfill resin 40 are omitted in the top view of FIG. 3 for an easier understanding.

FIG. 4 illustrates, in an enlarged manner, other part of the semiconductor device 1 illustrated in FIG. 1. Specifically, FIG. 4 illustrates a plan configuration of the two adjacent third wirings 153 (153A and 153B) in vicinity of the peripheral part of the chip mounting region 20A. It is to be noted that the semiconductor chip 10 and the underfill resin 40 are omitted in the top view of FIG. 4 for an easier understanding, but the semiconductor chip 10 may be disposed in a region leftward of the chip outline 10A of the semiconductor chip 10 denoted by a broken line.

The packaging substrate 20 may include a solder resist layer 24, as well as the plurality of wirings 150, on the front surface 21A of the substrate body 21. The solder resist layer 24 may be made of, for example, a negative photosensitive permanent resist material.

The solder resist layer 24 is provided as a continuous layer on the front surface 21A of the substrate body 21 and the plurality of wirings 150, and has one or more apertures 160 on each of the plurality of wirings 150. Inside the apertures 160, the plurality of solder-including electrodes 130 and the plurality of wirings 150 may be bonded together, to form connection between the semiconductor chip 10 and the packaging substrate 20. It is to be noted that in FIG. 3, a region in which the solder resist layer 24 is provided is represented by a lightly dotted region.

As described, the solder resist layer 24 is provided as the continuous layer, and has the partial apertures 60. This makes it possible to ensure insulation between the plurality of adjacent wirings 150. Accordingly, even when the wirings 150 are arranged at a small pitch of about 40 μm, it is possible to reduce possibility that the solder-including electrode 130 connected to one of the wirings 150 comes into contact with an adjacent one of the wirings 150. This allows for suppression of occurrence of a short circuit.

Moreover, because the solder resist layer 24 has the partial apertures 160, the solder resist layer 24 is continuous or undivided on the packaging substrate 20. Hence, it is possible to prevent the plurality of wirings 150 from peeling off, and to prevent the solder resist layer 24 from peeling off.

Description is given next of a configuration inside the chip mounting region 20A illustrated in FIG. 3.

The plurality of solder-including electrodes 130 include, for example, a plurality of first electrodes 131 and a plurality of second electrodes 132. The plurality of first electrodes 131 supply a first electric potential (e.g., a power supply electric potential), and the plurality of second electrodes 132 supply a second electric potential (e.g., a ground electric potential) different from the first electric potential. The plurality of first electrodes 131 and the plurality of second electrodes 132 are disposed alternately in both a row direction X and a column direction Y, in the central part of the chip body 11. In other words, the plurality of first electrodes 131 and the plurality of second electrodes 132 may be disposed in a checkered pattern, and the adjacent solder-including electrodes 130 may supply electric potentials different from one another. The plurality of first wirings 151 connect the plurality of first electrodes 131. The plurality of second wirings 152 connect the plurality of second electrodes 132. Hence, in the semiconductor device 1, it is possible to dispose the solder-including electrodes 130 in high density in the central part of the semiconductor chip 10, and to perform appropriate power supply to the semiconductor chip 10.

To be more specific, the size of the via 22 on the packaging substrate 20 is larger than the size of the solder-including electrode 130. This results in a decrease in the number of the solder-including electrodes 130 allowed to be disposed, in the configuration in which the via 22 is provided for each of the wirings 150. For example, it is well possible to manufacture the solder-including electrodes 130 each having a diameter of 40 μm or less, at a pitch of 80 μm. However, laser vias on a typical packaging substrate may each have a land diameter of about 150 μm, and a via pitch may be 180 μm or more. Furthermore, when a drill via is used to reduce costs of the packaging substrate 20, the land diameter may be about 250 μm, and the via pitch may be about 500 μm. Thus, providing the via 22 for each of the wirings 150 may lead to reduction in the number of the solder-including electrodes 130. This may cause possibility of, for example, shortage of power supply to an inside of the semiconductor chip 10, and design limitation to the semiconductor chip 10.

In this embodiment, the plurality of first wirings 151 connect the plurality of first electrodes 131, and the plurality of second wirings 152 connect the plurality of second electrodes 132. In this way, connecting the plurality of first electrodes 131 (or the plurality of second electrodes 132) supplying the same electric potentials with the plurality of first wirings 151 (or the plurality of second wirings 152) makes it possible to reduce the number of the vias 22 on the packaging substrate 20, as far as design limitation on a supply voltage of the semiconductor chip 10 permits, unlike the case where the via 22 is provided for each of the wirings 150. It is, therefore, also possible to suppress increases in manufacturing costs and inspection costs of the packaging substrate 20.

Moreover, it is possible to increase the number of the solder-including electrodes 130 allowed to be disposed, and thus it is possible to alleviate limitation on wiring design of the inside of the semiconductor chip 10. To be more specific, a voltage drop may occur because of large wiring resistance from the solder-including electrode 130 to a transistor in the semiconductor chip 10. But increasing the number per unit area of the solder-including electrodes 130 performing power supply to the semiconductor chip 10 makes it possible to suppress an increase in resistance in the semiconductor chip 10. This may be because the wiring 150 on the packaging substrate 20 has cross-sectional area tens to hundreds of times larger than that of the wiring in the semiconductor chip 10, and thus has considerably low wiring resistance.

Furthermore, increasing the number of the solder-including electrodes 130 leads to reduction in an amount of current flowing through each of the solder-including electrodes 130. This makes it possible to suppress an electromigration phenomenon and thus to maintain reliability. In particular, this may be suitable for a case with miniaturization of the solder-including electrode 130, in order to provide a highly densified arrangement of the third wirings 153 in the peripheral part of the packaging substrate 20 illustrated in FIG. 1.

It is to be noted that increasing the number of the solder-including electrodes 130 may lead to possibility that the short circuit may easily occur. But the solder resist layer 24 has the separate apertures 160, so as to avoid allowing part other than the bonding parts between the solder-including electrodes 130 and the wirings 150 to be exposed. This makes it possible to prevent disadvantages in terms of reliability, such as an inter-wiring short circuit that may occur in manufacture, and inter-wiring ion migration.

In addition, wirings used in upper layers in the semiconductor chip 10 may be generally directed in 90-degree-rotated relation between layers. It is therefore easy to make adjustment for the alternate arrangement of the plurality of first electrodes 131 and the plurality of the second electrodes 132 in both the row direction X and the column direction Y. This makes it possible to supply the power supply electric potential and the ground electric potential alternately for both the row direction X and the column direction Y, allowing for more uniform power supply.

In one preferred example, the plurality of first wirings 151 may connect the plurality of first electrodes 131 in an oblique direction DS, with respect to the row direction X and the column direction Y, as illustrated in, for example, FIG. 3. Similarly, in one preferred example, the plurality of second wirings 152 may connect the plurality of second electrodes 132 in the oblique direction DS, in parallel with the plurality of first wirings 151.

The apertures 160 may include a plurality of first apertures 161 and a plurality of second apertures 162, as illustrated in, for example, FIG. 3. The plurality of first apertures 161 may be provided on each of the plurality of first wirings 151. The plurality of first electrodes 131 may be connected to the plurality of first wirings 151 through the plurality of first apertures 161. Similarly, the plurality of second apertures 162 may be provided on each of the plurality of second wirings 152. The plurality of second electrodes 132 may be connected to the plurality of second wirings 152 through the plurality of second apertures 162.

The plurality of first wirings 151 may have a polygonal line shape, and include a vertical line part 151A and an oblique line part 151B, as illustrated in, for example, FIG. 3. The vertical line part 151A may intersect each of the plurality of first apertures 161 in the column direction Y. The oblique line part 151B may connect the vertical line parts 151A in the oblique direction DS. Similarly, the plurality of second wirings 152 may have the polygonal line shape, and include a vertical line part 152A and an oblique line part 152B. The vertical line part 152A may intersect each of the plurality of second apertures 162 in the column direction Y. The oblique line part 152B may connect the vertical line parts 152A in the oblique direction DS.

It is to be noted that the configuration of the plurality of first wirings 151 and the plurality of second wirings 152 is not limited to the example illustrated in FIG. 3. Other examples are described in second to fourth embodiments to be described later.

Following is description of a configuration of the peripheral part of the packaging substrate 20 illustrated in FIG. 4.

The plurality of solder-including electrodes 130 may include, for example, a plurality of third electrodes 133 (133A and 133B). The plurality of third electrodes 133 may perform signal input into and output from the semiconductor chip 10.

The apertures 160 may include a plurality of third apertures 163 (163A and 163B) provided on each of the plurality of third wirings 153. Each of the plurality of third electrodes 133 may be connected to the third wiring 153 inside the third aperture 163 through the third aperture 163.

Each of the plurality of third wirings 153 may have, for example, a constant width W50. The third aperture 163 may be provided, for example, in a rectangular or substantially rectangular shape on another end (a second end) of each of the plurality of third wirings 153.

In one preferred example, as illustrated in FIG. 3, the adjacent third apertures 163 may be arranged at alternatively deviated positions with respect to a lengthwise direction DL of the plurality of third wirings 153 (a so-called staggered arrangement), in order to reduce an inter-wiring pitch P153 between the plurality of third wirings 153.

FIG. 5 illustrates a cross-sectional configuration of the first aperture 161 and the second aperture 162, taken along a line V-V of FIG. 3. FIG. 6 illustrates a cross-sectional configuration of the third aperture 163, taken along a line VI-VI of FIG. 4.

The aperture 160 may allow an upper surface 53 and all in a heightwise direction of side surfaces 54 of the wiring 150 inside the aperture 160 to be exposed, for example. Each of the plurality of solder-including electrodes 130 may cover an exposed part of the wiring 150 inside the aperture 160 (the part exposed in the aperture 160, out of the upper surface 53 and the side surfaces 54 of the wirings 150). In other words, the aperture 160 may be provided to allow the upper surface 53 and the side surfaces 54 of the wiring 150 inside the aperture 160 to be exposed. An aperture end 61 of the aperture 160 may be positioned outward of the side surfaces 54 of the wiring 150 inside the aperture 160. A diameter d of the solder-including electrode 130 may be larger than the width W50 of the wiring 150. The solder-including electrode 130 may be connected to the wiring 150, so as to envelope or surround the wiring 150.

In this way, area of connection between the solder-including electrode 130 and the wiring 150 may be enlarged, making it possible to form the bonding part between the solder-including electrode 130 and the wiring 150, not in a two-dimensional shape but in a three-dimensional shape. Consequently, it is possible to suppress an intermetallic compound generated in the bonding part from being destroyed, even when thermal stress due to the difference in the thermal expansion coefficients of the semiconductor chip 10 and the packaging substrate 20 is applied to the bonding part. The thermal stress may be caused by heating in mounting of the semiconductor chip 10, a reflow process in mounting in an assembly line, or heat generation during device operation. Hence, it is possible to enhance reliability.

In one preferred example, each of the plurality of solder-including electrodes 130 may include, for example, a columnar metal layer 31 and a solder layer 32, in the order named from side on which the chip body 11 is disposed. In one preferred example, the columnar metal layer 31 may be made of a metal having a higher melting point than a melting point of solder that constitutes the solder layer 32. This allows for limited use of the solder material to a tip part of the solder-including electrode 130, as compared to solder bump connection as used in the existing C4 technique. Accordingly, the diameter d of the solder-including electrode 130 may be substantially limited to a diameter of the columnar metal layer 31, even when the solder melts into a spherical shape due to surface tension. It is therefore possible to reduce an inter-electrode pitch of the plurality of solder-including electrodes 130.

In one preferred example, the columnar metal layer 31 may be made of copper (Cu), or include a stacked film of copper (Cu) and nickel (Ni), for example. The solder layer 32 may be made of, for example, tin (Sn) or Sn—Ag.

The columnar metal layer 31 including copper makes it possible to enhance heat dissipation of the semiconductor device 1 even more, since copper has optimal thermal conductivity. Moreover, copper and the solder material form an alloy having an optimal strength. This makes it possible to provide an electrode structure having more optimal connection strength.

With the solder layer 32 made of tin or Sn—Ag, copper may disperse inside the solder layer 32 when the columnar metal layer 31 includes copper. An Sn—Cu alloy may be formed when the solder layer 32 is made of tin, while an Sn—Ag—Cu alloy may be formed when the solder layer 32 is made of Sn—Ag. These are known to have stable and optimal mechanical characteristics as solder materials, and make it possible to provide a connection structure having more optimal strength and more optimal reliability.

In one preferred alternative example, the columnar metal layer 31 may be made of copper (Cu), or include a stacked film of copper (Cu) and nickel (Ni), for example. The solder layer 32 may be made of, for example, indium (In) or In—Ag. In this case, the description given above may apply to the columnar metal layer 31. Moreover, the solder layer 32 made of indium or In—Ag allows for lowering of the melting point. This makes it possible to reduce thermal stress generated during an assembly process, and to provide a structure having a more optimal yield and more optimal reliability.

In one preferred example, a height H31 of the columnar metal layer 31 may be larger than a height H32 of the solder layer 32. This makes it possible to increase a gap G between the semiconductor chip 10 and the packaging substrate 20, in spite of a decrease in an amount of the solder, by the height H31 of the columnar metal layer 31. It is therefore possible to form the plurality of solder-including electrodes 30 at the narrower pitch, while allowing for easier injection of the underfill resin 40.

In one preferred example, the aperture 160 may be filled with the solder layer 32. If a minute aperture that is not filled with the solder should remain inside the aperture 160, it is difficult to fill the minute aperture with the underfill resin 40 in post-processes, leading to possibility that the minute aperture may become a void. In this case, there may be possibility that air inside the void may expand to cause a bonding failure in a ball attachment or in a reflow process in secondary mounting, or possibility that the molten solder may flow along the void to cause the short circuit between the adjacent wirings 150. Filling the aperture 160 with the solder layer 32 makes it possible to suppress the occurrence of the void, or the bonding failure or the short circuit due to the void, and to prevent the yield or the reliability from being lowered.

In one preferred example, a volume of the solder layer 32 may be larger than a volume of the aperture 160. This makes it possible to surely fill the aperture 160 with the solder layer 32. Moreover, with the volume of the solder layer 32 larger than the volume of the aperture 160, it is possible to provide a sufficient amount of the solder, and to allow the bonding part between the solder-including electrode 130 and the wiring 150 to have an optimal shape. Accordingly, the bonding part between the solder-including electrode 130 and the wiring 150 may be kept from having a distorted shape, or from having a partly constricted shape. Hence, it is possible to avoid concentration of stress to the solder layer 32, leading to higher mechanical strength of the bonding part.

A pad 13 made of aluminum (Al) may be provided on the element-formation surface 11A of the chip body 11 of the semiconductor chip 10. The columnar metal layer 31 may be electrically connected to the pad 13 through a conductive thin film and a barrier film in the order named from side on which the columnar metal layer 31 is disposed, but the conductive thin film and the barrier film are omitted in FIGS. 5 and 6. For example, copper (Cu) as the conductive thin film, and for example, TiW as the barrier film may be formed by sputtering. A passivation film 14 may cover a region other than a region in which the pad 13 is provided, out of the element-formation surface 11A of the chip body 11 of the semiconductor chip 10. It is to be noted that not only the pad 13 and the passivation film 14 but also layers such as wiring layers and diffusion layers may be formed in the semiconductor chip 10, but the layers such as the wiring layers and the diffusion layers are omitted in FIGS. 5 and 6.

The plurality of wirings 150 may be wirings on an outermost layer of the packaging substrate 20. It is to be noted that FIGS. 5 and 6 depict a single-layer structure of an insulating layer 21C provided directly under the plurality of wirings 150, as the substrate body 21 of the packaging substrate 20. However, the substrate body 21 may be a stacked structure including a layer or layers other than the insulating layer 21C.

In one preferred example, each of the plurality of wirings 150 may include a metal wiring layer 51 and a surface coating 52. The metal wiring layer 51 may be made of copper (Cu) as a principal component. The surface coating 52 may cover a region exposed in the aperture 160, out of a surface of the metal wiring layer 51. Providing the surface coating 52 contributes to enhanced solder wettability, and promotes wetting and spreading of the solder over the surface of the metal wiring layer 51. This results in easier wetting and spreading of the solder over the whole exposed region of the wiring 150 inside the aperture 160, when the aperture 160 has a planar shape elongated in the lengthwise direction DL of the wiring 150 inside the aperture 160 as described later. It is therefore possible to more surely encourage an effect of enhancing the bonding strength.

In one preferred example, the surface coating 52 may include, for example, an Ni—Au plating layer or an Ni—Pd—Au plating layer. Because nickel of the surface coating 52 and the solder layer 32 may form an alloy layer, the wiring 150 may be prevented from excessively forming an alloy layer with the solder, being thinned by the solder, and being dissipated and disconnected. The solder may be prevented from intruding into between the wiring 150 and the insulating layer 21C of the packaging substrate 20, causing lower adhesion strength of the wiring 150, and causing the wiring 150 to peel off and to be disconnected. Moreover, the solder layer 32 may react with gold of the surface coating 52, to improve wettability and to allow for prevention of a failure in bonding to the wiring 150. Also, wetting and spreading of the solder along the exposed wiring 150 makes it possible to steadily increase area of the bonding part between the solder-including electrode 130 and the wiring 150. In particular, adoption of non-electrolytic plating makes it possible to suppress variations in thickness of the surface coating 52, and to provide a structure having higher reliability of the bonding part.

FIG. 7 illustrates a cross-sectional configuration of the third aperture 163, taken along a line VII-VII of FIG. 4. As illustrated in FIGS. 4 and 7, the third aperture 163 may have the planar shape elongated in the lengthwise direction DL of the third wiring 153 inside the third aperture 163. A length L of the third aperture 163 may be adjusted in accordance with a thermal expansion coefficient of the packaging substrate 20. Hence, it is possible to alleviate influence of positional deviation between the third aperture 163 and the third electrode 133, and to suppress the short circuit between the adjacent third wirings 153.

Possible effects obtained by the third aperture 163 elongated in the lengthwise direction DL of the third wiring 153 inside the third aperture 163 as described may be as follows. In order to connect the solder-including electrode 130 to the wiring 150, heating may be carried out to melt the solder. At this occasion, the aperture 160 of the solder resist layer 24 and the solder-including electrode 130 on the semiconductor chip 10 may be deviated from setting values, i.e., their relative positions at room temperature, because of the difference between the thermal expansion coefficients of the semiconductor chip 10 and the packaging substrate 20 including the wiring 150 and the insulating layer 21C. Because the thermal expansion coefficient of the packaging substrate 20 is generally larger than the thermal expansion coefficient of the semiconductor chip 10, there may be the positional deviation as illustrated in FIG. 8 at a temperature at which the solder melts.

In this embodiment, the third aperture 163 may have the planar shape elongated in the lengthwise direction DL of the third wiring 153 inside the third aperture 163. The length L of the third aperture 163 may be adjusted in accordance with the thermal expansion coefficient of the packaging substrate 20. This makes it possible to suppress the solder layer 32 from running on the solder resist layer 24 as illustrated in FIG. 8 to cause occurrence of the short circuit with the adjacent third electrode 133. Moreover, the plurality of third wirings 153 may be arranged to be extended outward of the substrate body 21 from the peripheral part of the chip mounting region 20A, as illustrated in FIG. 1, so as to widen the inter-wiring pitch of the plurality of third wirings 153 to the pitch of the vias 22. This arrangement of the plurality of third wirings 153 may be combined with the third aperture 163 elongated along the lengthwise direction DL of the third wiring 153 inside the third aperture 163, to produce the effects of the suppression of the short circuit as described.

Furthermore, enlarging the third aperture 163 selectively along a specific direction, i.e., selectively along the lengthwise direction DL of the third wiring 153 inside the third aperture 163 makes it possible to provide a structure adapted to the positional deviation in heating, while maintaining the effects of the suppression of the short circuit without widening the pitch of the plurality of third wirings 153.

In addition, it is possible to increase area of a region in which the solder layer 32 and the wiring 150 form an alloy layer. This leads to higher bonding strength, and enhancement in the yield and the reliability.

It is to be noted that in FIGS. 6 and 7, the width W50 of each of the wirings 150 (the third wirings 153) may be, for example, 15 μm. The inter-wiring pitch P50 between the wirings 150 (the third wirings 153) may be, for example, 40

µm. The height H50 of the wirings 150 (the third wirings 153) may be, for example, 15 µm. The width W of the third aperture 163 may be, for example, 40 µm, while the length L of the third aperture 163 may be, for example, 60 µm. The height H31 of the columnar metal layer 31 may be, for example, 40 µm. The columnar metal layer 31 may have a shape of, for example, a circular column, and the diameter d may be, for example, 40 µm. The height H32 of the solder layer 32 may be, for example, 18 µm. The gap G between the semiconductor chip 10 and the packaging substrate 20 (a distance from the passivation layer 13 of the semiconductor chip 10 to the solder resist layer 24 of the packaging substrate 20) may be, for example, at least 40 µm or more.

In one preferred example, the length L of the third aperture 163 may satisfy, for example, the following Expression 1.

$$L > (a-3.5)*D*(T-25)*10^{-6} + d \qquad \text{Expression 1}$$

(In Expression 1, L denotes the length (mm) of the third aperture 163, a denotes an equivalent thermal expansion coefficient (ppm/° C.) of the packaging substrate 20, D denotes a distance (mm) from a center of the packaging substrate 20 to a center of the third aperture 163, T denotes a melting point (° C.) of the solder, and d denotes the diameter of the solder-including electrode 30.)

In the following, description is given on more details of Expression 1.

It is known that the thermal expansion coefficient of the packaging substrate 20 may be roughly substituted by the equivalent thermal expansion coefficient a that may be defined by the following Expression 2 (reference: "Thermophysical Properties Handbook", Japan Society of Thermophysical Properties, 1990, pp. 285-289).

$$a = \Sigma(\text{thickness}*\text{elastic modulus}*\text{CTE})/\Sigma(\text{thickness}*\text{elastic modulus}) \qquad \text{Expression 2}$$

Here, "Σ" denotes summing of values regarding all materials that constitute the packaging substrate 20. CTE is a thermal expansion coefficient of each material. When the solder that constitutes the solder layer 32 is Sn—Ag, the melting point is 221° C. Whatever bonding process is used, at least the packaging substrate 20 is heated to a temperature near the melting point of the solder. Accordingly, an amount of the positional deviation ΔL from a room-temperature state between the packaging substrate 20 and the solder layer 32 may be defined by the following Expression 3, with the room temperature assumed to be 25° C.

$$\Delta L = (a-3.5)*(221-25)*10^{-6}*D \qquad \text{Expression 3}$$

Here, "D" denotes the distance from the center of the packaging substrate 20 to the bonding part (the center of the third aperture 163). 3.5 is a thermal expansion coefficient of silicon (Si) that is a principal constituent material of the semiconductor chip 10. Accordingly, the length L of the third aperture 163 may be at least a value equal to or larger than as given by the following Expression 4. This makes it possible to allow most of the solder to go into the third aperture 163 even when the solder is heated in solder bonding.

$$L > (a-3.5)*(221-25)*D*10^{-6} + d \qquad \text{Expression 4}$$

Here, "d" denotes the diameter of each of the plurality of solder-including electrodes 130, i.e., the diameter of the columnar metal layer 31. In a desirable example, a maximum of the length L of the third aperture 163 may be adjusted so as to allow the third aperture 163 to be filled with the solder layer 32 as described above, in consideration of a volume of plating of the solder layer 32, the width W of the third aperture 163, and the width W50 of the third wiring 153.

For example, let us calculate the length L of the third aperture 163 on an assumption that the packaging substrate 20 is manufactured with a configuration as summarized in Table 1.

TABLE 1

|  | Material used | Thickness (µm) | Elastic modulus (GPa) | CTE (ppm) |
| --- | --- | --- | --- | --- |
| Solder resist | AUS703 | 20 | 9 | 23 |
| L1: Wiring layer | Cu | 15 | 120 | 16 |
| Insulating layer | GX92 | 35 | 5 | 39 |
| L2: Cu wiring layer | Cu | 25 | 120 | 16 |
| Core insulating layer | E700GR | 800 | 33 | 8 |
| L3: Cu wiring layer | Cu | 25 | 120 | 16 |
| Insulating layer | GX92 | 35 | 5 | 39 |
| L4: Cu wiring layer | Cu | 15 | 120 | 16 |
| Solder resist | AUS703 | 20 | 9 | 23 |

The packaging substrate may be a build-up four-layer substrate, and include an epoxy material including glass cloth (Hitachi Chemical Company, Ltd.: 700GR) as a core material, an ABF film material (Ajinomoto Fine-Techno Co., Inc.: GX92) as a build-up material, a solder resist (Taiyo Ink Mfg. Co. Ltd.: AUS703), and wiring layers made of copper. A thickness of the core material may be 800 µm. A thickness of the build-up layer may be 35 µm. A solder resist thickness may be 20 µm. A thickness of a wiring layer as a surface layer may be 15 µm. A thickness of the wiring layer as a core layer may be 25 µm. An elastic modulus and a thermal expansion coefficient (CTE) of each material may be as summarized in Table 1. Regarding a position at which the columnar metal layer 31 is disposed, D may be equal to approximately 7.06 mm (D=approximately 7.06 mm), when considering angles (corners) at which thermal expansion becomes largest, on an assumption that, for example, the pads 13 are arranged in an area of 10 mm□. The pads 13 may serve as I/O pads of the semiconductor chip 10.

With use of these parameters, the equivalent thermal expansion coefficient a may be given by Expression 2 as approximately 10.5 ppm/° C. Assume that a temperature applied in a process of connecting the semiconductor chip 10 to the plurality of wirings 150 with use of the solder layer 32 is 221 degrees, i.e., the melting point of the Sn—Ag based solder. As a result, a maximum of the amount of the positional deviation ΔL given by Expression 3 may be 9.75 µm. Here, in one desirable example, from Expression 4, the length L of the third aperture 163 may be at least 49.75 µm or more, because the diameter d of the columnar metal layer 31 is 40 µm. Thus, the length L of the third aperture 163 may be designed to be, for example, 55 µm.

The volume of the third aperture 163 may be calculated as 31625 µm³, exclusive of the volume occupied by the third wiring 153. Accordingly, when the third electrode 133 is designed to allow the volume of the solder layer 32 to be larger than this value, the thickness of plating of the solder layer 32 may be 25.2 µm or more. Because there are variations in an actual thickness of plating, the design of the third electrode 133 may be carried out in consideration of the variations.

It is to be noted that the thickness of plating of the solder layer 32 may be reduced, as described later in a fifth embodiment, by stopping development halfway before the solder resist layer 24 is removed to allow the insulating layer 21C of the packaging substrate 20 to be exposed.

A method of manufacturing the semiconductor device 1 is described in eighth to twelfth embodiments.

In the semiconductor device 1, the third aperture 163 of the solder resist layer 24 may have the planar shape elongated in the lengthwise direction DL of the third wiring 153 inside the third aperture 163. The length L of the third aperture 163 may be adjusted in accordance with the thermal expansion coefficient of the packaging substrate 20. Accordingly, in heating for the solder bonding during the assembly process, there is little possibility that the solder layer 32 may run on the solder resist layer 24 even in a case with the positional deviation between the third aperture 163 and the third wiring 153 due to the difference in the thermal expansion coefficients of the semiconductor chip 10 and the packaging substrate 20. Thus, influence of the positional deviation between the third aperture 163 and the third electrode 133 is alleviated, leading to the suppression of the short circuit between the adjacent third wirings 153.

As described, in this embodiment, the plurality of solder-including electrodes 130 include the plurality of first electrodes 131 and the plurality of second electrodes 132. The plurality of first electrodes 131 supply the first electric potential, and the plurality of second electrodes 132 supply the second electric potential different from the first electric potential. The plurality of first electrodes 131 and the plurality of second electrodes 132 are disposed alternately in both the row direction X and the column direction Y, in the central part of the chip body 10. The plurality of wirings 150 include the plurality of first wirings 151 and the plurality of second wirings 152. The plurality of first wirings 151 connect the plurality of first electrodes 131, and the plurality of second wirings 152 connect the plurality of second electrodes 132. Hence, it is possible to dispose the solder-including electrodes 130 in high density in the central part of the semiconductor chip 10, and to perform appropriate power supply to the semiconductor chip 10. In particular, it is possible to improve the power supply in the semiconductor chip 10 of a larger size, and to provide the flip chip semiconductor device 1 having higher reliability.

Moreover, it is possible to design the plurality of solder-including electrodes 130 on the semiconductor chip 10, i.e., the plurality of first electrodes 131 and the plurality of second electrodes 132, all having a same size. This makes it possible to suppress variations in shape and therefore to enhance easiness of assembling.

Furthermore, the plurality of first electrodes 131 and the plurality of second electrodes 132 are disposed alternately in both the row direction X and the column direction Y (in the checkered arrangement), in the central part of the chip body 10. This allows for easier power supply design.

In addition, the solder resist layer 24 is provided as the continuous layer on the front surface of the substrate body 21 and the plurality of wirings 150, and has the partial aperture 160 on each of the plurality of wirings 50. Hence, it is possible to prevent the solder resist layer 24 from peeling off from the plurality of wirings 150, so as not to lose a function of the suppression of the short circuit or a function of wiring protection.

Furthermore, the solder resist layer 24 is provided as the continuous layer. This allows the solder resist layer 24 to be interposed between the bonding part of the solder-including electrode 130 and the adjacent wiring 150, and the adjacent wiring 150. It is therefore possible to suppress the short circuit even when the inter-wiring pitch P50 is reduced. Hence, it is possible to reduce the inter-wiring pitch P50, and to provide a more highly densified connection structure between the semiconductor chip 10 and the packaging substrate 20. As a result, it is possible to provide, at lower costs, a flip chip structure adapted to higher functionalization of the semiconductor chip 10 or widening of a band of an interface.

In addition, the solder resist layer 24 is provided as the continuous layer. This makes it possible to prevent the solder from excessively wetting and spreading along the wiring 150, causing shortage of the volume of the solder, causing the distorted shape of the bonding part of the solder-including electrode 130 and the wiring 150, and causing lowered mechanical strength.

Furthermore, in this embodiment, the plurality of wirings 150 may be extended outward of the substrate body 21 from the peripheral part of the chip mounting region 20A, and disposed in parallel with one another at each side of the chip mounting region 20A. Hence, it is possible to directly extend the plurality of wirings 150 to an outer part of the packaging substrate 20 from the bonding parts of the solder-including electrodes 130 and the plurality of wirings 150. Also, pre-solder formation may be eliminated. It is also unnecessary to miniaturize the wirings 150 and to form the wirings 150 between lands, or to form wirings to lower layers from lands through vias, as in the existing C4 technique. This makes it possible to remarkably reduce substrate costs.

In addition, the aperture 160 may allow the upper surface 53 and part or all in the heightwise direction of the side surfaces 54 of the wiring 150 inside the aperture 160 to be exposed. This makes it possible to increase the area of the region in which the solder layer 32 and the wiring 150 form the alloy layer. In addition, the alloy layer thus generated may extend not only two-dimensionally as in the existing land-solder connection, but also three-dimensionally including a thicknesswise direction of the wiring 150. This makes it possible to provide a structure having higher bonding strength.

Furthermore, the third aperture 163 of the solder resist layer 24 may have the planar shape elongated in the lengthwise direction DL of the third wiring 153 inside the third aperture 163. The length L of the third aperture 163 may be adjusted in accordance with the thermal expansion coefficient of the packaging substrate 20. Hence, it is possible to alleviate the influence of the positional deviation between the third aperture 163 and the third electrode 133, leading to the suppression of the short circuit between the adjacent third wirings 133. In particular, this embodiment is suitable for a case in which a plurality of functions are synthesized in the single semiconductor chip 10 with an increase in a chip size, or a case in which the diameter d of the solder-including electrode 130 is reduced and the solder-including electrodes 130 are connected to the wirings 150 at a fine pitch.

In addition, the third aperture 163 may have the planar shape elongated in the lengthwise direction DL of the third wiring 153 inside the third aperture 163. This makes it possible to increase the area of the exposed part from the solder resist layer 24, of the third wiring 153 as a connection target, without allowing the surface of the adjacent third wiring 153 to be exposed. As a result, it is possible to enlarge the bonding area between the third electrode 133 and the third wiring 153, and to increase the mechanical strength of the bonding part. In other words, it is possible to suppress destruction due to the thermal stress generated by heating in the bonding process, to improve the mechanical strength against temperature cycles applied in the operation of the semiconductor chip 10, and to provide the flip chip semiconductor device 1 having the high yield or the high reliability.

Furthermore, the length L of the third aperture 163 may be set on the basis of Expression 1. Hence, it is possible to prevent the solder layer 32 from running on the solder resist layer 24 and causing the short circuit between the adjacent third wirings 153, in heating to the temperature near the melting point of the solder in bonding of the solder-including electrode 130 and the wiring 150.

Regarding this, similar effects may be obtained not only during a flip chip bonding process of the semiconductor chip 10 and the packaging substrate 20, but also a post-process of reflow for BGA ball attachment and a heating process in mounting on a mother board on the assembly line. In other words, when the semiconductor device 1 is heated to a temperature equal to or higher than the melting point of the solder, the semiconductor chip 10 and the packaging substrate 20 each may thermally expand. Furthermore, the underfill resin 40 may be heated above a glass transition temperature and soften. Also, the solder layer 32 may melt. Accordingly, there is possibility that the columnar metal layer 31 may protrude from the aperture 160 and be positioned on the solder resist layer 24, with the solder layer 32 melting. Part of the solder layer 32 may move together with the columnar metal layer 31 and run over the solder resist layer 24. This may cause possibility of the short circuit with the adjacent wiring 150. Even if no short circuit is caused, there may be possibility of destruction due to thermal stress, during a cooling process, because of the distorted shape of the bonding part of the solder-including electrode 130 and the wiring 150.

Accordingly, setting the length of the third aperture 163 on the basis of Expression 1 makes it possible to avoid disadvantages as mentioned above that may be derived from the positional deviation of the solder-including electrode 130 caused by the thermal expansion coefficients. Hence, it is possible to provide the structure having the optimal yield and reliability.

It is to be noted that description in the first embodiment is given on a case in which the third aperture 163 of the solder resist layer 24 may have the planar shape elongated in the lengthwise direction DL of the third wiring 153 inside the third aperture 163, and the length L of the third aperture 163 may be adjusted in accordance with the thermal expansion coefficient of the packaging substrate 20. But the first aperture 161 and the second aperture 162 disposed in the central part of the packaging substrate 20 may also have planar shapes respectively elongated in the lengthwise direction DL of the first wiring 151 inside the first aperture 161 and in the lengthwise direction DL of the second wiring 152 inside the second aperture 162, as with the third aperture 163. The length L of each of the first aperture 161 and the second aperture 162 may be adjusted in accordance with the thermal expansion coefficient of the packaging substrate 20. However, in particular, as for the third aperture 163 of the solder resist layer 24 disposed in the peripheral part of the packaging substrate 20, the difference in thermal expansion coefficients of the semiconductor chip 10 and the packaging substrate 20 is large. It is therefore important to consider this large difference, in designing a substrate with more optimal connection reliability.

Second Embodiment

FIG. 9 illustrates, in an enlarged manner, part of a semiconductor device 2 according to the second embodiment of the disclosure. Specifically, FIG. 9 illustrates a plan configuration of the three first wirings 151 and the three second wirings 152 in the chip mounting region 20A. It is to be noted that the semiconductor chip 10 and the underfill resin 40 are omitted in the top view of FIG. 9 for an easier understanding.

In this embodiment, the plurality of first wirings 151 and the plurality of second wirings 152 each may be a straight line in the oblique direction DS. Otherwise, the semiconductor device 2 according to this embodiment may have similar configurations, workings, and effects to those of the semiconductor device 1 according to the foregoing first embodiment. Description is therefore given with corresponding components denoted by same reference characters.

In general, when the wiring 150 made of copper (Cu) is provided on the packaging substrate 20, space between the adjacent wirings 150 is limited. In this embodiment, each of the plurality of first wirings 151 and the plurality of second wirings 152 may be the straight line, and the plurality of first electrodes 131 and the plurality of second electrodes 132 may be linearly connected. This makes it possible to provide a smallest pitch between the solder-including electrodes 130, while keeping a distance d150 between the first wiring 151 and the second wiring 152 constant.

As described above, in this embodiment, each of the plurality of first wirings 151 and the plurality of second wirings 152 may be the straight line. Hence, it is possible to make the distance d150 between the first wiring 151 and the second wiring 152 constant, while disposing the first electrodes 131 and the second electrodes 132 in the checkered pattern. This also makes processing of the wirings 150 easy in manufacturing the packaging substrate 10, which makes it possible to enhance the yield and to increase a width of the wiring 150.

In addition, the plurality of first electrodes 131 and the plurality of second electrodes 132 are disposed alternately in both the row direction X and the column direction Y (the checkered arrangement), in the central part of the chip body 10. This allows for easier power supply design on the semiconductor chip 10 side.

Furthermore, generally, a minimum of the distance d150 between the wirings 150 may be determined on a basis of processing accuracy, in forming the wirings 150 on the packaging substrate 20. Accordingly, allowing each of the first wiring 151 and the second wiring 152 to be the straight line makes it possible to increase the width of the wiring 150, because a distance d130 between the solder-including electrodes 130 is larger than the distance d150 between the wirings 150. The width of the wiring 150 may be increased so as to allow the side surfaces 54 of the exposed wiring 151 to be also covered with the solder layer 32. This makes it possible to provide the flip chip semiconductor device 2 having more optimal strength of the bonding part, while suppressing an IR drop in the wiring 150 on the packaging substrate 20 as much as possible.

Accordingly, flexibility of the power supply to the semiconductor chip 10 is enhanced, allowing for a greater margin of chip design. Moreover, the number of connection vias is reduced, leading to reduction in costs and enhancement in the yield. The connection vias may reinforce the power supply to the packaging substrate, and be provided from an outer layer toward an inner layer of the packaging substrate 20.

In addition, increasing the cross-sectional area of the bonding part also makes it possible to reduce a resistance value and to improve electromigration resistance.

Third Embodiment

FIG. 10 illustrates, in an enlarged manner, part of a semiconductor device 3 according to the third embodiment of the disclosure. Specifically, FIG. 10 illustrates a plan configuration of the three first wirings 151 and the three second wirings 152 in the chip mounting region 20A. It is to be noted that the semiconductor chip 10 and the underfill resin 40 are omitted in the top view of FIG. 10 for an easier understanding.

In this embodiment, each of the first aperture 161 and the second aperture 162 may have a planar shape of a rectangle elongated in one direction (e.g., the column direction Y). The first wiring 151 may be disposed to traverse the first aperture 161 obliquely through two corners opposed in a diagonal direction of the first aperture 161. The second wiring 152 may be disposed to traverse the second aperture 162 obliquely through two corners opposed in a diagonal direction of the second aperture 162.

The solder resist layer 24 may be made of the negative photosensitive material, and an amount of light exposure for curing is large. Accordingly, the aperture 160 may be liable to have the positional deviation. As a result, one of the side surfaces 54 of the wiring 150 may be disposed under the solder resist layer 24. This may hinder the solder layer 32 from reaching the side surfaces 54 on both sides of the wiring 150, thereby lowering the mechanical strength of the bonding part between the solder layer 32 and the wiring 150.

In this embodiment, the first aperture 161 and the second aperture 162 each may have the planar shape similar to a rectangle. The first wiring 151 and the second wiring 152 may be disposed to traverse the first aperture 161 and the second aperture 162, respectively, in the oblique direction. This increases allowance for the positional deviation, so as to allow the side surfaces 54 of the wiring 150 to be exposed, even in a case with the positional deviation of the first aperture 161 and the second aperture 162 in the column direction Y or the row direction X. In addition, disposing the wiring 150 in the oblique direction makes it possible to enlarge exposure area of the wiring 150 even when the shapes of the apertures 160 are same. It is therefore possible to provide higher bonding strength between the solder layer 32 and the wiring 150.

Following is detailed description of this matter. FIG. 11 schematically illustrates the first wiring 151 disposed in the column direction Y with respect to the first aperture 161. FIG. 12 schematically illustrates the first wiring 151 disposed in the oblique direction with respect to the first aperture 161. It is to be noted that the following description may also apply to the second aperture 162 and the second wiring 152, although not illustrated.

Let us consider first a case in which the positional deviation of the first aperture 161 occurs. When the positional deviation occurs in the row direction X, a limit value in the column direction and a limit value in the row direction are respectively defined as Xm and Ym. The limit values Xm and Ym may be values at which the side surfaces 54 on both sides of the first wiring 151 are no longer exposed inside the first aperture 161. The exposure area of the first wiring 151 is defined as S. In a case of FIG. 11, Xm, Ym, and S may be given by the following Expression 5.

$$X_m = \frac{A-C}{2}$$
$$Y_m = \infty$$
$$S = CA$$

Expression 5

(In Expression 5, A denotes a width of the first aperture 161, B denotes a length of the first aperture 161, and C denotes a width of the first wiring 151.)

In contrast, in a case of FIG. 12, Xm, Ym, and S may be given by the following Expression 6.

$$X_m = \frac{2AB - C\sqrt{A^2+B^2}}{2B}$$
$$Y_m = \frac{2AB - C\sqrt{A^2+B^2}}{2A}$$
$$S = C\sqrt{A^2+B^2} - \frac{(A^2+B^2)C^2}{4AB}$$

Expression 6

(In Expression 6, A denotes the width of the first aperture 161, B denotes the length of the first aperture 161, and C denotes the width of the first wiring 151.)

FIG. 13 summarizes calculation results based on the expressions with typical numerical values inputted. To be more specific, FIG. 13 summarizes the calculation results of an acceptable positional deviation quantity Xm, on an assumption that the width A and the length B of the first aperture 161 are 40 μm and 60 μm, respectively. The acceptable positional deviation quantity Xm may be a value that is acceptable for a purpose of allowing the side surfaces 54 on both sides of the first wiring 151 to be exposed inside the first aperture 161 of the solder resist layer 24, to form the bonding part of the three-dimensional shape.

As seen from FIG. 13, the acceptable positional deviation quantity Xm greatly increases in the disposition illustrated in FIG. 12. In general, accuracy of the positional deviation of the first aperture 161 may be managed with specifications of about 12 μm. Accordingly, in one desirable example, the disposition illustrated in FIG. 12 may be used when a wiring having a width larger than 15 μm is adopted regarding the width C of the first wiring 151. In particular, in the connection of the first electrodes 131 that supply the power supply electric potential and the second electrodes 132 that supply the ground electric potential, it is possible to reduce the IR drop (a voltage drop due to a resistance component of a wiring), by increasing the width C of each of the first wiring 151 and the second wiring 152, and decreasing the resistance value per unit length.

FIG. 14 summarizes calculation results of the exposure area S of the first wiring 15 inside the first aperture 161, in the disposition illustrated in each of FIGS. 11 and 12. An increase in the exposure area S by disposing the first wiring 151 in the oblique direction as illustrated in FIG. 12 is small. However, since the allowance for the positional deviation increases as described above, it is possible to adopt the first wiring 151 having a larger width. In one desirable example, considering resolution of the solder resist, the first wiring 151 having a width of 15 μm may be adopted in the disposition of FIG. 11, when the width A of the first aperture 161 is 40 μm. In contrast, in the disposition of FIG. 12, it is possible to form the first wiring 151 having a width of 25 μm, and the exposure area S of the first wiring 151 at this occasion is about 1.7 times larger. In other words, increasing the width C of the first wiring 151 makes it possible to provide larger bonding area with the solder layer 32. It is therefore possible to provide greater bonding strength.

As described above, in this embodiment, each of the first aperture 161 and the second aperture 162 may have the planar shape similar to a rectangle. The first wiring 151 and the second wiring 152 may be disposed to traverse the first aperture 161 and the second aperture 162, respectively, in the oblique direction. Hence, it is possible to enlarge the margin for the positional deviation of the first aperture 161 and the second aperture 162, and to enlarge the exposure area S of the wiring 150. As a result, it is possible to increase the width C of the wiring 150, as compared to the case where the first wiring 151 and the second wiring 152 are disposed in the vertical direction relative to the first aperture 161 and the second aperture 162, respectively. It is therefore possible to enhance the effects of the forgoing second embodiment even more.

Fourth Embodiment

FIG. 15 illustrates, in an enlarged manner, part of a semiconductor device according to the fourth embodiment of the disclosure. Specifically, FIG. 15 schematically illustrates a plan configuration of the adjacent four apertures, i.e., the first apertures 161 and second apertures 162, in the chip mounting region 20A.

In this embodiment, the first apertures 161 and the second apertures 162 may be disposed at a uniform pitch in both the row direction X and the column direction Y. Each of the first wiring 151 and the second wiring 152 may be disposed in a direction inclined 45 degrees with respect to the column direction Y. Hence, it is possible to increase the allowance for the positional deviation of the first aperture 161 and the second aperture 162 even more.

To be more specific, it is possible to maximize the values of both Xm and Ym when A equals to B (A=B), according to the Expression 6 described with reference to FIG. 12. That is, regardless of the sizes of the first aperture 161 and the second aperture 162, the first apertures 161 and the second apertures 162 may be disposed at a uniform pitch in the row direction X and the column direction Y, and each of the first wiring 151 and the second wiring 152 may be disposed in the oblique direction inclined 45 degrees. This makes it possible to provide a larger margin for the positional deviation, and thereby to increase the width C of each of the first wiring 151 and the second wiring 152.

Furthermore, as illustrated in FIG. 15, the first aperture 161 and the second aperture 162 may be enlarged in one direction, e.g., the column direction Y, and each may have the shape similar to the rectangle. The first wiring 151 and the second wiring 152 may be inclined 45 degrees. This makes it possible to provide the larger margin for the positional deviation. With this arrangement, the acceptable positional deviation value Xm in the row direction X becomes a value equal to the width A of the first aperture 161 (Xm=A). The acceptable positional deviation value Ym in the column direction Y may be increased in accordance with the length B of the first aperture 161 to make the value Ym larger than Xm. As a result of the increases in the acceptable positional deviation values, it is possible to increase the width C of each of the first wiring 151 and the second wiring 152 in accordance with a margin for exposure and development processes of the solder resist, and thereby to lower the resistance value per unit length, leading to reduction in the IR drop. Moreover, it is possible to increase the bonding area with the solder layer 32, and to provide a connection structure with more optimal bonding reliability.

Typical dimensions may be as follows. The width C of each of the first wiring 151 and the second wiring 152 may be about 15 μm. The width A of each of the first aperture 161 and the second aperture 162 may be about 40 μm. The length B of each of the first aperture 161 and the second aperture 162 may be about 55 μm. The inter-electrode pitch of the first electrode 131 and the second electrode 132 may be about 80 μm, in both the row direction X and the column direction Y. This makes it possible to perform stable production, even considering manufacturing variations of the packaging substrate 20.

It is to be noted that the forgoing description is given on a configuration that aims at reducing the IR drop regarding the first electrode 131 and the second electrode 132 that perform the power supply in the semiconductor chip 10. However, when the size of the semiconductor chip 10 is large, it is expected that in some cases, the IR drop in the first wiring 151 and the second wiring 152 on the packaging substrate 20 side is not negligible. In such a case, a voltage supply path may be reinforced by providing a via (not illustrated) as appropriate, at some midpoint of the first wiring 151 or the second wiring 152. The via may be provided for connection to the inner layer of the packaging substrate 20.

As described above, in this embodiment, the first apertures 161 and the second apertures 162 may be disposed at the uniform pitch in both the row direction X and the column direction Y. Each of the first wiring 151 and the second wiring 152 may be disposed in the oblique direction inclined 45 degrees with respect to the column direction Y. In this case, when each of the first aperture 161 and the second aperture 162 is a square, the positional deviation margin in the row direction X and the positional deviation margin in the column direction Y may be equally maximized. Furthermore, from this state, the first aperture 161 and the second aperture 162 may be enlarged in the row direction X or the column direction Y as the resolution permits. This makes it possible to enlarge the margin for the positional deviation even more, in the direction regarding the enlargement. It is therefore possible to increase the width C of the wiring 150, and thereby to maximize density of the arrangement of the solder-including electrodes 130. Hence, it is possible to enhance the effects of the forgoing second embodiment even more.

Modification Example 1-1

(An Example in which the Aperture has a Planar Shape of an Ellipse)

FIG. 16 illustrates, in an enlarged manner, part of a semiconductor device according to a modification example 1-1. Specifically, FIG. 16 illustrates a plan configuration of the two adjacent third wirings 153 (153A and 153B) in the vicinity of the peripheral part of the chip mounting region 20A. It is to be noted that the semiconductor chip 10 and the underfill resin 40 are omitted in the top view of FIG. 16 for an easier understanding, but the semiconductor chip 10 may be disposed in the region leftward of the chip outline 10A of the semiconductor chip 10 denoted by the broken line.

In this modification example, the third aperture 163 may have a planar shape of an ellipse elongated in the lengthwise direction DL of the third wiring 153 inside the third aperture 163. This makes it possible to increase the area of the exposed region of the third wiring 153, and to provide larger allowance for the positional deviation between the third electrode 133 and the third aperture 163. Otherwise, a semiconductor device 1A according to this modification example may have similar configurations, workings, and effects to those of the semiconductor device 1 according to the forgoing first embodiment. Description is therefore given with corresponding components denoted by same reference characters.

In one preferred example, the third aperture 163 of the solder resist layer 24 may be positioned at a distance d60 of a certain value or more from the adjacent third aperture 163, because the solder resist is the negative photosensitive material. Accordingly, in one desirable example, the pitch between the plurality of third electrodes 133 may be set at a large value, with the third apertures 163 shaped like rectangles as described in the forgoing first embodiment, when the length L of the third aperture 163 of the solder resist layer 24 is set to a large value in order to use the semiconductor chip 10 of a larger size or the packaging substrate 20 having a large linear expansion coefficient such as a coreless substrate.

In this modification example, the third aperture 163 may have the planar shape of the ellipse elongated in the lengthwise direction DL of the third wiring 153 inside the third aperture 163. Hence, it is possible to increase the area of the exposed region of the third wiring 153 inside the third aperture 163, while keeping the distance d60 from the adjacent third aperture 163 at the certain value. As a result, it is possible to provide the larger allowance for the positional deviation between the third electrode 133 and the third aperture 163 caused by the difference in the thermal expansion coefficients of the semiconductor chip 10 and the packaging substrate 20, while maintaining the pitch between the third electrodes 133. In other words, it is possible to prevent the solder layer 32 from running on the solder resist layer 24 and causing the short circuit between the adjacent third wirings 153, or to prevent a failure in the bonding between the solder layer 32 and the third wiring 153, even in a case with the use of the semiconductor chip 10 of the larger size or the packaging substrate 20 having the larger thermal expansion coefficient, or a case with a higher process temperature. Moreover, it is also possible to increase the area of the region in which the solder layer 32 and the third wiring 153 form the alloy layer, leading to higher bonding strength and enhancement in the yield and the reliability. Furthermore, an increase in the volume of the third aperture 163 exclusive of the volume of the third wiring 153 may be suppressed, as compared to a case with the rectangular shaped third aperture 163 as illustrated in FIG. 17. This makes it possible to fill the third aperture 163 with the solder layer 32 without increasing the volume of the solder layer 32, while producing the effects as described above.

As described, in this modification example, the third aperture 163 may have the planar shape of the ellipse. Hence, it is possible to increase the area of the exposed region of the third wiring 153 without reducing the distance d60 between the third apertures 163, that is, without increasing resolution of the solder resist. This allows for the larger allowance for the positional deviation between the third electrode 133 and the third aperture 163, and the enhanced bonding strength.

Modification Example 1-2

(An Example in which, Inside the Third Aperture, the Third Wiring Includes a Widened Part)

FIG. 18 illustrates, in an enlarged manner, part of a semiconductor device according to a modification example 1-2. Specifically, FIG. 18 illustrates a plan configuration of the two adjacent third wirings 153 (153A and 153B) in the vicinity of the peripheral part of the chip mounting region 20A. It is to be noted that the semiconductor chip 10, the third electrodes 133, and the underfill resin 40 are omitted in the top view of FIG. 18 for an easier understanding, but the semiconductor chip 10 may be disposed in the region leftward of the chip outline 10A of the semiconductor chip 10 denoted by the broken line. Also, in FIG. 18, positions at which the third electrodes 133 are mounted are denoted by a broken line.

In this modification example, inside the third aperture 163, each of the plurality of third wirings 153 may include a widened part 55. This makes it possible to increase the area of the region in which the third electrode 133 and the third wiring 153 form the alloy layer, leading to even higher strength of the bonding part. Otherwise, a semiconductor device 1B according to this modification example may have similar configurations, workings, and effects to those of the semiconductor device 1 according to the forgoing first embodiment. Description is therefore given with corresponding components denoted by same reference characters.

The plurality of third wirings 153 each may be disposed inside the third aperture 163 with both of the side surfaces 54 exposed, and each may include the widened part 55 in which the width W50 is partly increased. This causes the increase in the area of the region in which the solder layer 32 and the third wiring 153 form the alloy layer. Hence, it is possible to enhance the bonding strength against shearing stress generated by the thermal stress or stress generated by other reasons and applied to the solder bonding part. This leads to the enhancement in the yield and the reliability.

Modification Example 1-3

(An Example in which, Inside the Third Aperture, the Third Wiring has a Break)

FIG. 19 illustrates, in an enlarged manner, part of a semiconductor device according to a modification example 1-3. Specifically, FIG. 19 illustrates a plan configuration of the two adjacent third wirings 153 (153A and 153B) in the vicinity of the peripheral part of the chip mounting region 20A. It is to be noted that the semiconductor chip 10, the third electrodes 133, and the underfill resin 40 are omitted in the top view of FIG. 19 for an easier understanding, but the semiconductor chip 10 may be disposed in the region leftward of the chip outline 10A of the semiconductor chip 10 denoted by the broken line. Also, in FIG. 19, the positions at which the third electrodes 133 are mounted are denoted by the broken line.

In this modification example, inside the third aperture 163, each of the plurality of third wirings 153 may have a break 56. This makes it possible to increase the area of the region in which the third electrode 133 and the third wiring 153 form the alloy layer, leading to even higher strength of the bonding part. Otherwise, a semiconductor device 1C according to this modification example may have similar configurations, workings, and effects to those of the semiconductor device 1 according to the forgoing first embodiment. Description is therefore given with corresponding components denoted by same reference characters.

FIG. 20 illustrates a cross-sectional configuration along a line XX-XX of FIG. 19. Each of the third wirings 153 may be broken inside the third aperture 163, and have the break 56. A distance d56 of the break 56 may be, for example, about 10 µm. The height H50 of the third wiring 153 may be, for example, 15 µm. With this configuration, it is possible to increase area of contact of the third electrode 133 and the third wiring 153, leading to higher bonding strength. Moreover, if there should occur peeling off of the alloy layer formed by the surface coating 52 of the third wiring 153 and the solder layer 32, it is possible to prevent the peeling off from advancing any more, thanks to discontinuity of the third wiring 153.

Modification Example 1-4

(An Example in which Two Third Apertures have Oblique Notches at their Corners, and the Two Third Apertures are Adjacently Disposed with the Oblique Notches Confronted with Each Other)

FIG. 21 is an enlarged top view of part of a semiconductor device according to a modification example 1-4. Specifically, FIG. 21 illustrates a plan configuration of the two adjacent third wirings 153 (153A and 153B) in the vicinity of the peripheral part of the chip mounting region 20A. It is to be noted that the semiconductor chip 10, the third electrodes 133, and the underfill resin 40 are omitted in the top view of FIG. 21, but the semiconductor chip 10 may be disposed in the region leftward of the chip outline 10A of the semiconductor chip denoted by the broken line.

In this modification example, the two third apertures 163 may have oblique notches 62 at their angles (corners). The two third apertures 163 may be disposed with the oblique notches 62 confronted with each other. Hence, in this modification example, it is possible to reduce the distance d30 between the third electrodes 133 even more. Otherwise, a semiconductor device 1D according to this modification example may have similar configurations, workings, and effects to those of the semiconductor device 1 according to the forgoing first embodiment. Description is therefore given with corresponding components denoted by same reference characters.

In one preferred example, the distance d60 between the third apertures 163 may be a certain value or more because the solder resist is generally the negative photosensitive material. In this modification example, the adjacent third apertures 163 may have the oblique notches 62 at their corners, with the solder resist layer 24 left unremoved. In this way, it is possible to reduce the distance d30 between the third electrodes 133, while keeping the distance d60 between the third apertures 163 at the certain value, as compared to the case with the rectangular third apertures 163. Moreover, there is little change in the allowance for the positional deviation between the third electrode 133 and the third aperture 163, from the case with the third apertures 163 shaped like rectangles. The positional deviation may be caused by the difference in the thermal expansion coefficients of the semiconductor chip 10 and the packaging substrate 20.

In one preferred example, the oblique notch 62 may be arranged to avoid overlap with the third wiring 153, so as not to extend over the third wiring 153. This makes it possible to prevent the area of the exposed region of the third wiring 153 inside the third aperture 163 from being affected by the oblique notches 62. Accordingly, it is possible to provide the sufficient area of the region in which the third electrode 133 and the third wiring 153 form the alloy layer, and to maintain the bonding strength even when the distance P30 between the third electrodes 133 is reduced.

Modification Example 1-5

(An Example in which Two Third Apertures have Oblique Notches at their Sides, and the Two Third Apertures are Adjacently Disposed with the Oblique Notches Confronted with Each Other)

FIG. 22 is an enlarged top view of part of a semiconductor device according to a modification example 1-5. Specifically, FIG. 22 illustrates a plan configuration of the two adjacent third wirings 153 (153A and 153B) in the vicinity of the peripheral part of the chip mounting region 20A. It is to be noted that the semiconductor chip 10, the third electrodes 133, and the underfill resin 40 are omitted in the top view of FIG. 22 for an easier understanding, but the semiconductor chip 10 may be disposed in the region leftward of the chip outline 10A of the semiconductor chip denoted by the broken line.

In this modification example, each of the two third apertures 163 may have the oblique notch 62 along an entirety of its one side. The two third apertures 163 may be adjacently disposed with the oblique notches 62 confronted with each other. Hence, in this modification example, it is possible to reduce the distance d30 between the third electrodes 133 even more, and to enhance the bonding strength even more. Otherwise, a semiconductor device 1E according to this modification example may have similar configurations, workings, and effects to those of the semiconductor device 1 according to the forgoing first embodiment. Description is therefore given with corresponding components denoted by same reference characters.

In this modification example, the two third apertures 163 each may have the oblique notch 62 at one side, and have a planar shape of a trapezoid including one oblique side. Thus, the adjacent third apertures 163 each may include one oblique side with respect to the lengthwise direction DL of the third wiring 153 inside the third aperture 163. This makes it possible to reduce the distance d30 between the third electrodes 133 while maintaining the distance d60 between the adjacent third apertures 163 at the certain value, as compared to the case with the rectangular third apertures 163. Furthermore, it is also possible to increase the bonding area between the third electrode 133 and the third wiring 153. This makes it possible to maintain the bonding strength even when the distance d30 between the third electrodes 133 is reduced.

In this modification example, the two third apertures 163 each may have the oblique notch 62 at one side, and be shaped as the trapezoid. Hence, it is possible to reduce the distance d30 between the third electrodes 133 without increasing the resolution of the solder resist, and to provide even more highly densified arrangement of the third electrodes 133.

Fifth Embodiment (A Semiconductor Device; an Example in which a Thickness of a Solder Resist Layer Inside an Aperture is Smaller than a Thickness of the Solder Resist Layer in a Region Other than the Aperture Out of a Front Surface of a Substrate Body)

FIG. 23 illustrates, in an enlarged manner, part of a semiconductor device according to a fifth embodiment of the disclosure. Specifically, FIG. 23 illustrates a cross-sectional configuration of the two adjacent third wirings 153 (153A and 153B) in the vicinity of the peripheral part of the chip mounting region 20A.

In a semiconductor device 5, a thickness t1 of the solder resist layer 24 inside the aperture 160 may be smaller than a thickness t2 of the solder resist layer 24 in a region other than the aperture 160 out of the front surface of the substrate body 21. Hence, in this embodiment, it is possible to enhance controllability of the shape of the aperture 160, and to enhance adhesion strength of the packaging substrate 20 and the wiring 150. Otherwise, the semiconductor device 5 according to this embodiment may have similar configurations, workings, and effects to those of the semiconductor device 1 according to the forgoing first embodiment.

Description is therefore given with corresponding components denoted by same reference characters.

It is to be noted that FIG. 23 depicts the third aperture 163 as exemplification, but the same may apply to the first aperture 161 and the second aperture 162.

In this embodiment, the solder resist layer 24 inside the aperture 160 may allow part in the heightwise direction of the side surfaces 54 of the wiring 150 to be exposed, without allowing the insulating layer 21C of the substrate body 21 of the packaging substrate 20 to be exposed. The surface coating 52 of the wiring 150 may be provided on the region exposed from the solder resist layer 24 out of the surface of the wiring 150. In one specific example, the thickness H50 of the wiring 150 may be, for example, 15 μm. The thickness t2 of the solder resist layer 24 may be, for example, 20 μm. An amount of exposure of the side surfaces 54 of the wiring 150 may be, for example, about 10 μm. The thickness t1 of the solder resist layer 24 inside the aperture 160 may be, for example, about 5 μm. Such a structure may be easily created by stopping development halfway, instead of carrying out the development to the end, because the solder resist layer 24 may be made of a negative resist in general. It is possible to reduce development time as compared to a case in which the development is carried out until the insulating layer 21C of the substrate body 21 of the packaging substrate 20 is exposed. This makes it possible to miniaturize the size of the apertures 160.

Moreover, in this embodiment, the wiring 150 may have a shape that is partly embedded in the solder resist layer 24, instead of having all in the heightwise direction of the side surfaces 54 exposed. It is therefore possible to suppress the wiring 150 from peeling off from the insulating layer 21C of the substrate body 21 of the packaging substrate 20.

In addition, an aspect ratio in a depthwise direction of the aperture 160 may be lowered, and the amount of the solder filled in the aperture 160 may be also reduced. It is therefore possible to easily fill the aperture 160 with the solder layer 32. As a result, it is possible to prevent generation of a minute void inside the aperture 160, to prevent swelling of the void in the post-processes such as the reflow process for ball attachment and the reflow process for secondary mounting, and to prevent degradation in the yield and the reliability.

In addition, as described in the first embodiment, the length L of the third aperture 163 may be increased in the lengthwise direction DL of the third wiring 153 inside the third aperture 163, to increase the area of the exposed region of the third wiring 153 in the lengthwise direction DL. This makes it possible to compensate an amount of reduction in the bonding area due to the reduction in the exposed region of the third wiring 153 in the depthwise direction.

As described, in this embodiment, the solder resist layer 24 may allow the upper surface 53 and part in the heightwise direction of the side surfaces 54 of the wiring 150 inside the aperture 160 to be exposed. The solder resist layer 24 may cover remaining part in the heightwise direction of the side surfaces 54 of the wiring 150 inside the aperture 160. Moreover, the solder resist layer 24 may cover the upper surface 53 and all in the heightwise direction of the side surfaces 54 of each of the plurality of wirings 150 in the region other than the aperture 160 out of the front surface of the substrate body 21. With this configuration, it is unnecessary to carry out the development of the solder resist layer 24 inside the aperture 160 for all in the thicknesswise direction of the solder resist layer 24. Hence, it is possible to enhance the resolution of the solder resist, to form the fine aperture 160, and to increase density of the plurality of wirings 150 even more.

Moreover, the configuration in which not all in the heightwise direction of the side surfaces 54 of the wiring 150 is exposed makes it possible to enhance the adhesion strength between the wiring 150 and the insulating layer 21C of the substrate body 21 of the packaging substrate 20. It is also possible to prevent the solder material from intruding into an interface between the wiring 150 and the insulating layer 21C of the substrate body 21 of the packaging substrate 20 and causing lowered adhesion strength. Furthermore, it is possible to reduce the volume of the solder filled in the aperture 160.

Sixth Embodiment (A Semiconductor Device; an Example of an MCM (Multi Chip Module))

FIG. 24 schematically illustrates an overall configuration of a semiconductor device according to a sixth embodiment of the disclosure. FIG. 25 schematically illustrates a cross-sectional configuration of the semiconductor device, taken along a line XXV-XXV. While the first embodiment describes a case in which the semiconductor device 1 may be an LSI package including the semiconductor chip 10 as a single body, a semiconductor device 6 according to this embodiment may be, for example, an application example to an MCM (Multi Chip Module). Otherwise, the semiconductor device 6 according to this embodiment may have similar configurations, workings, and effects to those of the semiconductor device 1 according to the forgoing first embodiment. Description is therefore given with corresponding components denoted by same reference characters.

The semiconductor device 6 may include, for example, the semiconductor chip 10, the packaging substrate 20, the via 22, the solder ball 23, the plurality of solder-including electrodes 130 (the first electrode 131, the second electrode 132, and the third electrode 133), the underfill resin 40, and the plurality of wirings 150 (the first wiring 151, the second wiring 152, and the third wiring 153). These may have similar configurations as those in the first embodiment.

Moreover, the packaging substrate 20 may include the solder resist layer 24, and have the apertures 160 (the first aperture 161, the second aperture 162, and the third aperture 163), as with the first embodiment.

As with the first embodiment, the third aperture 163 may have the planar shape elongated in the lengthwise direction DL of the third wiring 153 inside the third aperture 163. The length L of the third aperture 163 may be adjusted in accordance with the thermal expansion coefficient of the packaging substrate 20. Hence, in the semiconductor device 6, as with the first embodiment, it is possible to alleviate the influence of the positional deviation between the third aperture 163 and the third electrode 133, and to suppress the short circuit between the adjacent third wirings 153.

For example, two semiconductor packages 70 may be further mounted on the front surface 21A of the substrate body 21 of the packaging substrate 20, in addition to the semiconductor chip 10. The underfill resin 40 may be provided between the packaging substrate 20 and each of the semiconductor packages 70.

The semiconductor package 70 may have a configuration in which, for example, a semiconductor chip 71 may be wire-bonded to a packaging substrate 72 with a wire 73, and sealed with a mold resin 74. The semiconductor package 70 may be connected to the plurality of wirings 150 on the packaging substrate 20 through solder balls 75 that may serve as external electrodes.

For example, when DRAM is used for the semiconductor package 70, it is desirable to increase the number of the wirings 150 that connect the semiconductor chip 10 to the semiconductor package 70, in order to provide a wide band. Accordingly, the forgoing first embodiment may be applied to the semiconductor device 6 according to this embodiment, and the length L of the third aperture 163 may be adjusted in accordance with the thermal expansion coefficient of the packaging substrate 20. This makes it possible to reduce the short circuit between the adjacent wirings 150, and to enjoy the advantages of the forgoing first embodiment that involves the flip chip connection with use of the wirings 150 arranged at the narrow pitch.

It is to be noted that the semiconductor package 70 may not be a packaged semiconductor component, but may be, for example, a bare chip. In one example, a wide band memory that may be called a wide I/O (Wide I/O) may be mounted as a bare chip, and connection may be formed on the packaging substrate 20 with use of the fine wirings 150. In this way, it is possible to provide an even wider band.

Seventh Embodiment (A Semiconductor Device; an Example of Sealing with a Mold Resin)

FIG. 26 schematically illustrates an overall configuration of a semiconductor device according to a seventh embodiment of the disclosure. A semiconductor device 7 may have a configuration in which the semiconductor device 1 as described in the forgoing first embodiment may be sealed with a mold resin 80. Sealing the semiconductor device 1 with the mold resin 80 makes it possible to protect the rear surface of the semiconductor chip 10 and the front surface 21A of the substrate body 21 of the packaging substrate 20. This allows for easier handling, and makes it possible to provide the flip chip semiconductor device 7 that is resistant to impact from outside.

On the other hand, the mold resin 80 may be accompanied by curing shrinkage, because the mold resin 80 uses an epoxy modified material. Moreover, the mold resin 80 has a different thermal expansion coefficient from those of the semiconductor chip 10 and the packaging substrate 20. This may easily cause an increase in the stress applied to the bonding parts between the plurality of solder-including electrodes 130 and the plurality of wirings 150.

In the semiconductor device 7 according to the embodiment, as described in the first embodiment, in the semiconductor device 1, the third aperture 163 of the solder resist layer 24 may have the planar shape elongated in the lengthwise direction DL of the third wiring 153 inside the third aperture 163. The length L of the third aperture 163 may be adjusted in accordance with the thermal expansion coefficient of the packaging substrate 20. Hence, it is possible to alleviate the influence of the positional deviation between the third aperture 163 and the third electrode 133, and to reduce the short circuit between the adjacent third wirings 153. It is also possible to increase the area of the bonding part between the third electrode 133 and the third wiring 153, and to alleviate influences of the increase in the stress derived from the mold resin 80. Accordingly, it is possible to provide the flip chip semiconductor device 4 having more optimal connection reliability.

Modification Example 7-1

Moreover, as illustrated in FIG. 27, the forgoing effects may be also produced in a semiconductor device 7A in which a semiconductor chip 90 may be stacked inside the mold resin 80. The semiconductor chip 90 may be different from the semiconductor chip 10. The semiconductor chip 90 may include, for example, a chip body 91. The chip body 91 may be connected to the packaging substrate 20 through a wire 92.

Modification Example 7-2

Furthermore, as illustrated in FIG. 28, effects similar to those as described above may be also obtained in a PoP (Package on Package) semiconductor device 7B in which another semiconductor package 100 may be further stacked on the semiconductor chip 10 of the semiconductor device 1 as described in the first embodiment.

The semiconductor package 100 may have a configuration in which, for example, semiconductor chips 101A and 101B may be wire-bonded to a packaging substrate 102 with wires 103A and 103B, and sealed with a mold resin 104. The semiconductor package 100 may be connected to the plurality of wirings 150 on the packaging substrate 20, through solder balls 105 that may serve as external electrodes.

Eighth Embodiment (A Method of Manufacturing a Semiconductor Device; an Example of Batch Reflow)

FIGS. 29 to 36, and FIGS. 37 to 40 illustrate a method of manufacturing a semiconductor device according to an eighth embodiment of the disclosure, in the order of procedure.

It is to be noted that the following description is given on a case of manufacturing the semiconductor device 1 as described in the forgoing first embodiment by the manufacturing method according to this embodiment. However, the manufacturing method according to this embodiment may be applicable not only to the case of manufacturing the semiconductor device 1 according to the first embodiment but also to cases of manufacturing semiconductor devices according to other embodiments and modification examples.

Description is given first on a method of manufacturing the plurality of solder-including electrodes 130 with reference to FIGS. 29 to 36. FIG. 29 illustrates the semiconductor chip 10 in a wafer state before formation of the plurality of solder-including electrodes 130. The passivation film 14 may be formed on the element-formation surface 11A of the chip body 11 made of silicon (Si). An insulating film (undepicted) may be formed on an outermost surface of the chip body 11. The insulating film may be made of, for example, a silicon nitride film or polyimide. The passivation film 14 may have an opening that allows the pad 13 to be exposed. The pad 13 may be made of, for example, aluminum.

After cleansing of a wafer surface, a surface oxide film of the pad 13 may be removed by argon reverse sputtering. Next, as illustrated in FIG. 30, a TiW/Cu stacked film 15 may be sequentially stacked by sputtering. A thickness of TiW may be, for example, 100 nm. A thickness of copper (Cu) may be, for example, 200 nm. TiW may be provided for purpose of suppression of an increase in resistance due to formation of an alloy layer of the pad 13 and the metal of the columnar metal layer 31 to be formed later.

Thereafter, as illustrated in FIG. 31, a resist film 16 may be formed by spin coating on a front surface of the semiconductor chip 10 in the wafer state. A thickness of the resist film 16 may be, for example, about 70 μm.

Thereafter, as illustrated in FIG. 32, a resist opening 16A may be formed at a position at which the solder-including electrode 130 is formed, by photolithography with use of an exposure machine such as a stepper or an aligner. When using the negative resist, exposure may be carried out with use of a mask that allows for exposure of a region other than the resist opening 16A. Thereafter, development may be carried out to form the resist opening 16A.

Thereafter, resist residue that remains in a bottom of the resist opening 16A may be cleaned up by, for example, a scum removal process. As illustrated in FIG. 33, the columnar metal layer 31 may be formed by electroplating. In a peripheral part of the semiconductor chip 10 in the wafer state, an edge of the resist film 16 may be cut in advance by about 3 mm. Power may be supplied through the edge-cut part to carry out the electroplating. As an electroplating film, for example, a copper (Cu) layer may be formed with a diameter of 40 µm and a height of 40 µm. In order to suppress excessive growth of the alloy layer of the solder to be formed by plating later and the columnar metal layer 31, nickel (Ni) electroplating may be successively carried out after forming the copper (Cu) layer by the electroplating, to form a stacked structure. In this case, a thickness of the copper (Cu) plating film may be, for example, 35 µm, and a thickness of the nickel (Ni) plating film may be, for example, 5 µm.

Thereafter, as illustrated in FIG. 34, the solder layer 32 may be stacked by plating on the columnar metal layer 31. A thickness of the plating may be, for example, 26 µm. A composition of the solder may be, for example, Sn—Ag. The solder layer 32 may be formed with other solder materials that may be used in plating, by a similar manufacturing method. Plating of the solder material having a low melting point, e.g., indium (In), makes it possible to lower a heating temperature during the assembly process, and to reduce the thermal stress during the assembly.

Thereafter, as illustrated in FIG. 35, the resist film 16 may be removed. The TiW/Cu stacked film 15 may be removed by wet etching, with the columnar metal layer 31 serving as a mask. Ammonia hydrogen peroxide water may be used for TiW etching. A mixed liquid of citric acid and aqueous hydrogen peroxide may be used for Cu etching.

Thereafter, as illustrated in FIG. 36, a reflow process may be carried out to remove an oxide film on a surface of the solder layer 32 and to melt the solder layer 32. Examples may include a method of coating the wafer surface with flux and thereafter heating in a reflow furnace, and a method of heating in a reflow furnace under an atmosphere of formic acid. For example, a method may be used in which the wafer may be heated to about 250° C. under the atmosphere of formic acid to remove the surface oxide film of the solder layer 32 and to melt the solder layer 32. Thereafter, water cleansing treatment may be carried out to remove residue or a foreign matter that are attached to the surface. Thereafter, a protection tape may be attached to the element-formation surface 11A of the semiconductor chip 10 in the wafer state. Thereafter, back grinding may be carried out to a predetermined thickness, to adjust a thickness of the chip body 11 to an appropriate value. Thereafter, the chip body 11 may be fixed to a dicing frame with a dicing tape. After removal of the protection tape, dicing may be carried out. Thus, the semiconductor chip 10 including the plurality of solder-including electrodes 130 may be completed.

At this occasion, possible advantages of the columnar metal layer 31 made of the metal having the higher melting point than that of the solder that constitutes the solder layer 32 may be as follows. When most part of an electrode is made of solder as in the existing C4 technique, the solder electrode may tend to keep itself in a spherical shape, owing to action of a force that keeps surface tension to a minimum when the solder melts. In order to provide a gap for injection of the underfill resin 40 between the semiconductor chip 10 and the packaging substrate 20, it is preferable that a solder electrode having a large diameter be prepared when most part of the electrode is made of the solder. It is therefore difficult to reduce the pitch between the electrodes. In this embodiment, the plurality of solder-including electrodes 130 may have the stacked configuration of the columnar metal layer 31 and the solder layer 32. The columnar metal layer 31 may not melt at the melting point of the solder. This makes it possible to reduce the inter-electrode pitch between the plurality of solder-including electrodes 130, while providing the sufficient gap G between the semiconductor chip 10 and the packaging substrate 20.

It is to be noted that the forgoing method of manufacturing the plurality of solder-including electrodes 130 may be applicable to ninth to twelfth embodiments to be described later.

In the following, description is given on a method of connecting, by batch reflow, the packaging substrate 20 and the semiconductor chip 10 with reference to FIGS. 37 to 40.

First, as illustrated in FIG. 37, the solder-including electrode 130 may be aligned with the aperture 160 on the wiring 150 as the connection target, with flux (undepicted) applied in advance by dipping to a tip of the solder layer 32 of the solder-including electrode 130.

Next, as illustrated in FIG. 38, an appropriate load may be applied at an appropriate temperature, to pressure-bond the solder layer 32 to the wiring 150. At this phase, the solder layer 32 and the surface coating 52 of the wiring 150 may not be completely alloyed, but may be fixed with adhesiveness of the flux material.

Thereafter, heating in the reflow furnace may be carried out, to cause alloying of the solder layer 32 and the surface coating 52 of the wiring 150, as illustrated in FIG. 39. At this occasion, the flux material may have a function of removing the surface oxide film of the solder layer 32.

Moreover, at this occasion, there may occur the positional deviation between the third electrode 133 and the third aperture 163 due to the difference in the thermal expansion coefficients of the semiconductor chip 10 and the packaging substrate 20. In general, the packaging substrate 20 may have the larger thermal expansion coefficient. Accordingly, with the plan configuration of the packaging substrate 20 as illustrated in FIG. 1, the positional deviation may occur depthward or frontward of the sheet of FIG. 39, i.e., in the lengthwise direction DL of the third wiring 153 inside the third aperture 163.

Here, as described in the first embodiment, the third aperture 163 of the solder resist layer 24 may have the planar shape elongated in the lengthwise direction DL of the third wiring 153 inside the third aperture 163. The length L of the third aperture 163 may be adjusted in accordance with the thermal expansion coefficient of the packaging substrate 20. Accordingly, as illustrated in FIG. 8, the solder layer 32 may be suppressed from running on the solder resist layer 24 and causing the short circuit with the adjacent third wiring 153.

It is to be noted that the reflow process may be carried out a plurality of times, in order to promote the alloying.

Thereafter, cleansing may be carried out to remove the flux material. As illustrated in FIG. 40, the underfill resin 40 may be injected into the gap G between the semiconductor chip 10 and the packaging substrate 20. Thereafter, curing may be carried out to modify and cure the underfill resin 40.

In injecting the underfill resin 40, the packaging substrate 20 may be heated to, for example, about 80° C. After injection, post-curing may be carried out, for example, at 150° C. for about 1.5 hours in total.

Thereafter, flux may be transferred to the positions at which the solder balls 23 are mounted, on the rear surface 21B of the substrate body 21 of the packaging substrate 20. The solder balls 23 may be mounted. The reflow process for the ball attachment may be carried out. As a result, the solder layer 32 may melt again. At this occasion, the surface coating 52 of the wiring 150 may contribute to suppression of the excessive alloying of the solder layer 32 and the wiring 150 to cause degradation in the bonding strength. Furthermore, regarding the thermal stress generated in a cooling step after the reflow, the length L of the third aperture 163 on the wiring 150 may be increased to expand the area of the bonding part. This makes it possible to enhance the mechanical strength.

In this embodiment, the semiconductor chip 10 and the packaging substrate 20 may be temporarily bonded with use of the flux. Thereafter, the reflow heating may be carried out. This causes the semiconductor chip 10 and the packaging substrate 20 to be heated to the same high temperature. Accordingly, the amount of the positional deviation due to the difference in the thermal expansion coefficients of the semiconductor chip 10 and the packaging substrate 20 may tend to be large. However, as described in the first embodiment, the third aperture 163 of the solder resist layer 24 may have the planar shape elongated in the lengthwise direction DL of the third wiring 153 inside the third aperture 163. The length L of the third aperture 163 may be adjusted in accordance with the thermal expansion coefficient of the packaging substrate 20. Hence, it is possible to alleviate the influence of the positional deviation between the third aperture 163 and the third electrode 133, and to suppress the short circuit between the adjacent third wirings 153.

Moreover, in this embodiment, the semiconductor chip 10 may be heated, in an unfixed state, to the temperature equal to or higher than the melting point of the solder. Accordingly, the positional deviation or inclination of the semiconductor chip 10 may be corrected by a self-alignment effect of the solder. Hence, it is possible to provide high alignment precision even in a case in which the plurality of third electrodes 133 and the third wirings 153 are arranged at a narrow pitch. This allows for production with even smaller variations, and with stabilization of the shape of the bonding part between the third electrode 133 and the third wiring 153. This leads to the enhancement in the yield and the reliability.

Furthermore, the use of the batch reflow allows for successive treatment in the reflow furnace, optimal productivity, and lower costs.

Ninth Embodiment (A Method of Manufacturing a Semiconductor Device; an Example of Local Reflow)

Description is given next on a method of connection between the packaging substrate 20 and the semiconductor chip 10, with use of a local reflow method called thermal compression (Thermal Compression), with reference to FIGS. 37, 39, and 40 as well.

First, as illustrated in FIG. 37, the solder layer 32 of the third electrode 133 may be aligned with the third aperture 163 on the third wiring 153 as the connection target.

Next, as illustrated in FIG. 39, an appropriate load may be applied at an appropriate temperature, to perform thermocompression. In one example, the semiconductor chip 10 and the packaging substrate 20 may be heated in advance to about 100° C. that is equal to or lower than the melting point of the solder. The semiconductor chip 10 may be pressed onto the packaging substrate 20 until a load cell on apparatus side detects a load. At this occasion, because the third wiring 153 is shaped as a protrusion and made of a hard material, it is possible to impart a function of destroying the surface oxide film of the solder layer 32 to the third wiring 153.

After the detection of the load, a temperature of a tool that fixes the semiconductor chip 10 may be started to rise. The temperature of the tool may be adjusted to allow an effective temperature of the solder part to exceed the melting point of the solder. At this occasion, in order to cancel thermal expansion on tool side, the apparatus may be instructed to operate to pull up the semiconductor chip 10 so as not to destroy the bonding part. After performing adjustment to provide the appropriate gap G between the semiconductor chip 10 and the packaging substrate 20, the tool may be cooled down to solidify the solder layer 32 and to complete the bonding. At this occasion as well, the cooling may be accompanied by shrinkage on the tool side. Accordingly, in order to cancel the shrinkage, the apparatus may be instructed to operate to press down the semiconductor chip 10. In a step after the load detection, it is desirable to adjust the gap G between the semiconductor chip 10 and the packaging substrate 20 to a value as constant as possible.

Moreover, in order to perform optimal bonding, there may be an additional improvement to remove the surface oxide film of the solder layer 32, with use of ultrasonic or mechanical vibration, or a reducing gas atmosphere such as formic acid when the solder layer 32 is heated to the temperature equal to or higher than the melting point of the solder layer 32.

Thereafter, as illustrated in FIG. 40, the underfill resin 40 may be injected into between the semiconductor chip 10 and the packaging substrate 20. Thereafter, the curing may be carried out to modify and cure the underfill resin 40. The post-processes may be the same as those in the eighth embodiment.

One advantage of using the local reflow method as described is that it is unnecessary to allow the temperatures of the semiconductor chip 10 and the packaging substrate 20 to be the same, unlike the batch reflow method as described in the eighth embodiment. In this embodiment, it is possible to allow the temperature of the packaging substrate 20 having the larger thermal expansion coefficient to be lower than the temperature of the semiconductor chip 10. This makes it possible to reduce the thermal stress generated in the cooling process in the solidification of the solder. Accordingly, by combining the local reflow method with the third aperture 163 as described in the first embodiment, it is possible to provide the bonding structure having even higher strength against the thermal stress in the flip chip mounting.

Effects of this embodiment may be as follows. In a case with shrinkage of the plurality of solder-including electrodes 130 and the plurality of wiring 150 to increase the connection density, the heat treatment by the batch reflow method may cause generation of such large thermal stress that even breaking of the bonding part may be assumed. Thus, in this embodiment, in one preferred example, after the alignment, the tool that holds the semiconductor chip 10 may be heated to perform thermocompression. The bonding may be carried out without directly heating the packaging substrate 20 having the larger thermal expansion coefficient to the temperature equal to or higher than the melting point of the solder. Accordingly, an amount of the expansion of the packaging substrate 20 may be relatively small as compared to that in the batch reflow method. It is therefore possible to suppress the thermal stress generated in the assembly process. In this case, in the reflow process for the ball attachment or the reflow process for the secondary mounting, the semiconductor chip 10 and the packaging substrate 20 may be heated to the same temperature. However, the heating is performed after the injection of the underfill resin 40. Part of the thermal stress generated may be therefore shared by the underfill resin 40, making it possible to reduce the stress applied to the bonding part.

Tenth Embodiment

It is to be noted that description has been given in the forgoing eighth embodiment on the method that involves the temporarily bonding with use of the flux, and thereafter, the heating in the reflow furnace. However, other techniques may be utilized that involve temporarily bonding by the thermocompression method as described in the ninth embodiment, and thereafter, the heating in the reflow furnace, so as to promote growth of the alloy layer even more, and thereby to ensure the bonding.

Eleventh Embodiment

Moreover, in the forgoing ninth embodiment, description has been given on a process that involves raising or lowering the temperature of the tool that holds the semiconductor chip 10 during the bonding process. However, a technique may be utilized that involves thermocompression with the temperature on the tool side fixed at the temperature equal to or higher than the melting point of the solder. In this case, it is difficult to detect the load by the contact of the solder layer 32 and the wiring 150. Therefore, the load when the columnar metal layer 31 comes into contact with the solder resist layer 24 may be detected. Alternatively, the load when the columnar metal layer 31 comes into contact with the wiring 150 may be detected, and thereafter, the tool that holds the semiconductor chip 10 may be pulled up so as to form the desired gap G. On the other hand, this technique may allow a surface oxide film to grow, because the solder layer 32 is kept melting. Accordingly, taking countermeasures such as bonding under a nitrogen atmosphere makes it possible to obtain a more optimal bonding state.

By using such technique, it is possible to eliminate the complicated process of raising or lowering the temperature on the tool side, or the fine gap adjustment caused by the thermal expansion of the tool, while enjoying the advantages of the local reflow such as the reduction in the thermal stress as described in the ninth embodiment. Hence, it is possible to reduce apparatus costs or production costs even more.

Twelfth Embodiment (A Method of Manufacturing a Semiconductor Device; an Example in which an Underfill Resin is Supplied in Advance on a Packaging Substrate)

FIGS. 41 to 43 illustrate a method of manufacturing a semiconductor device according to a twelfth embodiment of the disclosure, in the order of procedure. The manufacturing method according to this embodiment may be different from the method of manufacturing the semiconductor device according to the forgoing eighth embodiment, in that the underfill resin 40 may be supplied in advance on the packaging substrate 20.

It is to be noted that the following description is given on a case of manufacturing the semiconductor device 1 as described in the forgoing first embodiment by the manufacturing method according to this embodiment. However, the manufacturing method according to this embodiment may be applicable not only to the case of manufacturing the semiconductor device 1 according to the first embodiment but also to cases of manufacturing semiconductor devices according to other embodiments and modification examples.

First, as illustrated in FIG. 41, the underfill resin 40 may be applied with a dispenser on the front surface 21A of the substrate body 21 of the packaging substrate 20. The underfill resin 40 may be made of a precoating underfill material (NCP) in a liquid state. For the NCP, for example, NCP 5208 (Henkel) may be used.

Next, as illustrated in FIG. 42, the solder-including electrode 130 may be aligned with the aperture 160 on the wiring 150 as the connection target.

Thereafter, as illustrated in FIG. 43, the bonding of the solder layer 32 and the wiring 150 may be carried out while maintaining an appropriate temperature and a tool position in a similar manner to the ninth embodiment. Heating at this occasion may cause the underfill resin 40 to be cured.

In one example, the packaging substrate 20 may be heated at a constant temperature of 70° C. The semiconductor chip 10 may be pressed onto the packaging substrate 20 until a load of 50 N is detected on the tool side. The temperature may be raised to 240° C., and thereafter maintained for 2.8 seconds to perform temporary curing. Thereafter, post-curing may be carried out at 150° C. for about 1.5 hours. Thus, the curing may be completed.

Possible advantages of the manufacturing method according to this embodiment may be as follows. In a structure with the plurality of solder-including electrodes 130 (the columnar metal layers 31) arranged at the narrow pitch, it is difficult to provide the wide gap G between the semiconductor chip 10 and the packaging substrate 20, as compared to the flip chip connection of the existing C4 type. One reason may be because an aspect ratio of the resist opening 16A becomes large when the columnar metal layer 31 is formed by plating. This causes difficulty in filling the resist opening 16A by the plating. Accordingly, the use of the precoating underfill resin 40 as in this embodiment makes it possible to fill the gap G between the semiconductor chip 10 and the packaging substrate 20 with the underfill resin 40, even when the height of the columnar metal layer 31 is small. Moreover, because the curing of the underfill resin 40 may be started at the cooling stage of the bonding process, the thermal stress may be shared and received by not only the bonding part between the solder layer 32 and the wiring 150 but also the underfill resin 40. This makes it possible to reduce the thermal stress received by the bonding part between the solder-including electrode 130 and the wiring 150, and to enhance the yield and the reliability of the semiconductor device 1 even more.

As described, in this embodiment, the underfill resin 40 may be supplied on the packaging substrate 20, and thereafter, the bonding may be carried out. Hence, it is possible to reduce the stress applied to the bonding part, as compared to the thermocompression process as described in the eighth or ninth embodiment.

In one specific example, the underfill resin 40 in the liquid state may be applied to the packaging substrate 20. Thereafter, the semiconductor chip 10 may be heated and pressure-bonded. After the underfill resin 40 is almost cured, the semiconductor chip 10 may be released from the tool. With this manufacturing method, the underfill resin 40 may start curing in the cooling process in which the thermal stress is generated. Accordingly, the thermal stress generated may be shared and received by the bonding part between the solder-including electrode 130 and the wiring 150 and by the underfill resin 40. This makes it possible to reduce the stress applied to the bonding part. Hence, it is possible to achieve further miniaturization of the plurality of solder-including electrodes 30 and the plurality of wirings 50, and to provide the even more highly densified flip chip semiconductor device 1 with the high yield and the high reliability.

Other Effects

Description has been made on the example embodiments and their effects as mentioned above. The forgoing effects are not limited to a flip chip semiconductor device in which the semiconductor chip 10 as a single body is mounted as in the first or fifth embodiment. For example, the same effects may be produced by the MCM (Multi Chip Module) structure in which a plurality of memory packages and the semiconductor chip 10 are mounted on one sheet of the packaging substrate 20 as in the sixth embodiment.

Furthermore, in the structure in which the semiconductor chip 10 is flip chip connected to the packaging substrate 20 and sealed by the mold resin 80 as in the seventh embodiment, the stress generated in the bonding part between the solder-including electrode 130 and the wiring 150 tends to be larger due to the curing shrinkage of the mold resin 80. The same applies to the structure as described in the modification example 7-1 in which the semiconductor chip 90 as a bare chip may be mounted on the rear surface of the semiconductor chip 10, connected to the packaging substrate 20 by wire bonding, and sealed by the mold resin 80. In such structures, it is possible to obtain even higher effects by adopting the bonding structures having optimal strength, as in the forgoing example embodiments.

Also, there is no difference in effects produced in the PoP (Package on Package) structure in which the additional semiconductor package 100 may be further mounted on the semiconductor chip 10 of the semiconductor device 1, as in the modification example 7-2.

Although description has been made by giving the example embodiments as mentioned above, the contents of the disclosure are not limited to the above-mentioned example embodiments and may be modified in a variety of ways.

For example, shapes, materials, and thicknesses, or deposition methods or other methods of the layers as described in the forgoing example embodiments are not limited to as exemplified above, but other shapes, materials, and thicknesses, or other deposition methods may be adopted.

It is to be noted that effects described herein are merely exemplified and not limitative, and effects of the disclosure may be other effects or may further include other effects.

The contents of the technology may have the following configurations.

(1)

A semiconductor device, including:

a semiconductor chip; and a packaging substrate on which the semiconductor chip is mounted, wherein the semiconductor chip includes a chip body and a plurality of solder-including electrodes provided on an element-formation surface of the chip body, the packaging substrate includes a substrate body, a plurality of wirings, and a solder resist layer, the plurality of wirings and the solder resist layer being provided on a front surface of the substrate body, the solder resist layer is provided as a continuous layer on the front surface of the substrate body and the plurality of wirings, and has one or more apertures on each of the plurality of wirings, the one or more apertures allow an upper surface and part or all in a heightwise direction of side surfaces of the wiring inside the one or more apertures to be exposed, the plurality of solder-including electrodes each cover an exposed part of the wiring inside the one or more apertures, the plurality of solder-including electrodes include a plurality of first electrodes and a plurality of second electrodes, the plurality of first electrodes supplying a first electric potential, and the plurality of second electrodes supplying a second electric potential different from the first electric potential, the plurality of first electrodes and the plurality of second electrodes are disposed alternately in both a row direction and a column direction, in a central part of the chip body, and the plurality of wirings include a plurality of first wirings and a plurality of second wirings, the plurality of first wirings connecting the plurality of first electrodes, and the plurality of second wirings connecting the plurality of second electrodes.

(2)

The semiconductor device according to (1), wherein the plurality of first wirings connect the plurality of first electrodes in an oblique direction with respect to the column direction, and the plurality of second wirings connect the plurality of second electrodes in the oblique direction.

(3)

The semiconductor device according to (2), wherein the one or more apertures include a plurality of first apertures on each of the plurality of first wirings, and a plurality of second apertures on each of the plurality of second wirings, the plurality of first wirings include a vertical line part and an oblique line part, the vertical line part intersecting each of the plurality of first apertures in the column direction, and the oblique line part connecting the vertical line parts in the oblique direction, and the plurality of second wirings include a vertical line part and an oblique line part, the vertical line part intersecting each of the plurality of second apertures in the column direction, and the oblique line part connecting the vertical line parts in the oblique direction.

(4)

The semiconductor device according to (2), wherein the plurality of first wirings and the plurality of second wirings each are a straight line.

(5)

The semiconductor device according to (4), wherein the one or more apertures include a plurality of first apertures on each of the plurality of first wirings, and a plurality of second apertures on each of the plurality of second wirings, the plurality of first apertures and the plurality of second apertures each have a planar shape of a rectangle elongated in the column direction, the plurality of first wirings are each disposed to traverse the plurality of first apertures obliquely through two corners opposed in a diagonal direction of each of the plurality of first apertures, and the plurality of second wirings are each disposed to traverse the plurality of second apertures obliquely through two corners opposed in a diagonal direction of each of the plurality of second apertures.

(6)

The semiconductor device according to (5), wherein the plurality of first apertures and the plurality of second apertures are disposed at a uniform pitch in both the row direction and the column direction, and the plurality of first wirings and the plurality of second wirings are each a straight line inclined 45 degrees with respect to the column direction.

(7)

The semiconductor device according to any one of (1) to (6), wherein the plurality of solder-including electrodes include a plurality of third electrodes in a peripheral part of the semiconductor chip, the packaging substrate includes a chip mounting region in a central part of the substrate body, and the plurality of wirings include a plurality of third wirings, the plurality of third wirings being extended outward or inward of the substrate body from a peripheral part of the chip mounting region and disposed in parallel with one another at each side of the chip mounting region.

(8)

The semiconductor device according to (7), wherein the one or more apertures include a third aperture on each of the plurality of third wirings, and the third aperture has a planar shape elongated in a lengthwise direction of the third wiring inside the third aperture, with a length of the third aperture adjusted in accordance with a thermal expansion coefficient of the packaging substrate.

(9)

The semiconductor device according to any one of (1) to (8), wherein each of the plurality of solder-including electrodes includes a columnar metal layer and a solder layer in order from side on which the chip body is disposed, and the columnar metal layer is made of a metal having a higher melting point than a melting point of solder that constitutes the solder layer.

(10)

The semiconductor device according to (9), wherein a height of the columnar metal layer is larger than a height of the solder layer.

(11)

The semiconductor device according to (9) or (10), wherein a volume of the solder layer is larger than a volume of the aperture.

(12)

The semiconductor device according to any one of (8) to (11), wherein the length of the third aperture satisfies Expression 1.

$$L > (a-3.5)*D*(T-25)*10^{-6}+d \qquad \text{Expression 1}$$

(in Expression 1, L denotes the length (mm) of the third aperture, a denotes an equivalent thermal expansion coefficient (ppm/° C.) of the packaging substrate, D denotes a distance (mm) from a center of the packaging substrate to a center of the third aperture, T denotes a melting point (° C.) of the solder, and d denotes a diameter of each of the plurality of third electrodes.)

(13)

The semiconductor device according to any one of (1) to (12), wherein each of the plurality of wirings includes:

a metal wiring layer made of copper (Cu) as a principal component; and a surface coating that covers a region exposed in the aperture, out of a surface of the metal wiring layer.

(14)

The semiconductor device according to (13), wherein the surface coating includes an Ni—Au plating layer or a Ni—Pd—Au plating layer.

(15)

The semiconductor device according to any one of (9) to (11), wherein the columnar metal layer is made of copper (Cu), or includes a stacked film of copper (Cu) and nickel (Ni), and the solder layer is made of tin (Sn) or Sn—Ag.

(16)

The semiconductor device according to any one of (9) to (11), wherein the columnar metal layer is made of copper (Cu), or includes a stacked film of copper (Cu) and nickel (Ni), and the solder layer is made of indium (In) or In—Ag.

(17)

A method of manufacturing a semiconductor device, the method including:

aligning a semiconductor chip with a packaging substrate, the semiconductor chip including a chip body and a plurality of solder-including electrodes provided on an element-formation surface of the chip body, and the packaging substrate including a substrate body, a plurality of wirings, and a solder resist layer, the plurality of wirings and the solder resist layer being provided on a front surface of the substrate body;

temporarily bonding the semiconductor chip to the packaging substrate;

connecting the plurality of solder-including electrodes to the plurality of wirings, by reflow heating; and injecting an underfill resin between the semiconductor chip and the packaging substrate, and curing the underfill resin, wherein the solder resist layer is provided as a continuous layer on the front surface of the substrate body and the plurality of wirings, and has one or more apertures on each of the plurality of wirings, the one or more apertures allow an upper surface and part or all in a heightwise direction of side surfaces of the wiring inside the one or more apertures to be exposed, the plurality of solder-including electrodes each cover an exposed part of the wiring inside the one or more apertures, the plurality of solder-including electrodes include a plurality of first electrodes and a plurality of second electrodes, the plurality of first electrodes supplying a first electric potential, and the plurality of second electrodes supplying a second electric potential different from the first electric potential, the plurality of first electrodes and the plurality of second electrodes are disposed alternately in both a row direction and a column direction, in a central part of the chip body, and the plurality of wirings include a plurality of first wirings and a plurality of second wirings, the plurality of first wirings connecting the plurality of first electrodes, and the plurality of second wirings connecting the plurality of second electrodes.

(18)

A method of manufacturing a semiconductor device, the method including:

aligning a semiconductor chip with a packaging substrate, the semiconductor chip including a chip body and a plurality of solder-including electrodes provided on an element-formation surface of the chip body, and the packaging substrate including a substrate body, a plurality of wirings, and a solder resist layer, the plurality of wirings and the solder resist layer being provided on a front surface of the substrate body;

connecting the plurality of solder-including electrodes to the plurality of wirings, by heating the semiconductor chip at a temperature equal to or higher than a melting point of the solder, and by pressure-bonding the semiconductor chip to the packaging substrate; and injecting an underfill resin between the semiconductor chip and the packaging substrate, and curing the underfill resin, wherein the solder resist layer is provided as a continuous layer on the front surface of the substrate body and the plurality of wirings, and has one or more apertures on each of the plurality of wirings, the one or more apertures allow an upper surface and part or all in a heightwise direction of side surfaces of the wiring inside the one or more apertures to be exposed, the plurality of solder-including electrodes each cover an exposed part of the wiring inside the one or more apertures, the plurality of solder-including electrodes include a plurality of first electrodes and a plurality of second electrodes, the plurality of first electrodes supplying a first electric potential, and the plurality of second electrodes supplying a second electric potential different from the first electric potential, the plurality of first electrodes and the plurality of second electrodes are disposed alternately in both a row direction and a column direction, in a central part of the chip body, and the plurality of wirings include a plurality of first wirings and a plurality of second wirings, the plurality of first wirings connecting the plurality of first electrodes, and the plurality of second wirings connecting the plurality of second electrodes.

(19)

A method of manufacturing a semiconductor device, the method including:

supplying an underfill resin on a packaging substrate, the packaging substrate including a substrate body, a plurality of wirings, and a solder layer, the plurality of wirings and the solder resist layer being provided on a front surface of the substrate body;

aligning a semiconductor chip with the packaging substrate, the semiconductor chip including a chip body and a plurality of solder-including electrodes provided on an element-formation surface of the chip body; and connecting the plurality of solder-including electrodes to the plurality of wirings, while curing the underfill resin, by heating the semiconductor chip at a temperature equal to or higher than a melting point of the solder, and by pressure-bonding the semiconductor chip to the packaging substrate, wherein the solder resist layer is provided as a continuous layer on the front surface of the substrate body and the plurality of wirings, and has one or more apertures on each of the plurality of wirings, the one or more apertures allow an upper surface and part or all in a heightwise direction of side surfaces of the wiring inside the one or more apertures to be exposed, the plurality of solder-including electrodes each cover an exposed part of the wiring inside the one or more apertures, the plurality of solder-including electrodes include a plurality of first electrodes and a plurality of second electrodes, the plurality of first electrodes supplying a first electric potential, and the plurality of second electrodes supplying a second electric potential different from the first electric potential, the plurality of first electrodes and the plurality of second electrodes are disposed alternately in both a row direction and a column direction, in a central part of the chip body, and the plurality of wirings include a plurality of first wirings and a plurality of second wirings, the plurality of first wirings connecting the plurality of first electrodes, and the plurality of second wirings connecting the plurality of second electrodes.

This application claims the benefit of Japanese Priority Patent Application JP 2014-132332 filed on Jun. 27, 2014 the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor device, comprising:
   a packaging substrate that includes a substrate body, a plurality of wirings, and a solder resist layer,
   wherein
      the plurality of wirings and the solder resist layer are on a front surface of the substrate body, and
      the solder resist layer has at least one aperture of a plurality of apertures on each of the plurality of wirings; and
   a semiconductor chip that includes a chip body and a plurality of electrodes, wherein the semiconductor chip is on the packaging substrate, wherein
      each of the plurality of electrodes is on an element-formation surface of the chip body,
      an upper surface of a wiring of the plurality of wirings and at least a side surface of the wiring of the plurality of wirings is exposed, to at least one electrode of the plurality of electrodes, through the at least one aperture,
      the plurality of electrodes includes a plurality of first electrodes and a plurality of second electrodes,
      a central part of the chip body comprises the plurality of first electrodes and the plurality of second electrodes arranged alternatively in both a row direction and a column direction,
      the plurality of wirings includes a plurality of first wirings that connects the plurality of first electrodes, and a plurality of second wirings that connects the plurality of second electrodes,
      the plurality of apertures includes at least one first aperture on each of the plurality of first wirings,
      each of the plurality of first wirings includes a first vertical line part, a second vertical line part, and a first oblique line part,
      the first vertical line part intersects the at least one first aperture in the column direction, and
      the first oblique line part connects the first vertical line part and the second vertical line part in an oblique direction.

2. The semiconductor device according to claim 1, wherein the plurality of first wirings connects the plurality of first electrodes in the oblique direction, the plurality of second wirings connects the plurality of second electrodes in the oblique direction, and the oblique direction is with respect to one of the column direction or the row direction.

3. The semiconductor device according to claim 2, wherein the plurality of apertures further includes at least one second aperture on each of the plurality of second wirings, each of the plurality of second wirings includes a third vertical line part, a fourth vertical line part, and a second oblique line part, the third vertical line part intersects the at least one second aperture in the column direction, and the second oblique line part connects the third vertical line part and the fourth vertical line part in the oblique direction.

4. The semiconductor device according to claim 2, wherein the plurality of apertures further includes at least one second aperture on each of the plurality of second wirings, each of the at least one first aperture and the at least one second aperture has a planar shape of a rectangle elongated in the column direction, the plurality of first wirings connects each of the at least one first aperture obliquely in a diagonal direction with respect to the column direction, and the plurality of second wirings connects each of the at least one second aperture obliquely in the diagonal direction.

5. The semiconductor device according to claim 4, wherein the at least one first aperture and the at least one second aperture are at a uniform pitch in both the row direction and the column direction, and each of the plurality of first wirings and each of the plurality of second wirings are inclined 45 degrees with respect to the column direction.

6. The semiconductor device according to claim 1, wherein the plurality of electrodes further includes a plurality of third electrodes in a peripheral part of the chip body, the packaging substrate further includes a chip mounting region in a central part of the substrate body, the plurality of wirings further includes a plurality of third wirings that extends in one of an outward direction of the substrate body or an inward direction of the substrate body, from a peripheral part of the chip mounting region, and each of the plurality of third wirings is mutually parallel.

7. The semiconductor device according to claim 6, wherein the plurality of apertures further includes a third aperture on each of the plurality of third wirings, the third aperture has a planar shape elongated in a lengthwise direction of a wiring of the plurality of third wirings, and a length of the third aperture is based on a thermal expansion coefficient of the packaging substrate.

8. The semiconductor device according to claim 1, each of the plurality of electrodes includes a columnar metal layer and a solder layer, the solder layer is towards a front surface of the packaging substrate, the columnar metal layer comprises a metal, the solder layer comprises a solder, and a melting point of the metal is higher than a melting point of the solder.

9. The semiconductor device according to claim 8, wherein a height of the columnar metal layer is greater than a height of the solder layer.

10. The semiconductor device according to claim 8, wherein a volume of the solder layer is more than a volume of the at least one aperture.

11. The semiconductor device according to claim 7, wherein the length of the third aperture satisfies Expression 1, the Expression 1 is L>(a1−3.5)*D*(T−25)*10−6+d, and the L denotes the length in millimeters (mm) of the third aperture, the a1 denotes an equivalent thermal expansion coefficient in parts per million per degree centigrade (ppm/° C.) of the packaging substrate, the D denotes a distance in mm from a center of the packaging substrate to a center of the third aperture, the T denotes a melting point in degree centigrade (° C.) of a solder in each of the plurality of third electrodes, and the d denotes a diameter of each of the plurality of third electrodes.

12. The semiconductor device according to claim 1, wherein each of the plurality of wirings includes:

a metal wiring layer that comprises copper (Cu); and a surface coating that covers a region of a surface of the metal wiring layer, exposed in the at least one aperture.

13. The semiconductor device according to claim 12, wherein the surface coating includes one of a Ni—Au plating layer or a Ni—Pd—Au plating layer.

14. The semiconductor device according to claim 8, wherein the columnar metal layer comprises one of copper (Cu), or a stacked film of Cu and nickel (Ni), and the solder layer comprises one of tin (Sn) or Sn—Ag alloy.

15. The semiconductor device according to claim 8, wherein the columnar metal layer comprises one of copper (Cu), or a stacked film of Cu and nickel (Ni), and the solder layer comprises one of indium (In) or In—Ag alloy.

16. The semiconductor device according to claim 1, wherein the plurality of first electrodes supply a first electric potential, and the plurality of second electrodes supply a second electric potential different from the first electric potential.

17. A semiconductor device, comprising:

a packaging substrate that includes a substrate body, a plurality of wirings, and a solder resist layer, wherein the plurality of wirings and the solder resist layer are on a front surface of the substrate body, and the solder resist layer has at least one aperture of a plurality of apertures on each of the plurality of wirings; and a semiconductor chip that includes a chip body and a plurality of electrodes, wherein the semiconductor chip is on the packaging substrate, wherein each of the plurality of electrodes is on an element-formation surface of the chip body, an upper surface of a wiring of the plurality of wirings and at least a side surface of the wiring of the plurality of wirings is exposed to at least one electrode of the plurality of electrodes, through the at least one aperture, the plurality of electrodes includes a plurality of first electrodes, a plurality of second electrodes, and a plurality of third electrodes in a peripheral part of the chip body, a central part of the chip body comprises the plurality of first electrodes and the plurality of second electrodes arranged alternatively in both a row direction and a column direction, the plurality of wirings includes a plurality of first wirings that connects the plurality of first electrodes, and a plurality of second wirings that connects the plurality of second electrodes, the plurality of first wirings connects the plurality of first electrodes in an oblique direction, and the plurality of second wirings connects the plurality of second electrodes in the oblique direction, and the oblique direction is with respect to one of the column direction or the row direction, the plurality of apertures further includes at least one first aperture on each of the plurality of first wirings, and at least one second aperture on each of the plurality of second wirings, wherein each of the plurality of first wirings further includes a first vertical line part and a first oblique line part, the first vertical line part intersects the at least one first aperture in the column direction, and the first oblique line part connects the first vertical line part and a second vertical line part of an adjacent first wiring of the plurality of first wirings in the oblique direction, each of the plurality of second wirings includes a third vertical line part, a fourth vertical line part, and a second oblique line part, and the third vertical line part intersects the at least one second aperture in the column direction, and the second oblique line part connects the third vertical line part and the fourth vertical line part of an adjacent second wiring of the plurality of second wirings in the oblique direction.

* * * * *